United States Patent
Shindo et al.

(10) Patent No.: US 8,767,396 B2
(45) Date of Patent: Jul. 1, 2014

(54) EXTENSION DEVICE AND INFORMATION PROCESSING SYSTEM INCLUDING THE SAME

(75) Inventors: Kenichi Shindo, Osaka (JP); Jun Sato, Osaka (JP); Yoshihiro Kawada, Osaka (JP); Toshiya Senoh, Nara (JP); Ryo Yonezawa, Kyoto (JP); Masashi Toyota, Osaka (JP)

(73) Assignee: Panasonic Corporation, Kadoma-shi (JP)

(*) Notice: Subject to any disclaimer, the term of this patent is extended or adjusted under 35 U.S.C. 154(b) by 53 days.

(21) Appl. No.: 13/427,915

(22) Filed: Mar. 23, 2012

(65) Prior Publication Data
US 2012/0257342 A1  Oct. 11, 2012

(30) Foreign Application Priority Data

Apr. 6, 2011  (JP) .................................. 2011-084402

(51) Int. Cl.
*H05K 5/00* (2006.01)
*H05K 7/00* (2006.01)
*G06F 1/16* (2006.01)

(52) U.S. Cl.
USPC .............. 361/679.59; 361/679.03; 361/679.3; 361/679.56

(58) Field of Classification Search
USPC ............. 361/679.41, 679.59, 679.42, 679.43, 361/679.44, 679.03, 679.3, 679.56
See application file for complete search history.

(56) References Cited

U.S. PATENT DOCUMENTS

| | | | | |
|---|---|---|---|---|
| 5,710,728 A | * | 1/1998 | Danielson et al. | 713/321 |
| 6,049,813 A | * | 4/2000 | Danielson et al. | 708/100 |
| 6,532,152 B1 | * | 3/2003 | White et al. | 361/692 |
| 6,906,917 B2 | * | 6/2005 | Lo et al. | 361/679.4 |
| 8,315,048 B2 | * | 11/2012 | Tarnoff | 361/679.43 |
| 8,462,494 B2 | * | 6/2013 | Chen et al. | 361/679.41 |
| 2007/0002533 A1 | | 1/2007 | Kogan et al. | |
| 2011/0266230 A1 | * | 11/2011 | Carnevali | 211/26 |

FOREIGN PATENT DOCUMENTS

| | | |
|---|---|---|
| JP | H03-101056 U | 10/1991 |
| JP | H10-098515 A | 4/1998 |

* cited by examiner

*Primary Examiner* — Anthony Haughton
(74) *Attorney, Agent, or Firm* — Judge Patent Associates

(57) ABSTRACT

A main device includes fixing portions that fix a holding device to one principal surface thereof and project from the one principal surface. An extension device includes a placement portion on which the main device is placed and a wall portion on which the placement portion is provided in a standing manner. The wall portion that faces the one principal surface, to which the holding device is fixed, in a parallel relation, has such a shape as to not interfere with the fixing portions that fix the holding device of the main device, when the main device is placed on the placement portion. The main device can be mounted on the extension device with the holding device mounted thereon, and time and effort to remove the holding device can be saved when the main device is mounted on the extension device.

2 Claims, 40 Drawing Sheets

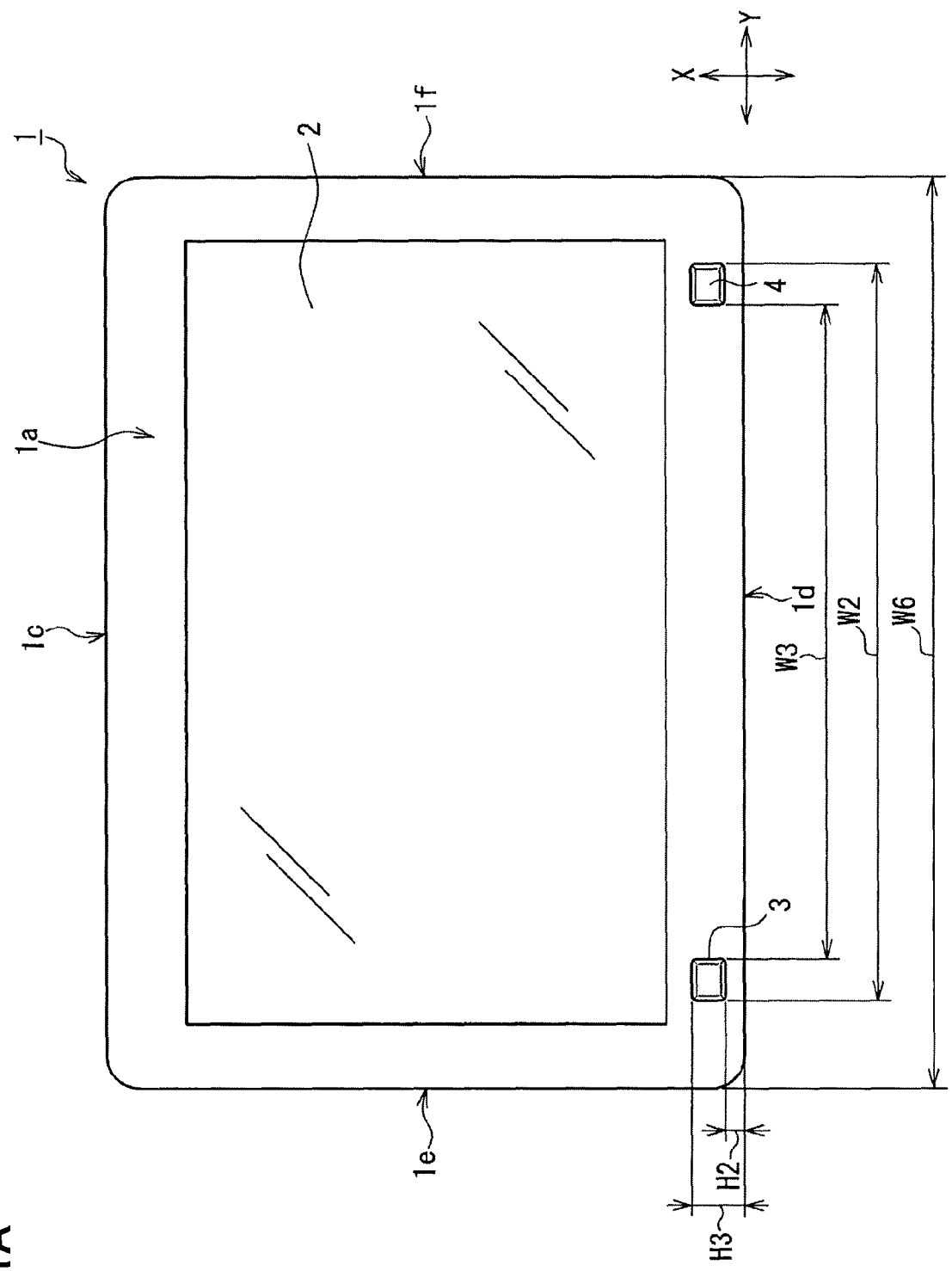

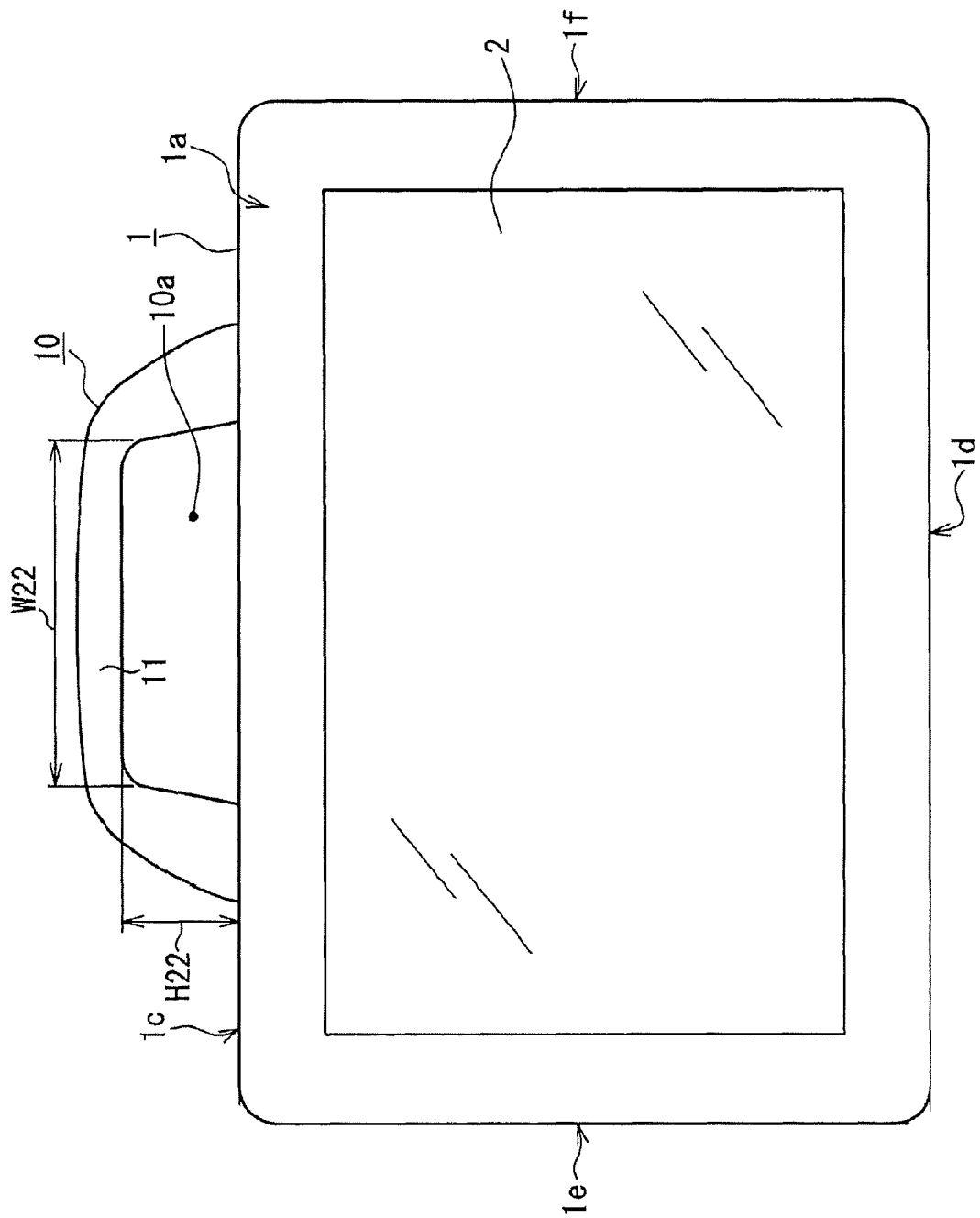

EXTENSION DEVICE AND INFORMATION PROCESSING SYSTEM INCLUDING THE SAME

BACKGROUND OF THE INVENTION

1. Field of the Invention

The disclosure of the present application relates to an extension device on which a main device can be mounted. The disclosure of the present application relates to an information processing system including the main device and the extension device.

2. Description of the Background Art

In recent years, because of the background such as size reduction of main device terminals, the cases where main devices and extension devices are connected to each other when being used have increased. A method for stably connecting a main device and an extension device is required. A conventional extension device has a guide rib formed along the outer shape of a main device, retains the main device with the guide rib, and guides the main device to a connection location. However, in this method, regulations are required with respect to the shape of the main device, a type of a connected connector, and the like, and have a huge effect on the layout of the main device.

Japanese Laid-Open Patent Publication No. 10-98515 (Patent Literature 1) discloses, for example, as shown in FIG. 1 of this publication, a plurality of key grooves 2a provided on each of both side surfaces of a terminal 2 and projections 1a and 1b on a cradle 1 side which are urged by an elastic member so as to freely extend and retract in response to engagement with each side surface and the key grooves 2a of the terminal 2 and are provided such that the positions of the projections 1a and 1b correspond to the positions of the key grooves 2a when the terminal 2 is fixed to the cradle 1. The cradle 1 disclosed in Patent Literature 1 includes a thick portion and a thin portion due to a step provided in either of a front portion or a rear portion, the projection 1b provided on the thin side, among the projections 1a and 1b, is formed so as to have a circular cross-sectional shape, and the terminal 2 is pressed down toward the thin side with the circular projection 1b as a rotating axis when the terminal 2 is removed from the cradle 1.

The microfilm of Japanese Laid-Open Utility Model Publication No. 3-101056 (Japanese Utility Model Application No. 2-8744, Patent Literature 2) discloses, for example, as shown in FIG. 1 of this publication, a portable radio 1 and a holder 2 that retains the portable radio 1. In addition, Patent Literature 2 discloses, for example, as shown in FIG. 1 of this publication, a retention structure for the portable radio in which thin grooves 11 are formed in both side surfaces of the portable radio 1, a recess 12 is formed in a back surface of the portable radio 1, the holder 2 includes a fixed portion 22 fixed within an interior of a car or the like and a holding portion 21 tiltably connected to the fixed portion 22, the holding portion 21 is provided with projections 24 engaged with the thin grooves 11 in the portable radio 1, and an engagement body 30 fitted into the recess 12 is provided in the fixed portion 22 in a state of being urged by a spring 29.

However, in the configuration disclosed in Japanese Laid-Open Patent Publication No. 10-98515, when an option component such as a grip belt or a handle member is mounted on the terminal, the terminal cannot be mounted on the cradle. Thus, when the terminal on which the option component is mounted is mounted on the cradle, the option component has to be removed from the terminal, and this is very troublesome. In addition, the configuration disclosed in the microfilm of Japanese Laid-Open Utility Model Publication No. 3-101056 (Japanese Utility Model Application No. 2-8744) also has the same problem.

SUMMARY OF THE INVENTION

An extension device disclosed in the present application is an extension device onto which/from which a main device can be mounted/dismounted, the main device having a holding device fixed to one principal surface thereof. The main device includes fixing portions that fix the holding device to the one principal surface and project from the one principal surface. The extension device includes a placement portion on which the main device is placed and a wall portion on which the placement portion is provided in a standing manner. The wall portion is configured to face the one principal surface in a parallel relation and not interfere with the fixing portions when the main device is placed on the placement portion.

An information processing system disclosed in the present application is an information processing system including a main device and an extension device onto which/from which the main device can be mounted/dismounted. The main device includes: a housing in which an electronic component that performs information processing is provided; and a holding device fixed by fixing portions projecting from one principal surface of the housing. The extension device includes: a placement portion on which the main device is placed; and a wall portion on which the placement portion is provided in a standing manner. The wall portion is configured to face the one principal surface in a parallel relation and not interfere with the fixing portions when the main device is placed on the placement portion.

According to the disclosure of the present application, a main device on which an option component is mounted can be mounted on an extension device without removing the option component, and thus the usability can be improved.

BRIEF DESCRIPTION OF THE DRAWINGS

FIG. 1A is a front view of a main device according to an embodiment.

FIG. 2A is a front view of an electronic device including a holding device according to the embodiment.

DESCRIPTION OF THE PREFERRED EMBODIMENTS

Embodiment

An information processing system according to an embodiment includes a main device and an extension device. Hereinafter, the configuration of the main device, the configuration of the extension device, an operation when the main device is mounted onto the extension device, and the like will be described. It should be noted that in the present embodiment, a computer apparatus including a single housing is exemplified as an example of the main device. In addition, in the present embodiment, a device that can be electrically connected to the computer apparatus and can mechanically retain the computer apparatus is exemplified as an example of the extension device. The extension device of the present embodiment is, for example, a device called "cradle".

1. Configuration of Computer Apparatus

[1-1. Configuration of Only Computer Apparatus]

Figure 1B:
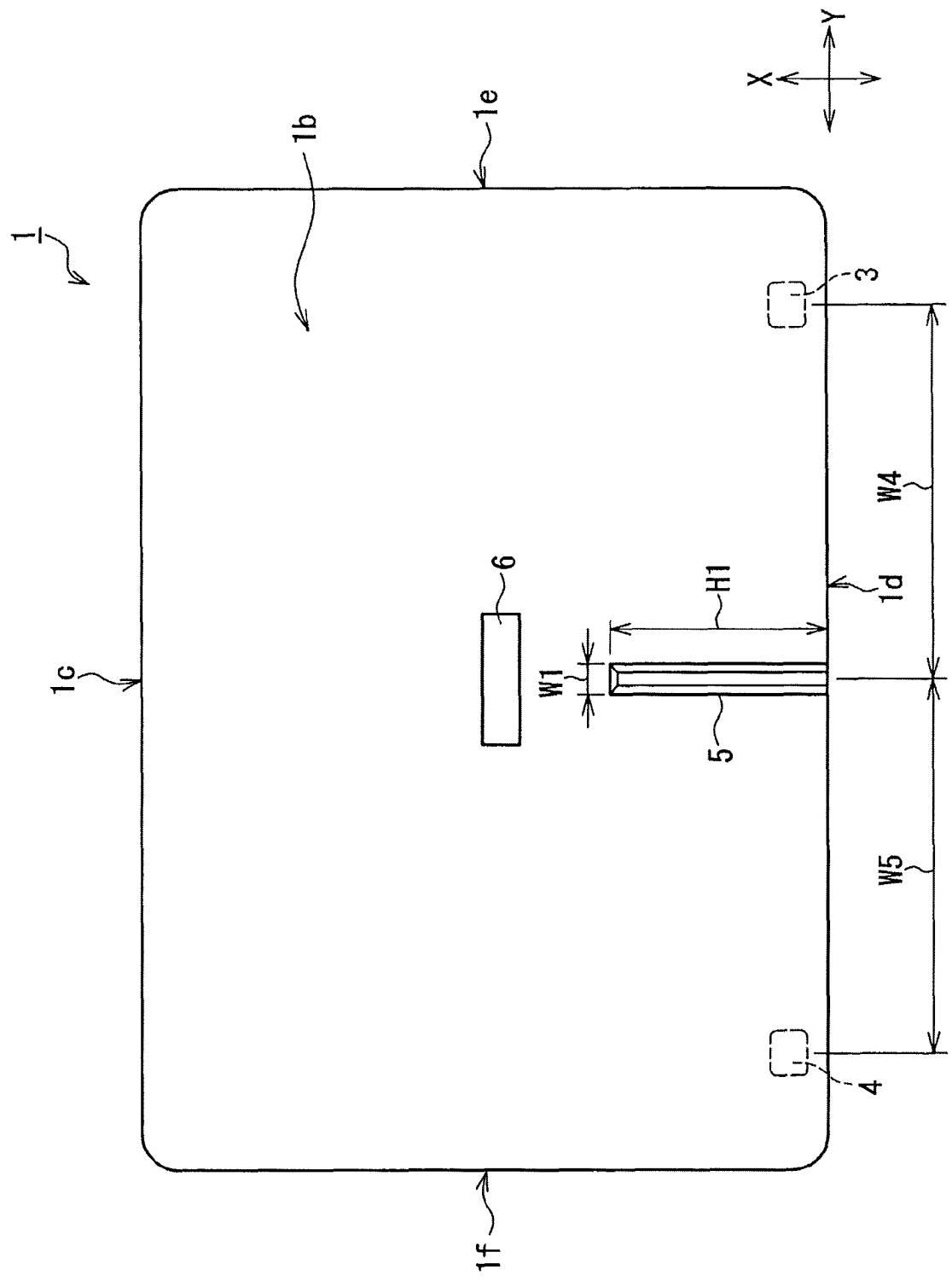
FIG. 1B is a rear view of the main device according to the embodiment.
Figure 1C:
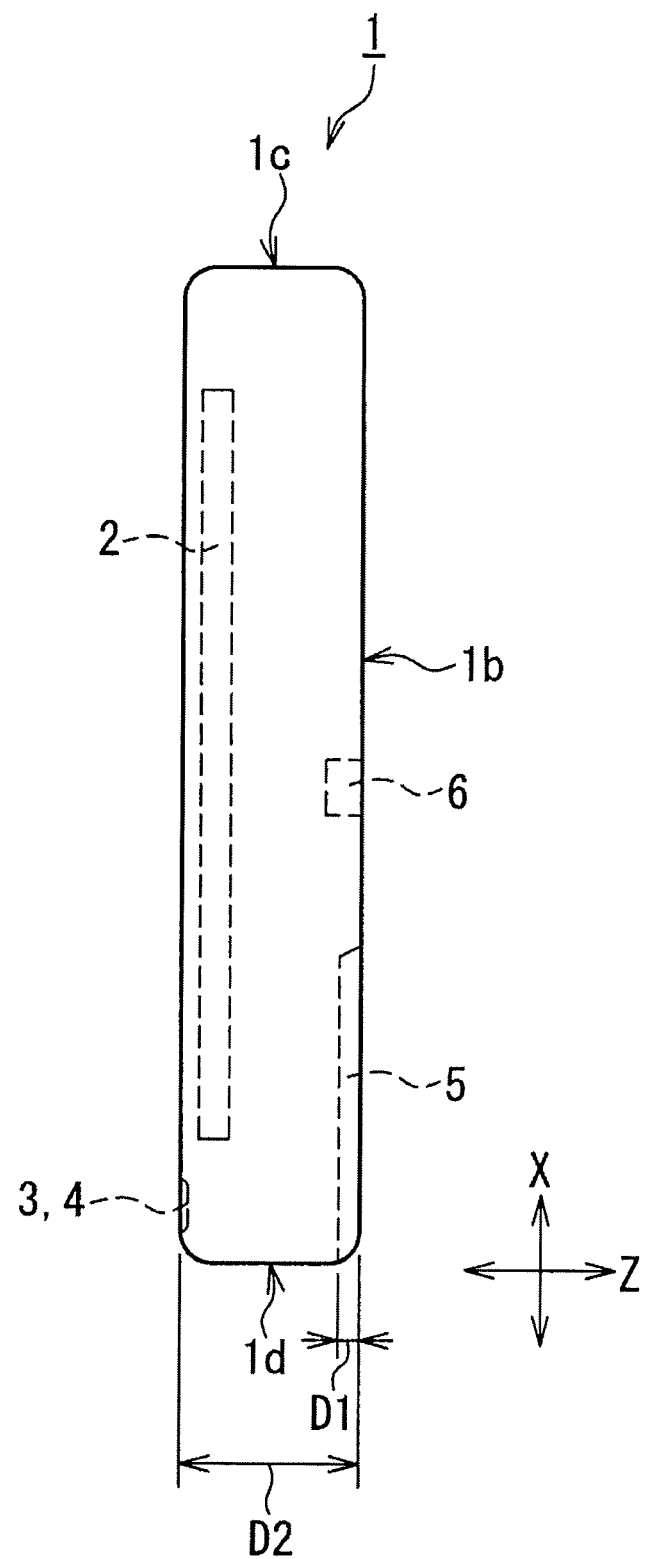
FIG. 1C is a side view of the main device according to the embodiment.

FIG. 1A is a front view of the computer apparatus according to the present embodiment. FIG. 1B is a rear view of the computer apparatus according to the present embodiment. FIG. 1C is a side view of the computer apparatus according to the present embodiment.

The computer apparatus 1 is an example of the main device. As the main device according to the present embodiment, the portable computer apparatus 1 including a single housing is exemplified as an example. However, the main device may be a device other than the computer apparatus as long as it is a main device that can at least be mounted on and dismounted from the extension device, and is not limited to a device including only a single housing. Examples of the device other than the computer include a PDA (Personal Digital Assistant), a portable game device, a mobile phone, and a portable music player. In addition, examples of the device other than the device including a single housing include a device that includes two housings supported by a hinge mechanism, such as a laptop personal computer.

In the computer apparatus 1, electronic components such as a central processing unit (CPU) and a storage element are disposed within the housing. In the computer apparatus 1, the outer edge thereof is covered with a substantially rectangular-parallelepiped-shaped housing having a front surface 1a, a back surface 1b, a top surface 1c, a bottom surface 1d, a side surface 1e, and a side surface 1f. It should be noted that the side surfaces 1e and 1f of the computer apparatus 1 are specified, for example, on the basis of a direction in which a user views the computer apparatus 1 while operating the computer apparatus 1, and thus, if necessary to specify them, the side surface 1e is referred to as a left side surface and the side surface 1f is referred to as a right side surface. In addition, the shape of the computer apparatus 1 is not limited to the rectangular parallelepiped shape and may be another shape as long as the computer apparatus 1 can be mounted on the extension device of the present embodiment.

As shown in FIGS. 1A and 1C, the computer apparatus 1 includes a display panel 2 in the front surface 1a. The display panel 2 is capable of displaying various video images, and can be configured, for example, as a liquid crystal display panel. The display panel 2 may include a touch panel that can detect touch with a finger, a stylus pen, or the like.

The computer apparatus 1 includes a first positioning recess 3 and a second positioning recess 4 in the front surface 1a. The first positioning recess 3 is formed in the front surface 1a and near the bottom surface 1d and the left side surface 1e. The second positioning recess 4 is formed in the front surface 1a and near the bottom surface 1d and the right side surface 1f. In the present embodiment, the openings of the first positioning recess 3 and the second positioning recess 4 have rectangular shapes as shown in FIG. 1A, but may have other shapes.

As shown in FIGS. 1B and 1C, the computer apparatus 1 includes a guide recess 5 and a connector 6 in the back surface 1b. The guide recess 5 is formed in the back surface 1b, near the bottom surface 1d, and at the center of the back surface 1b in a longitudinal direction. The guide recess 5 is formed in the back surface 1b so as to be long and extend along a direction from the top surface 1c toward the bottom surface 1d. The connector 6 is electrically connectable to a connector 39 (described later) provided in an extension device 30. The connector 6 is used when information communication or the like is performed between the computer apparatus 1 and the extension device 30.

[1-2. Configuration of Computer Apparatus on which Holding Member is Mounted]

Figure 2B:
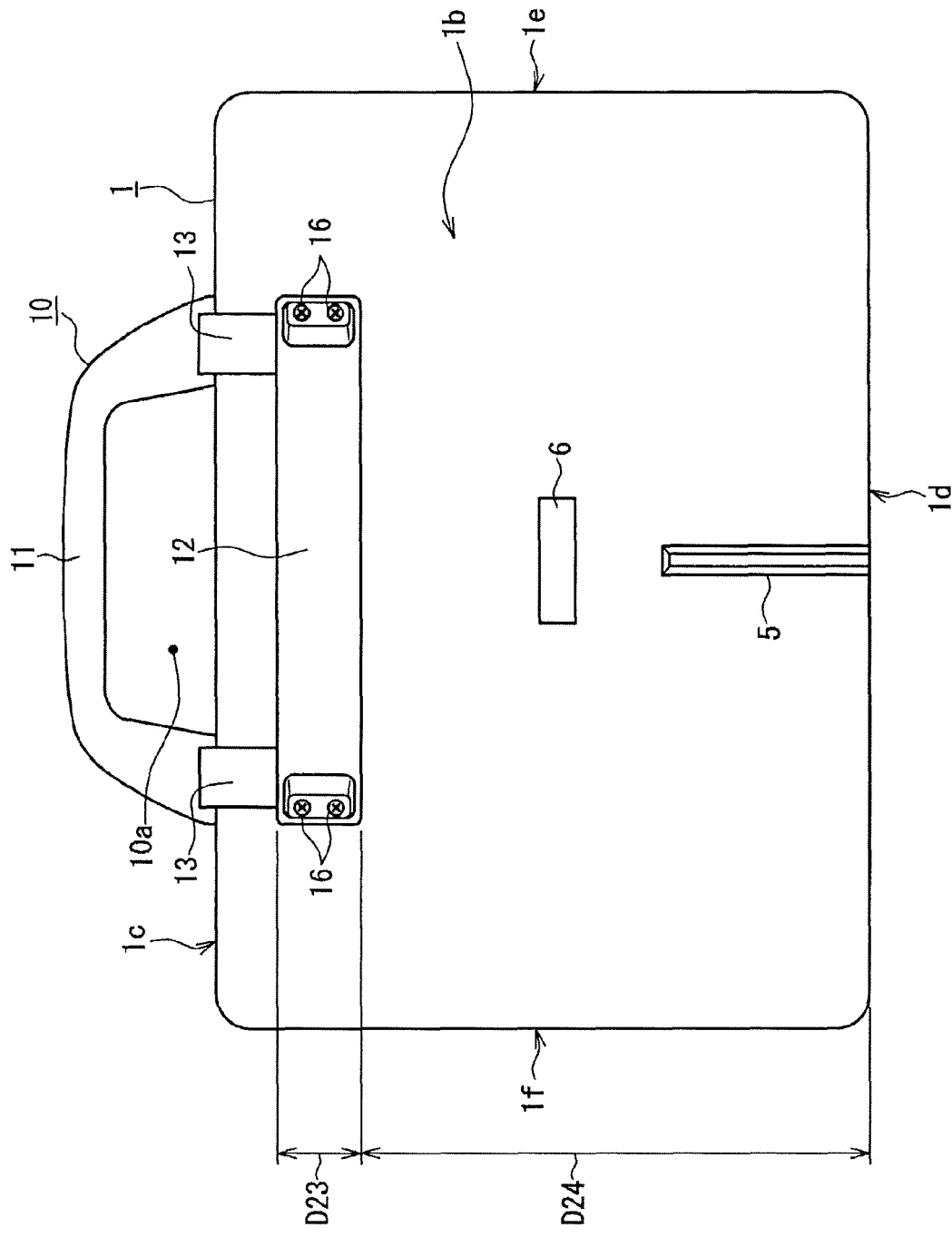
FIG. 2B is a rear view of the electronic device including the holding device according to the embodiment.
Figure 2C:
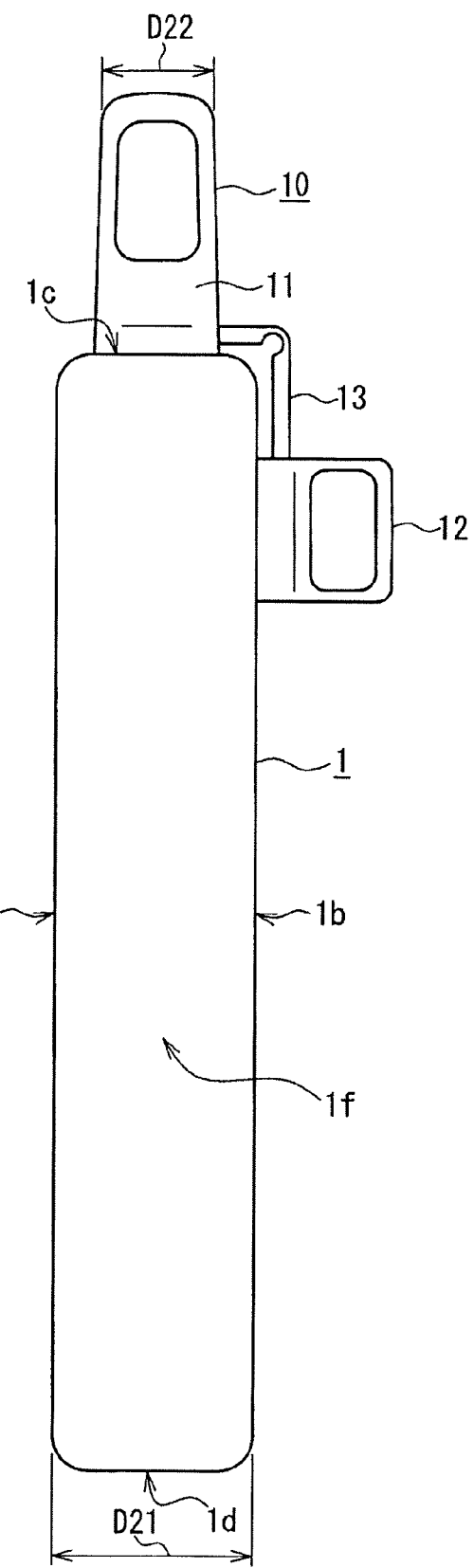
FIG. 2C is a side view of the electronic device including the holding device according to the embodiment.
Figure 2D:
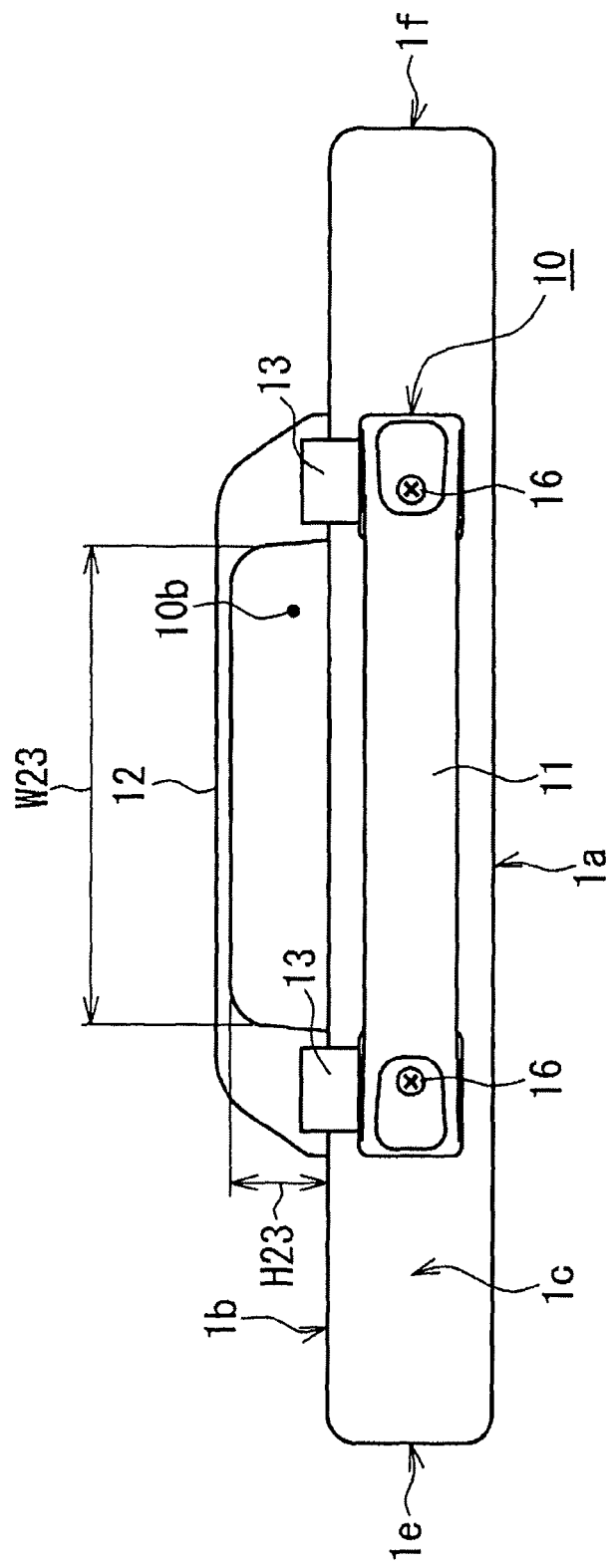
FIG. 2D is a top view of the electronic device including the holding device according to the embodiment.

FIG. 2A is a front view of the computer apparatus 1 including a holding member 10 according to the present embodiment. FIG. 2B is a rear view of the computer apparatus 1 including the holding member 10 according to the present embodiment. FIG. 2C is a side view of the computer apparatus 1 including the holding member 10 according to the present embodiment. FIG. 2D is a top view of the computer apparatus 1 including the holding member 10 according to the present embodiment.

Screw holes (described later) into which screws 16 (see FIG. 2D) for fixing a hand grip 11 are screwed are formed in the top surface 1c of the computer apparatus 1. In addition, screw holes (described later) into which screws 16 (see FIG. 2B) for fixing a grip belt 12 are screwed are formed in the back surface 1b of the computer apparatus 1.

The holding member 10 includes the hand grip 11, the grip belt 12, and a connection section 13.

The hand grip 11 is fixed to the top surface 1c of the computer apparatus 1. The hand grip 11 is formed in a substantially "C" shape. Thus, in a state where the hand grip 11 is fixed to the top surface 1c of the computer apparatus 1, a void 10a is formed between the hand grip 11 and the computer apparatus 1. The void 10a has a width dimension W22, a height dimension H22, and a depth dimension D22 which are set such that a hand (e.g., a second finger, a third finger, a fourth finger, and a fifth finger) of the user is inserted through the void 10a.

The grip belt 12 is fixed to the back surface 1b of the computer apparatus 1. The grip belt 12 is formed in a substantially "C" shape. Thus, in a state where the grip belt 12 is fixed to the back surface 1b of the computer apparatus 1, a void 10b is formed between the grip belt 12 and the computer apparatus 1. The void 10b has a width dimension W23, a height dimension H23, and a depth dimension D23 which are set such that a hand of the user is inserted through the void 10b.

The connection section 13 connects the hand grip 11 to the grip belt 12. The connection section 13 is bent or deformed in a curved manner in a state where the hand grip 11 is fixed to the top surface 1c of the computer apparatus 1 and the grip belt 12 is fixed to the back surface 1b of the computer apparatus 1.

Figure 3:
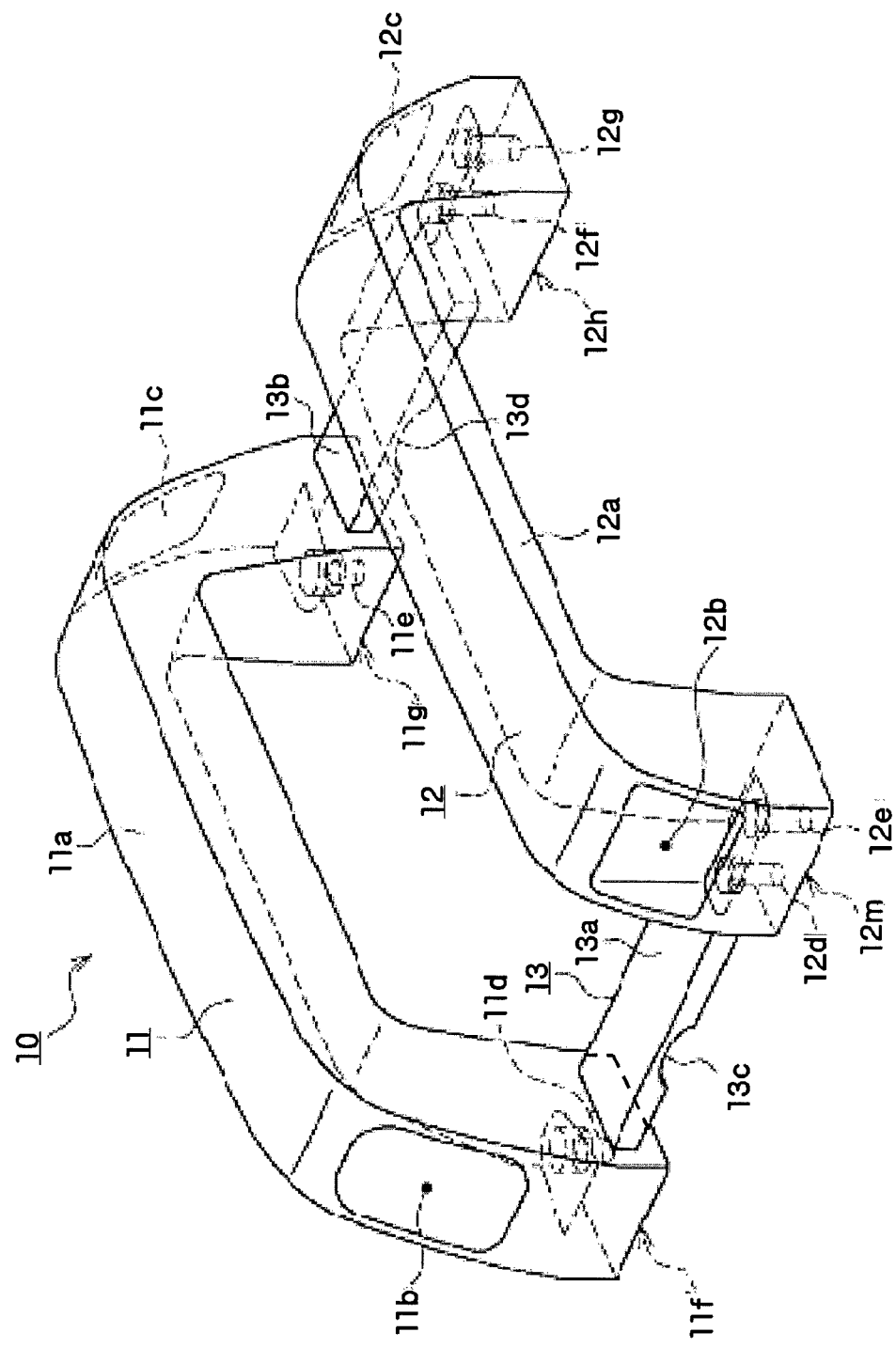
FIG. 3 is a perspective view of the holding device according to the embodiment.

FIG. 3 is a perspective view of the holding member 10.

The holding member 10 is configured by integrally connecting the hand grip 11, the grip belt 12, and the connection section 13 to each other. The holding member 10 is preferably formed from a flexible material that expands, contracts, or deforms in a contracting manner and has resilience to return from the expansion or contraction to the original shape (hereinafter, referred to as elastically deformable), and is formed from silicone rubber as an example in the present embodiment. It should be noted that the holding member 10 is integrally formed from a single material in the present embodiment, but the hand grip 11, the grip belt 12, and the connection section 13 may be formed from different materials, respectively.

The hand grip 11 includes a holding portion 11a, a recess 11b, a recess 11c, a hole 11d, and a hole 11e. The holding portion 11a is a site that is held by the user with a hand. In a state where the hand grip 11 is fixed to the top surface 1c of the computer apparatus 1, the holding portion 11a is disposed so as to face the top surface 1c of the computer apparatus 1 across the void 10a (see FIG. 2A). In order to make it easy for the user to hold the holding portion 11a and in order to ensure rigidity, preferably, the holding portion 11a has a cross-sectional shape that is circular, elliptical, semi-circular, or semi-elliptical, and also has projections and recesses that correspond to the shape of the fingers and a hand of the user. The recess 11b is formed on an end side of the holding portion 11a in its longitudinal direction. The recess 11c is formed on another end side of the holding portion 11a in the longitudinal direction. Each of the recesses 11b and 11c is sized such that a hand grip protection member 14 (described later) is fitted therein. The hole 11d is formed in the recess 11b so as to extend to a bottom surface 11f. The hole 11e is formed in the recess 11c so as to extend to a bottom surface 11g. The bottom surfaces 11f and 11g are surfaces that are in contact with the top surface 1c in a state where the hand grip 11 is fixed to the top surface 1c of the computer apparatus 1.

The grip belt 12 includes a belt portion 12a, a recess 12b, a recess 12c, and holes 12d to 12g. In a state where the grip belt 12 is fixed to the back surface 1b of the computer apparatus 1, the belt portion 12a is disposed so as to face the back surface 1b of the computer apparatus 1 across the void 10b (see FIG. 2D). In a state where a hand of the user is inserted through the void 10b (see FIG. 2D), the belt portion 12a faces the back of the hand of the user across a gap or is in contact with the back of the hand of the user. In order to ensure flexibility, the belt portion 12a is preferably formed so as to be thin. When the belt portion 12a is formed so as to be thin, the belt portion 12a is in contact with the back of the hand of the user inserted through the void 10b (see FIG. 2D), such that the belt portion 12a is elastically deformable. Thus, the hand of the user is easily and favorably fitted to the belt portion 12a. The recess 12b is formed on an end side of the belt portion 12a in its longitudinal direction. The recess 12c is formed on the other end side of the belt portion 12a in the longitudinal direction. Each of the recesses 12b and 12c is sized such that a grip belt protection member 15 (described later) can be fitted therein. The holes 12d and 12e are formed in the recess 12b so as to extend to a bottom surface 12m. The holes 12f and 12g are formed in the recess 12c so as to extend to a bottom surface 12h. The bottom surfaces 12m and 12h are surfaces that are in contact with the back surface 1b in a state where the grip belt 12 is fixed to the back surface 1b of the computer apparatus 1.

The connection section 13 includes a first connection portion 13a and a second connection portion 13b. The first connection portion 13a is integrally connected at an end thereof to an end portion of the hand grip 11 in the longitudinal direction, and is integrally connected at another end thereof to an end portion of the grip belt 12 in the longitudinal direction. The second connection portion 13b is integrally connected at an end thereof to another end portion of the hand grip 11 in the longitudinal direction, and is integrally connected at another end thereof to another end portion of the grip belt 12 in the longitudinal direction. The first connection portion 13a is formed with a thin portion 13c. The second connection portion 13b is formed with a thin portion 13d. The thin portions 13c and 13d are formed so as to be thinner than the other sites in the first connection portion 13a and the second connection portion 13b. Since the connection section 13 includes the thin portions 13c and 13d, compressive force and tension that occur when the connection section 13 is bent can be reduced as compared to those in a connection section that does not include any thin portion. Thus, damage such as cracking is unlikely to occur in the connection section 13. It should be noted that when the connection section 13 is formed from an elastically deformable material, the thin portion 13c can be omitted.

Figure 4:
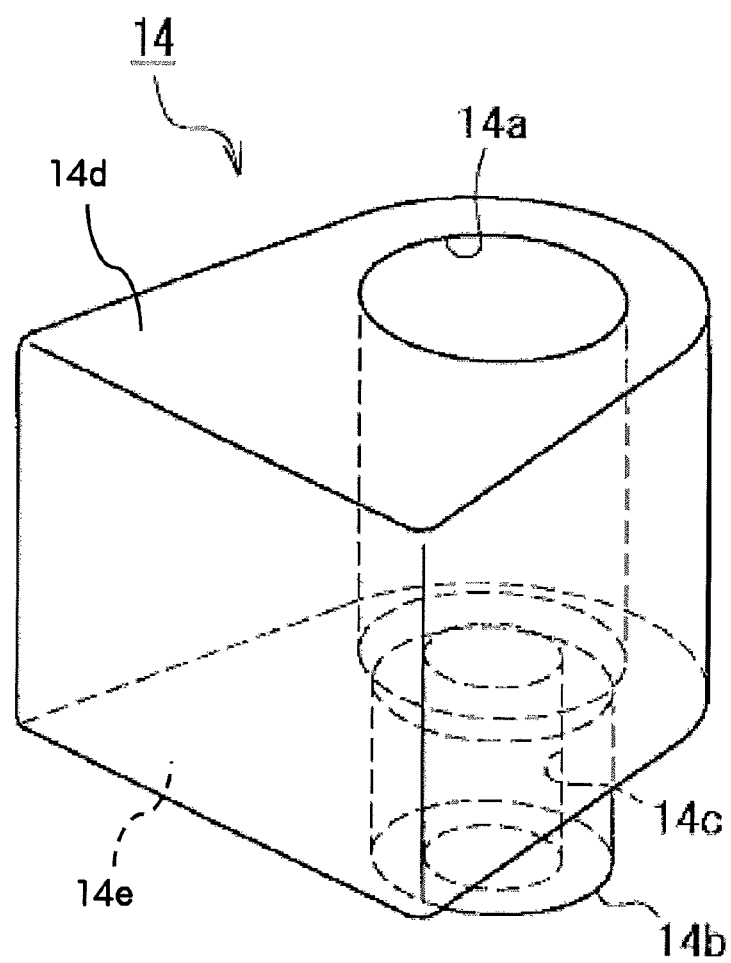
FIG. 4 is a perspective view of a hand grip protection member.

FIG. 4 is a perspective view of the hand grip protection member 14. The hand grip protection member 14 is formed in a columnar shape having an end surface 14d which includes a hole 14a and whose outer shape has two corners and one circular arc. The hand grip protection member 14 is formed from a material harder than the hand grip 11, and is formed from polyacetal resin as an example in the present embodiment. The hand grip protection member 14 is a member for protecting the hand grip 11 from a head of a screw (described later) when the hand grip 11 is fixed to the computer apparatus 1 by means of screws (described later). In the hand grip protection member 14, the end surface 14d including the hole 14a and a projection 14b that is located on an end surface 14e opposite to the end surface 14d and has a hole 14c therein are formed. It should be noted that the hand grip protection member 14 suffices to at least have such a shape that the hand grip protection member 14 does not rotate within the recess 11b or 11c when the hand grip protection member 14 is fitted in the recess 11b or 11c of the hand grip 11, and may have a shape other than the shapes of the end surfaces 14d and 14e. With such a configuration, it is easy to tighten the screw (described later) and loosening of the screw (described later) in the hand grip protection member 14 can be prevented.

The hole 14a has an inner diameter that allows at least the head of the screw (described later) to be inserted therethrough. The projection 14b is formed in a cylindrical shape. The projection 14b has an outer diameter that allows the projection 14b to be fitted in the hole 11d or 11e formed in the grip belt 11. The hole 14c is formed so as to extend through the projection 14b. The hole 14c has an inner diameter that is at least larger than the outer diameter of an external thread portion of the screw (described later) and smaller than the outer diameter of the head of the screw (described later). The hole 14a and the hole 14c are concentric with each other and provided so as to be connected to each other.

Figure 5:
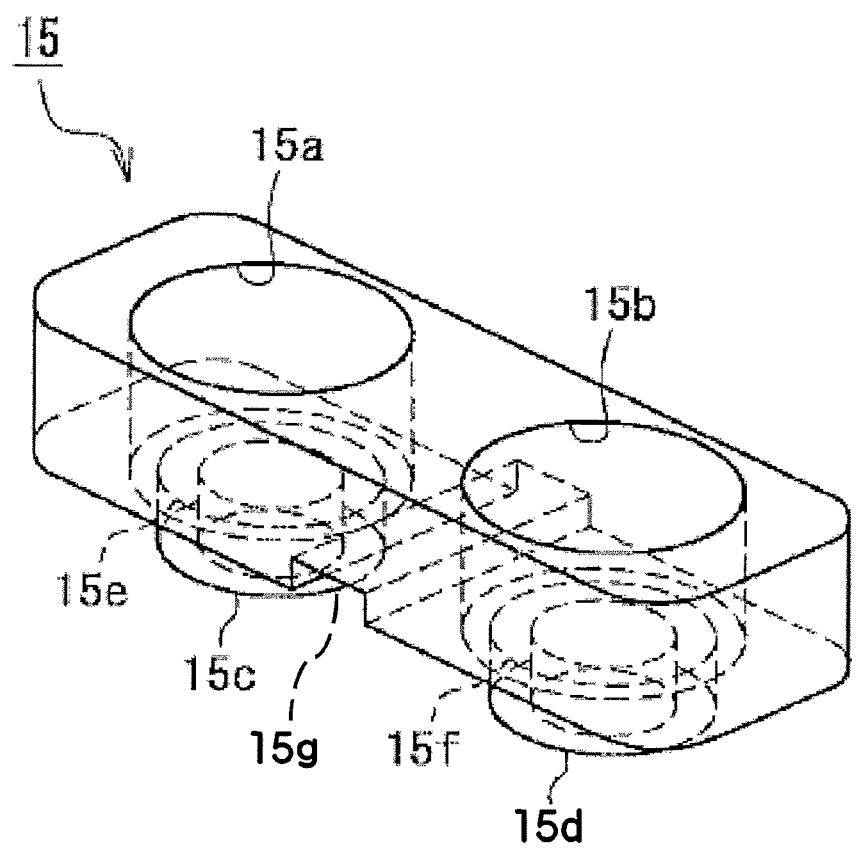
FIG. 5 is a perspective view of a grip belt protection member.

FIG. 5 is a perspective view of the grip belt protection member 15. The grip belt protection member 15 is basically formed in a rectangular-columnar shape. The grip belt protection member 15 is formed from a material harder than the grip belt 12, and is formed from polyacetal resin as an example in the present embodiment. The grip belt protection member 15 is a member for protecting the grip belt 12 from heads of screws (described later) when the grip belt 12 is fixed to the computer apparatus 1 by means of screws (described later). In the grip belt protection member 15, a hole 15a, a hole 15b, a projection 15c, a projection 15d, a hole 15e, and a hole 15f are formed. It should be noted that the grip belt protection member 15 suffices to have such a shape that the grip belt protection member 15 does not rotate within the recess 12b or 12c when screwing the screws (described later) in a state where the grip belt protection member 15 is fitted in the recess 12b or 12c of the grip belt 12. With such a configuration, it is easy to tighten the screws (described later) and loosening of the screws in the grip belt protection member 15 can be prevented.

The holes 15a and 15b have inner diameters that allow at least the heads of the screws (described later) to be inserted through. The projections 15c and 15d are formed in cylindrical shapes. As described later, the grip belt protection member 15 is configured to be fitted in both the holes 12b and 12c, and thus the projections 15c and 15d have outer diameters that allow the projections 15c and 15d to be fitted in the holes 12d to 12g formed in the hand grip 12. The holes 15e and 15f are formed so as to extend through the projections 15c and 15d, respectively. The holes 15e and 15f have inner diameters that are at least larger than the outer diameters of external thread portions of the screws (described later) and smaller than the outer diameters of the heads of the screws (described later). The hole 15a and the hole 15e are concentric with each other and provided so as to be connected to each other. The hole 15b and the hole 15f are concentric with each other and provided so as to be connected to each other.

Figure 6:
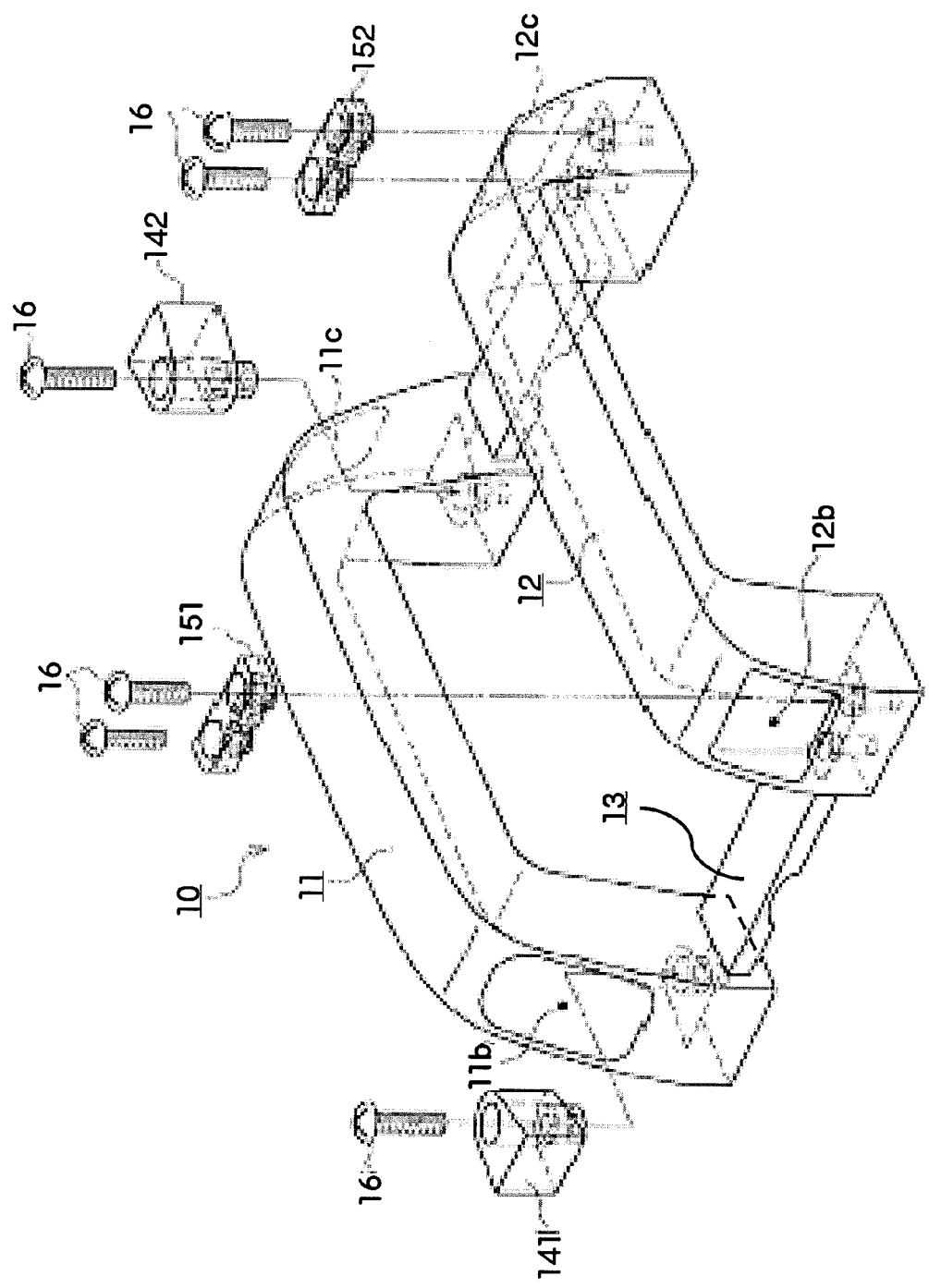
FIG. 6 is an exploded perspective view of the holding device.
Figure 7A:
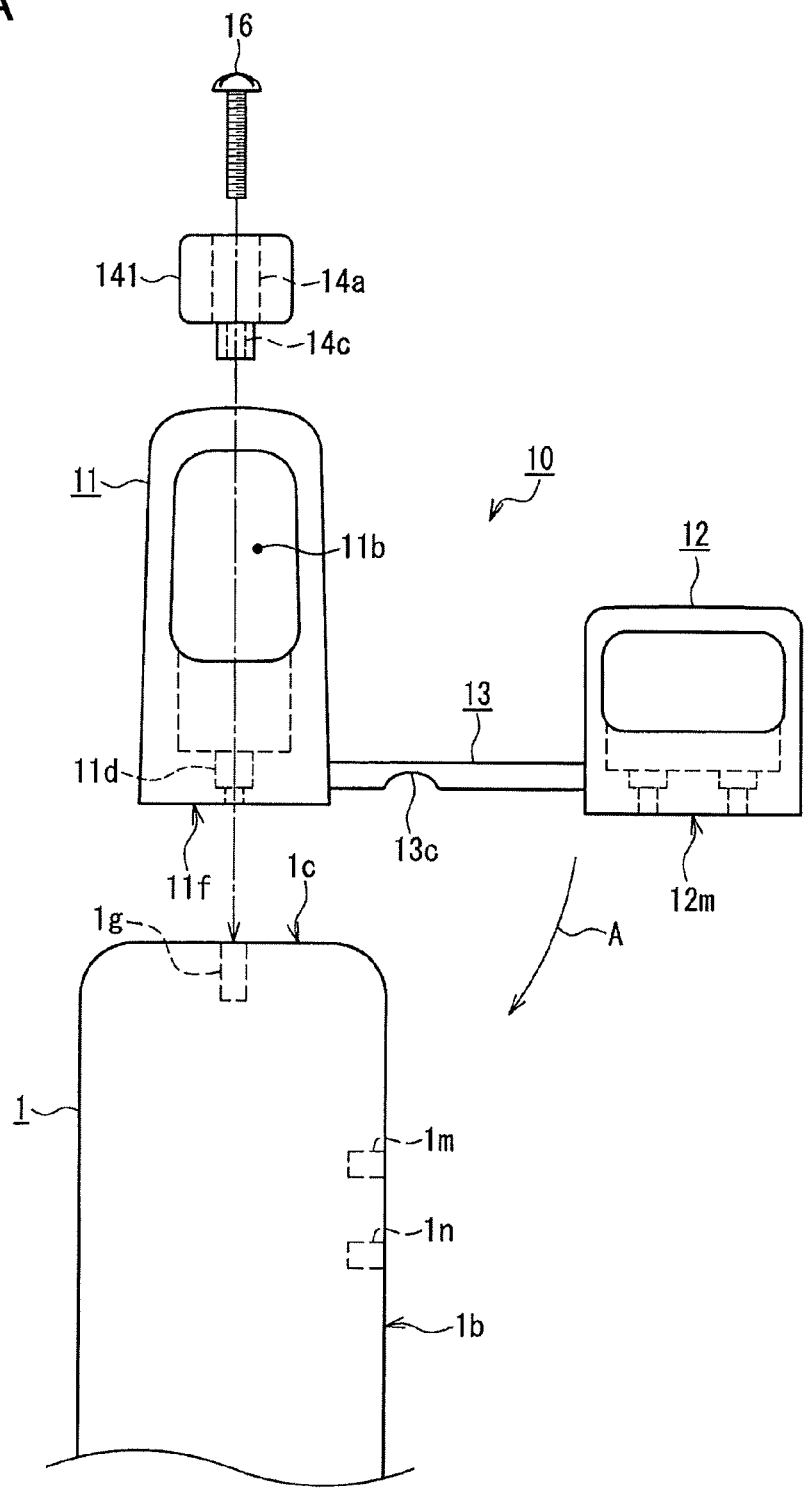
FIG. 7A is an exploded side view of the holding device.
Figure 7B:
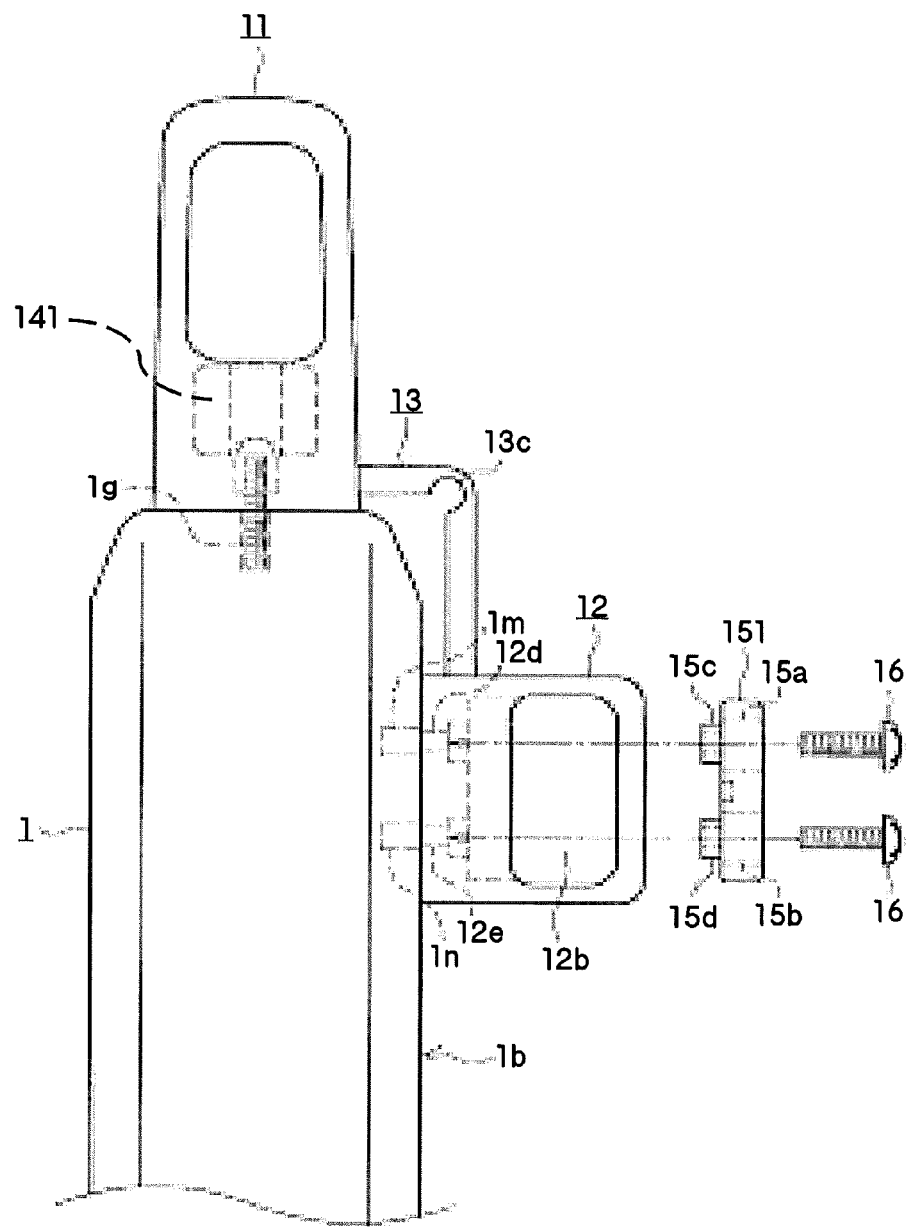
FIG. 7B is an exploded side view of the holding device.
Figure 7C:
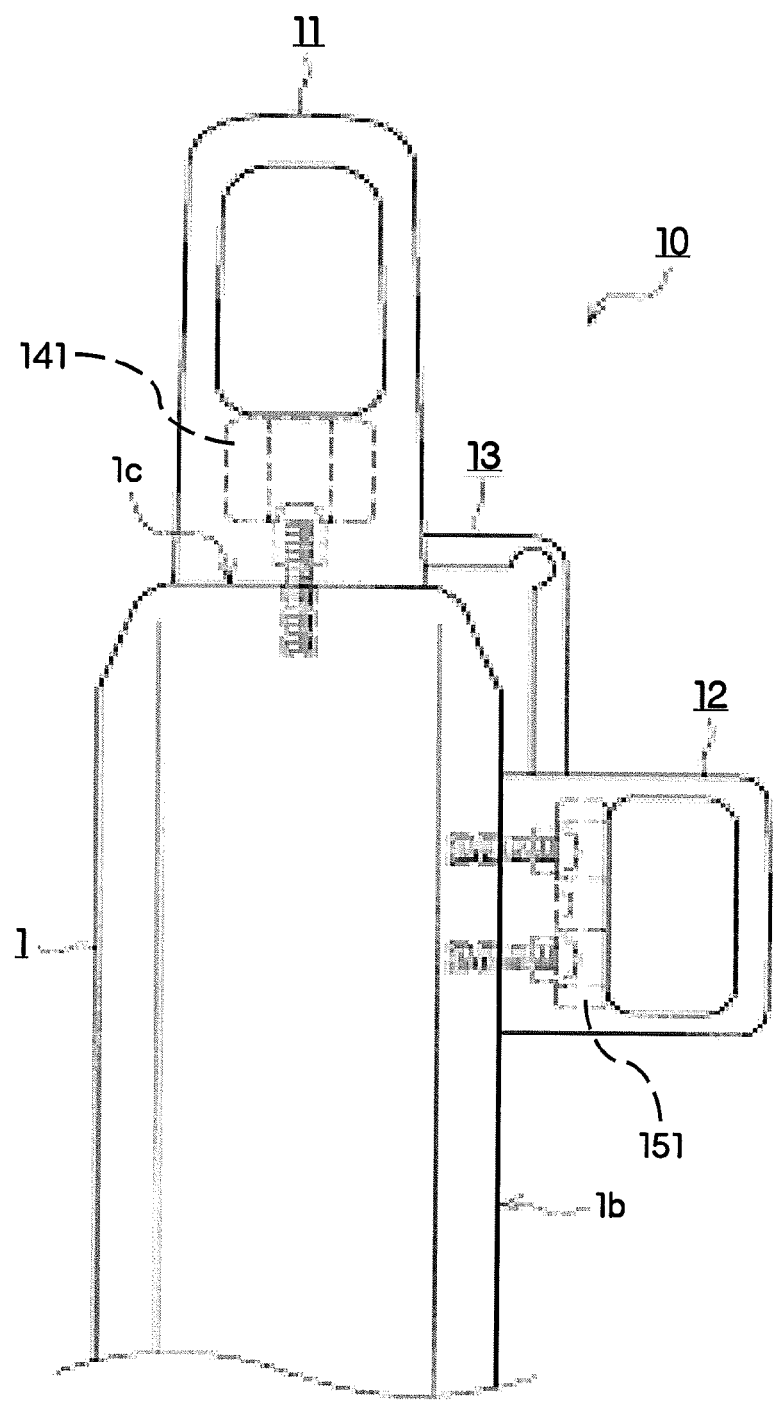
FIG. 7C is an exploded side view of the holding device.

FIG. 6 is an exploded perspective view of the holding member 10 including the hand grip protection member 14, the grip belt protection member 15, the connection section 13, and the screws 16. FIGS. 7A, 7B, and 7C are side views showing transition when the holding member 10 is mounted onto the computer apparatus 1. It should be noted that each of hand grip protection members 141 and 142 shown in FIGS. 6, 7A, 7B, and 7C is the same as the hand grip protection member 14 shown in FIG. 4. In addition, each of grip belt protection members 151 and 152 shown in FIGS. 6, 7B, and 7C is the same as the grip belt protection member 15 shown in FIG. 5.

First, as shown in FIG. 6, the hand grip protection member 141 is fitted into the recess 11b of the hand grip 11, and the hand grip protection member 142 is fitted into the recess 11c of the hand grip 11. When fitting, a projection (the projection 14b shown in FIG. 4) provided in the hand grip protection member 141 is fitted into the hole 11d provided in the hand grip 11. It should be noted that the hand grip protection members 141 and 142 have the configuration shown in FIG. 4 and are the same in shape. Thus, the hand grip protection member 141 can be fitted also into the recess 11c of the hand grip 11.

Next, as shown in FIG. 7A, the hand grip 11 is fixed to the top surface 1c of the computer apparatus 1 by means of the screws 16. Specifically, the bottom surfaces 11f and 11g of the hand grip 11 in which the hand grip protection members 141 and 142 are fitted are brought into contact with the top surface 1c of the computer apparatus 1. At that time, the hole 11d of the hand grip 11, the hole 14c of the hand grip protection member 141, and a screw hole 1g of the computer apparatus 1 are positioned so as to correspond to each other. In addition, the hole 11e of the hand grip 11, the hole 14c of the hand grip protection member 142, and another screw hole (not shown) of the computer apparatus 1 are positioned so as to correspond to each other. Next, a screw 16 is inserted through the holes 14a and 14c of the hand grip protection member 141 and screwed into the screw hole 1g. Moreover, another screw 16 is inserted through the holes 14a and 14c of the hand grip protection member 142 and screwed into the other screw hole (not shown). By so doing, the hand grip 11 can be fixed to the top surface 1c of the computer apparatus 1.

Next, as shown in FIG. 6, the grip belt protection member 151 is fitted into the recess 12b of the grip belt 12, and the grip belt protection member 152 is fitted into the recess 12c of the grip belt 12. When fitting, projections (the projections 15c and 15d shown in FIG. 5) provided in the grip belt protection member 151 are fitted into the holes 12d and 12e provided in the grip belt 12. In addition, projections (the projections 15c and 15d shown in FIG. 5) provided in the grip belt protection member 152 are fitted into the holes 12f and 12g provided in the grip belt 12. It should be noted that the grip belt protection members 151 and 152 have the configuration shown in FIG. 5 and are the same in shape. Thus, the grip belt protection member 151 can be fitted also into the recess 12c of the grip belt 12. In addition, the grip belt protection members 151 and 152 have long and thin rectangular-columnar shapes as their outer shapes. Thus, the grip belt protection members 151 and 152 do not rotate within the recesses 12b and 12c provided in the grip belt 12, and the screwed relation between the screws 16 and screw holes 1m and 1n is not deteriorated. Moreover, the grip belt protection members 151 and 152 each have a groove 15g (see FIG. 5) in an opposite surface in a direction from which the screws 16 are screwed. Since the groove 15g is provided, the grip belt protection members 151 and 152 can be fitted into the recess 12b and 12c of the grip belt 12 due to deformation or the like of the elastically deformable resin members, and can be positioned. Therefore, when being screw-connected by means of the screws 16, the grip belt protection members 151 and 152 do not rotate in the recesses 12b and 12c and can assuredly be screw-connected.

Next, as shown in FIG. 7B, the grip belt 12 is fixed to the back surface 1b of the computer apparatus 1 by means of the screws 16. Specifically, the bottom surfaces 12m and 12h of the grip belt 12 in which the grip belt protection members 151 and 152 are fitted are brought into contact with the back surface 1b of the computer apparatus 1. At that time, in the holding member 10, the grip belt 12 is displaced from the state shown in FIG. 7A in a direction indicated by an arrow A while the connection section 13 is deformed in a curved manner in the direction indicated by the arrow A. When being deformed in a curved manner, the connection section 13 can be deformed preferentially at the thin portion 13c. In addition, the holes 12d and 12e (see FIG. 3) of the grip belt 12, the holes 15a and 15b (see FIG. 5) of the grip belt protection member 151, and the screw holes 1m and 1n of the computer apparatus 1 are positioned so as to correspond to each other. In addition, the holes 12f and 12g (see FIG. 3) of the grip belt 12, the holes 15a and 15b (see FIG. 5) of the grip belt protection member 152, and other screw holes (not shown) of the computer apparatus 1 are positioned so as to correspond to each other. Next, as shown in FIG. 7B, a screw 16 is inserted through the hole 15a and the projection 15c of the grip belt protection member 151 and screwed into the screw hole 1m. In addition, another screw 16 is inserted through the hole 15b and the projection 15d of the grip belt protection member 151 and screwed into the screw hole 1n. Further, another screw 16 is inserted through the holes 15a and 15e of the grip belt protection member 152 and screwed into the other screw hole (not shown). Moreover, another screw 16 is inserted through the holes 15b and 15f of the grip belt protection member 152 and screwed into the other screw hole (not shown). By so doing, the grip belt 12 can be fixed to the back surface 1b of the computer apparatus 1.

Due to the above, the holding member 10 can be fixed to the computer apparatus 1 as shown in FIG. 7C.

The user can carry the computer apparatus 1 with one hand by holding the hand grip 11 of the holding member 10 with the one hand.

Figure 8:
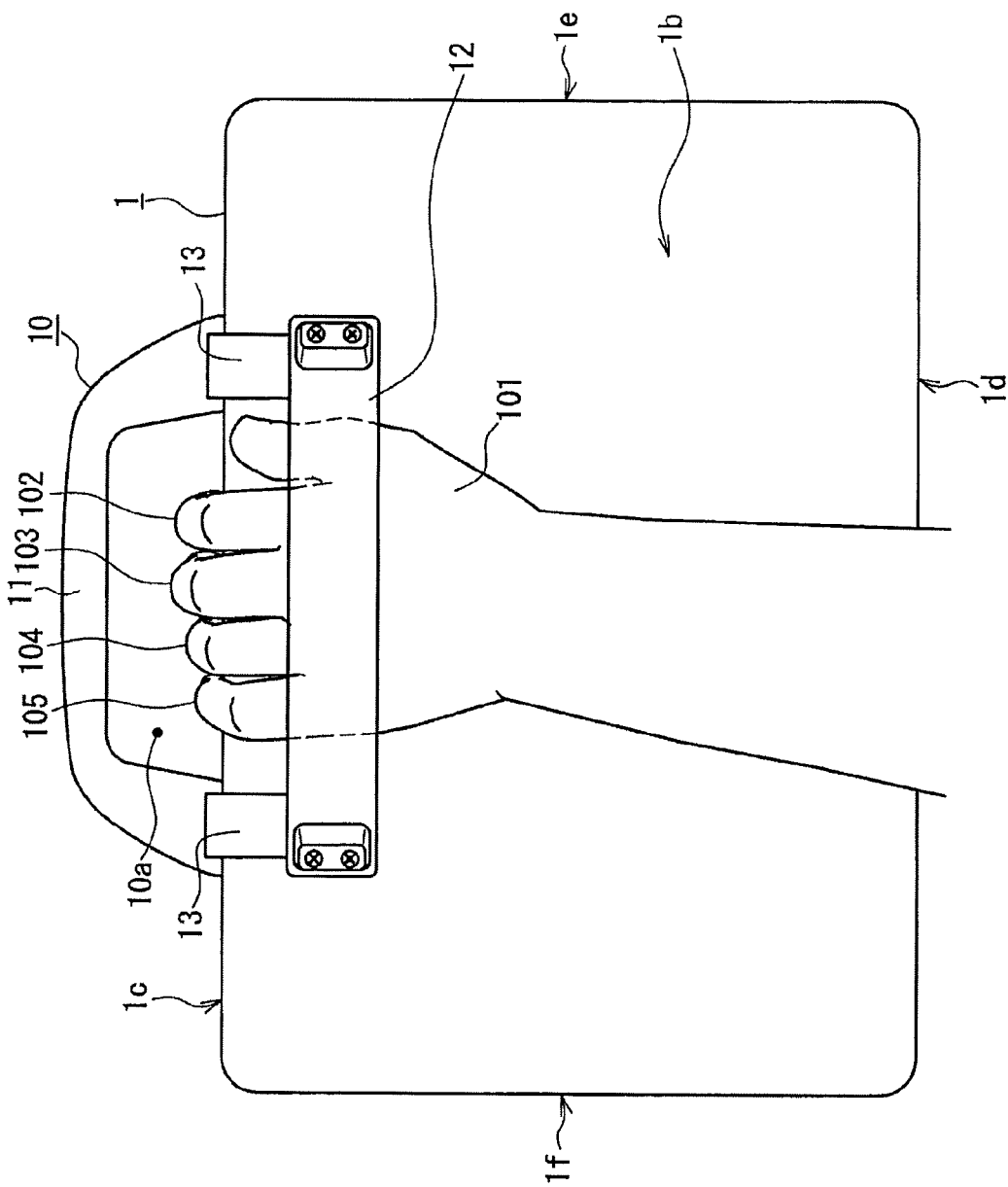
FIG. 8 is a rear view showing a state where the electronic device is held with a hand.
Figure 9:
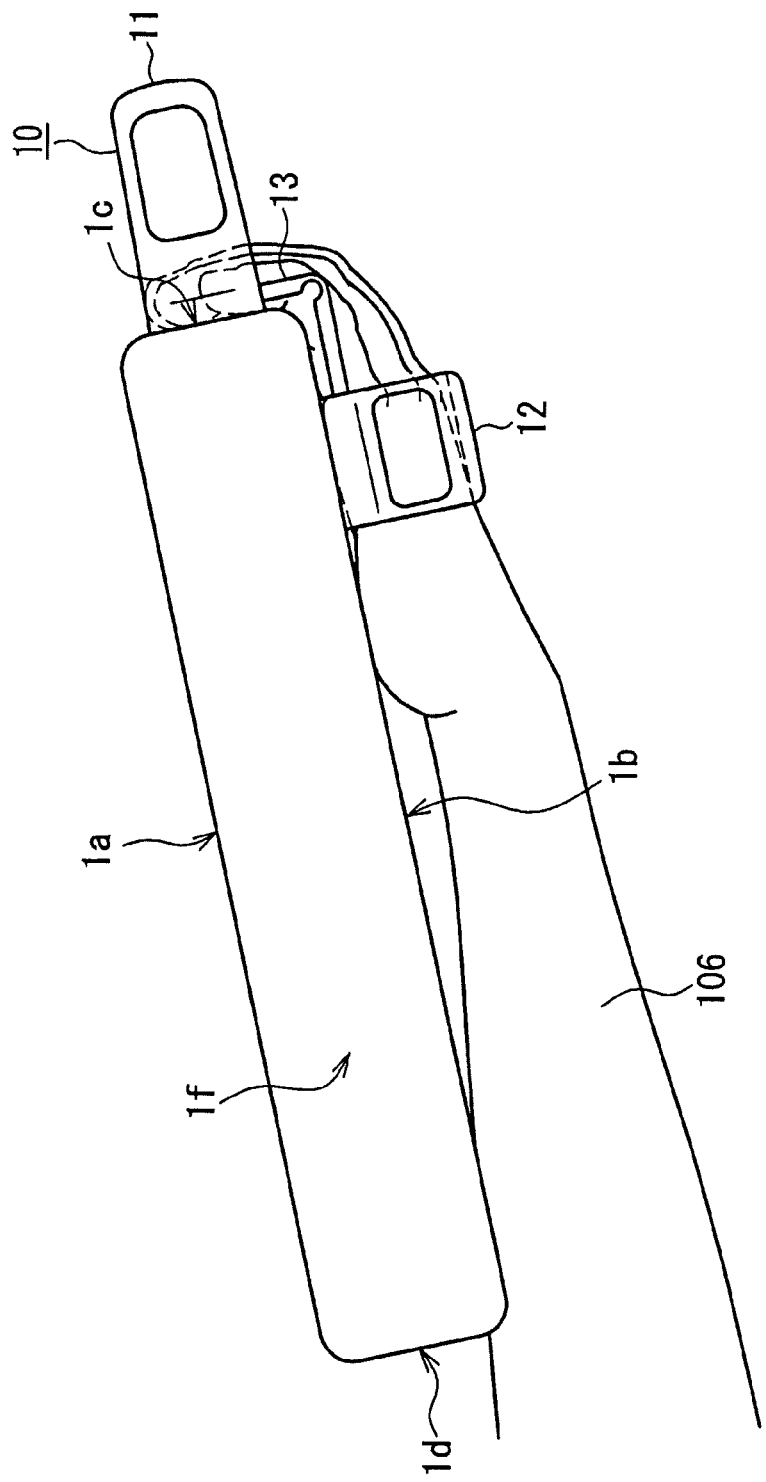
FIG. 9 is a side view showing the state where the electronic device is held with the hand.

As shown in FIGS. 8 and 9, the user can put a hand 101 (e.g., the left hand) in the void 10b (see FIG. 2D) between the grip belt 12 and the computer apparatus 1. In addition, the user inserts the second finger 102, the third finger 103, the fourth finger 104, and the fifth finger 105 of the hand 101 through the void 10b between the back surface 1b of the computer apparatus 1 and the grip belt 12 and hooks these fingers on the top surface 1c of the computer apparatus 1, whereby the attitude of the computer apparatus 1 with respect to the hand 101 is stabilized. Moreover, as shown in FIG. 9, the user brings an arm 106 into contact with the back surface 1b of the computer apparatus 1, and brings the back of the hand at the arm 106 into contact with the back surface 1b side of the belt portion 12a, whereby the attitude of the computer apparatus 1 with respect to the arm 106 is stabilized.

Figure 10:
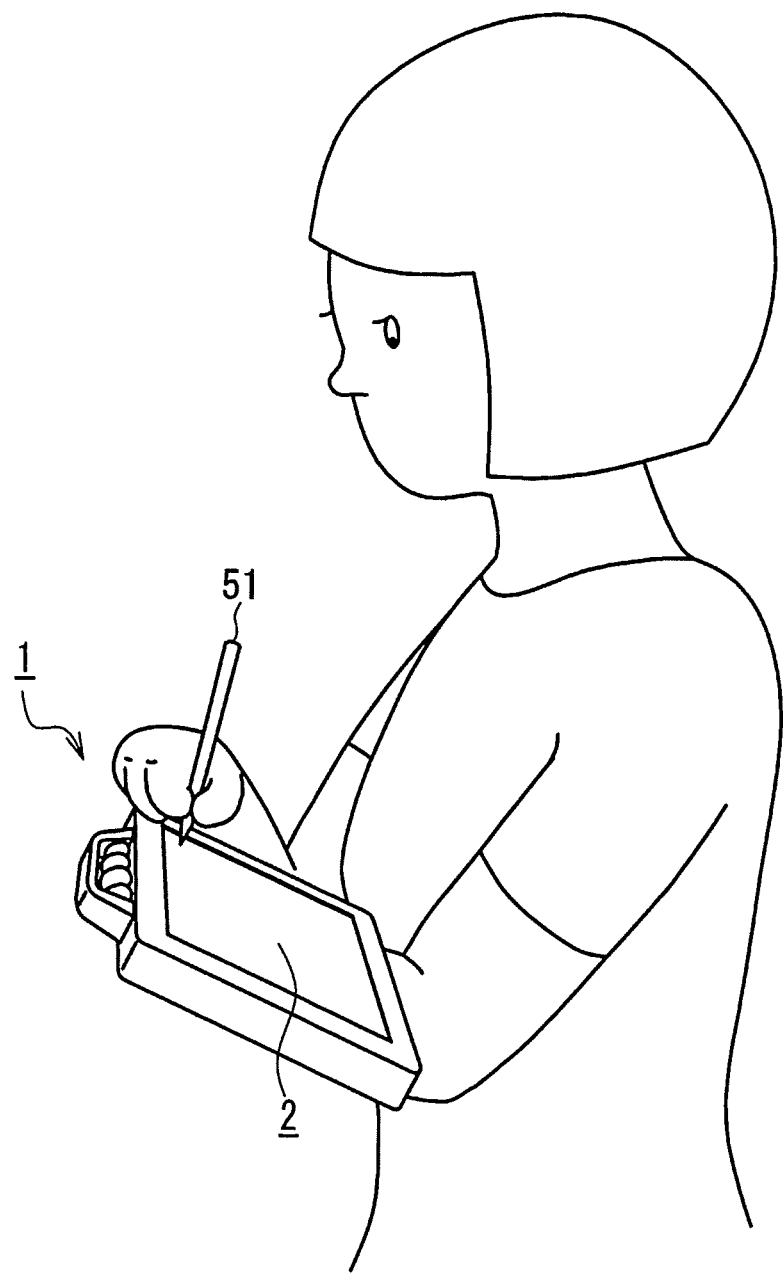
FIG. 10 is a perspective view showing the state where the electronic device is held with the hand.

By so doing, as shown in FIG. 10, the user can support the computer apparatus 1 with one hand (e.g., the left hand). In addition, as shown in FIG. 10, while supporting the computer apparatus 1 with one hand (e.g., the left hand), the user can hold a stylus pen 51 with the right hand. The user can input various information by touching the display panel 2 (in the case of including a touch panel) with a pointed end of the stylus pen 51. It should be noted that the configuration shown in FIG. 10 is in the case where the user who operates the computer apparatus 1 is a right-handed user, but in the case of a left-handed user as well, merely the right and left are inverted, and the operation on the computer apparatus 1 is the same.

According to the present embodiment, since the holding member 10 includes the hand grip 11, the user can carry the computer apparatus 1 with one hand.

According to the present embodiment, since the holding member 10 includes the grip belt 12, the user can support the computer apparatus 1 with one hand in such an attitude that the user can view a video image displayed on the display panel 2.

According to the present embodiment, since the hand grip 11 and the grip belt 12 are connected to each other via the connection section 13 to be integrally formed, the number of parts for the holding member 10 can be reduced and management of parts becomes easy. In addition, since the hand grip 11 and the grip belt 12 are integrally formed via the connection section 13, the cost of parts and the cost of molds at molding of the holding member 10 can be reduced. In addition, for example, when the fixed attachment between the hand grip 11 and the top surface 1c is deteriorated while the user holds the hand grip 11 and carries the computer apparatus 1, damage of the computer apparatus 1 due to its drop can be prevented since the connection section 13 is formed so as to be integrated with the grip belt 12. It should be noted that the same applies to the case where the user holds the computer apparatus 1 with the grip belt 12.

According to the present embodiment, since the grip belt 12 is disposed on the back surface 1b of the computer apparatus 1 and in a position close to the top surface 1c, the computer apparatus 1 can be placed on a flat placement surface in a tilted attitude. Thus, the display surface 2a of the display panel 2 faces toward the user who faces the computer apparatus 1, and hence the user easily views the display surface 2a of the display panel 2.

According to the present embodiment, due to the configuration in which the hand grip protection member 14 is disposed in the recess 11b or 11c of the hand grip 11, the hand grip 11 and the screws 16 for fixing the hand grip 11 to the computer apparatus 1 can be separated from each other. Thus, damage caused by the heads of the screws 16 being buried into, for example, the inner surfaces of the recesses 11b and 11c or the holes 11d and 11e of the hand grip 11 can be prevented, whereby the hand grip 11 can be protected from the heads of the screws 16. However, when the hand grip 11 is produced, for example, by two-color molding in which a metallic material is used as a core and the outer periphery thereof is covered with an elastomeric resin material, merely the holes 11d and 11e provided in the recesses 11b and 11c are formed in the core metal material, and the heads of the screws 16 can be prevented from being buried into the hand grip 11. Therefore, the hand grip protection member 14 can be omitted.

According to the present embodiment, due to the configuration in which the grip belt protection member 15 is disposed in the recess 12b or 12c of the grip belt 12, the grip belt 12 and the screws 16 for fixing the grip belt 12 to the computer apparatus 1 can be separated from each other. Thus, damage caused by the heads of the screws 16 being buried into, for example, the inner surfaces of the recesses 12b and 12c or the holes 12d and 12e of the grip belt 12 can be prevented, and the grip belt 12 can be supported by screwing the heads of the screws 16 into the screw holes 1m and 1n provided in the back surface 1b of the computer apparatus 1. In addition, since the outer shape of the grip belt protection member 15 is basically a rectangular column, for example, even when the screw 16 is screwed into the hole 15a, the grip belt protection member 15 does not rotate along the back surface 1b. In addition, the grip belt protection member 15 includes the groove 15g. Thus, even when, for example, the bottom surface 12m is elastically deformed, a projection that is fitted into the groove 15 is formed, and, for example, the screw 16 is screwed into the hole 15a, the grip belt protection member 15 does not rotate along the back surface 1b or 302b. Further, in the present embodiment, since the grip belt protection member 15 is screw-connected by means of the two screws 16, rotation of the grip belt protection member 15 can also be suppressed regardless of the outer shape of the grip belt protection member 15. It should be noted that when the grip belt 12 is produced, for example, by two-color molding in which a metallic material is applied to a site including the bottom surfaces 12h and 12m fixedly attached to the back surface 1b and the outer periphery thereof and the belt portion 12a is covered with an elastomeric resin, the grip belt protection member 15 can also be omitted.

In the present embodiment, the holding member 10 is integrally formed from a single material, but may be integrally formed from a plurality of materials. For example, the hand grip 11 and the grip belt 12 may be formed from hard resin such as polyacetal resin, and the connection section 13 may be formed from silicone rubber or the like.

In the present embodiment, the hand grip 11 is fixed to the top surface 1c of the computer apparatus 1, but may be fixed to another surface. In addition, the grip belt 12 is fixed to the back surface 1b of the computer apparatus 1, but may be fixed to another surface. Regarding the holding member 10, at least the hand grip 11 and the grip belt 12 may be integrally formed and fixed to an electronic device such as the computer apparatus 1.

In the present embodiment, each of the hand grip 11 and the grip belt 12 is formed in a substantially "C" shape, but may be formed in a closed shape in which a portion facing the computer apparatus 1 is not opened, such as an "O" shape or a hollow rectangular shape.

In the present embodiment, the use examples where the hand grip 11 is used when the computer apparatus 1 is carried and the grip belt 12 is used when the computer apparatus 1 is operated have been described. However, these use examples are arbitrary. For example, the user can also operate the computer apparatus 1 while holding the hand grip 11, or the user can also hold the grip belt 12 with a hand and can carry the computer apparatus 1.

The regions where the screw holes 1g are formed in the top surface 1c of the computer apparatus 1 may include recesses into which the bottom surfaces 11f and 11g of the hand grip 11 are fitted. With such a configuration, the hand grip 11 can assuredly be positioned with respect to the computer apparatus 1. In addition, even when the regions where the screw holes 1g are formed in the top surface 1c of the computer apparatus 1 include projections and the bottom surfaces 11f and 11g of the hand grip 11 include recesses into which the projections are fitted, the same advantageous effect is obtained.

The regions where the screw holes 1m and 1n are formed in the back surface 1b of the computer apparatus 1 may include recesses into which the bottom surfaces 12m and 12h of the grip belt 12 can be fitted. With such a configuration, the grip belt 12 can assuredly be positioned with respect to the computer apparatus 1. In addition, even when the regions where the screw holes 1m and 1n are formed in the back surface 1b of the computer apparatus 1 include projections and the bottom surfaces 12m and 12h of the grip belt 12 include recesses into which the projections can be fitted, the same advantageous effect is obtained.

In the present embodiment, the holding member 10 is fixed to the computer apparatus 1 by means of the screws 16, but the fixing method is not limited to the screw connection by means of screws. For example, the projection 14b of the hand grip protection member 14 is formed into such a shape that the projection 14b can be inserted through each of the holes 11d and 11e of the hand grip 11, and a claw portion is provided at a pointed end thereof. For example, when the claw portion is configured to be engaged with a hole formed in the top surface 1c of the computer apparatus 1, the hand grip 11 can be fixed to the top surface 1c of the computer apparatus 1 without using the screws 16. It should be noted that the method using claw engagement can be similarly used as a method for fixing the grip belt 12. In addition, the holding member 10 may be adhesively fixed to the computer apparatus 1.

According to the present embodiment, the holding member 10 including integrally the hand grip 11 and the grip belt 12 is fixed to the computer apparatus 1. However, when only either of the hand grip 11 or the grip belt 12 is provided in the computer apparatus 1, the hand grip 11 and the grip belt 12 can be produced as single items, for example, by cutting the thin portion 13c of the connection section 13 in the produced holding member 10. In the present embodiment, the holding member 10 is formed from a flexible material such as silicone rubber, and thus can be easily cut with a cutter knife or the like.

[1-3. Configuration of Computer Apparatus on which Handle Member is Mounted]

Figure 11:
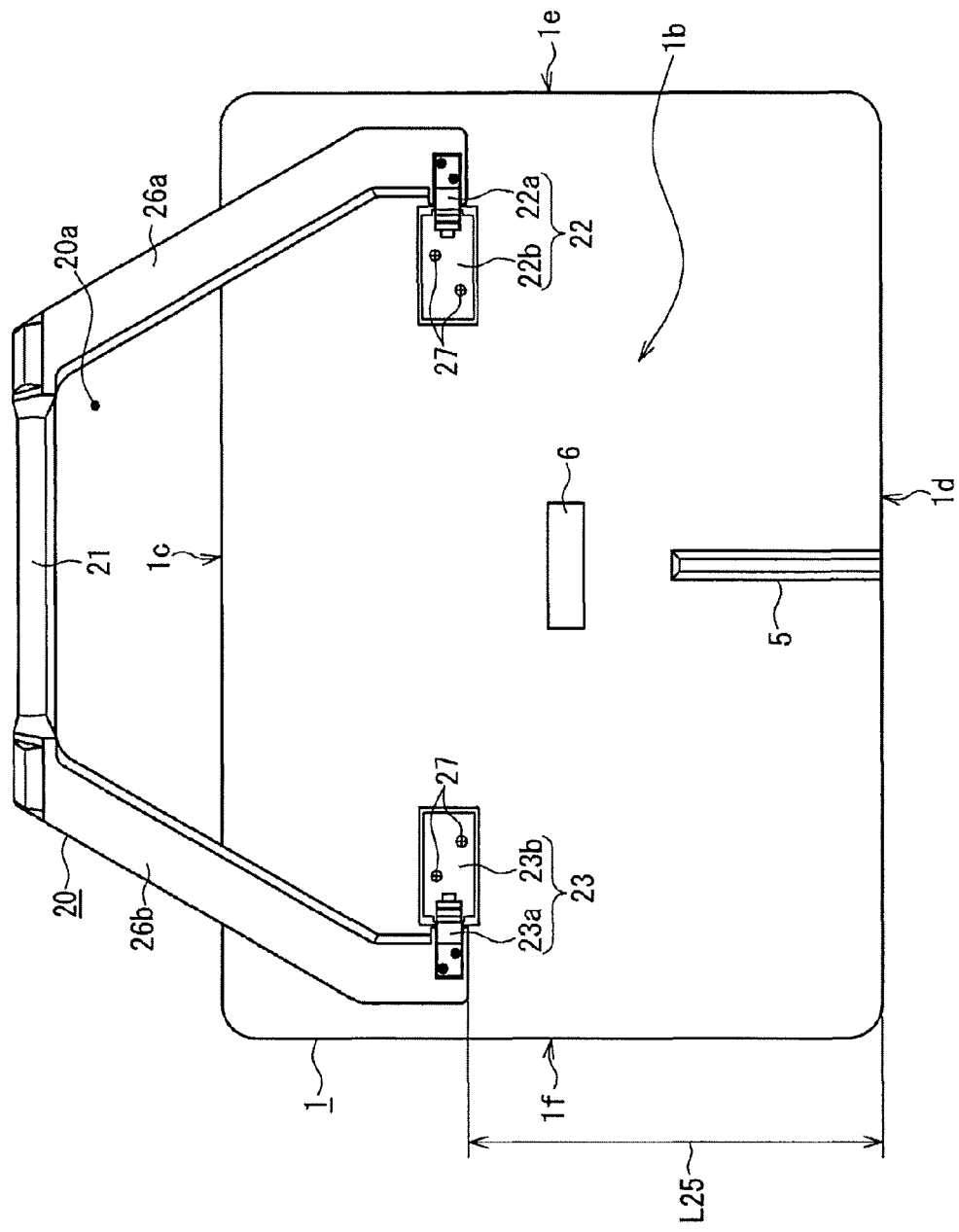
FIG. 11 is a rear view of an electronic device including a handle member.

FIG. 11 is a plan view of the computer apparatus 1 on which a handle member 20 is mounted. As shown in FIG. 11, the handle member 20 can be mounted on the computer apparatus 1 of the present embodiment. The handle member 20 is rotatable. FIG. 11 shows a state where the handle member 20 is rotated to a rotation end on the top surface 1c side of the computer apparatus 1 (also referred to as "maximum rotation end", since it is in a state where the handle member 20 is rotated relative to the back surface 1b to a maximum extent). A first hinge section 22 and a second hinge section 23 may be in a state where the internal structures thereof cannot be seen from the outside since the first hinge section 22 and the second hinge section 23 are actually covered with, for example, covers or the like. However, in FIG. 11, the covers or the like are omitted in order to clearly show the internal structures of the first hinge section 22 and the second hinge section 23.

As shown in FIG. 11, the handle member 20 is fixed to the back surface 1b of the computer apparatus 1 by screw-connecting support plates 22b and 23b to the back surface 1b of the computer apparatus 1 by screws 27. The handle member 20 is disposed so as to be exposed on the back surface 1b of the computer apparatus 1. When the handle member 20 is at the maximum rotation end shown in FIG. 11, a holding section 21 and portions of a first leg portion 26a and a second leg portion 26b protrude from the back surface 1b of the computer apparatus 1 in the direction along a plane parallel to the back surface 1b, namely, from the top surface 1c. In addition, a void 20a is formed between the holding section 21 and the computer apparatus 1.

Figure 12A:
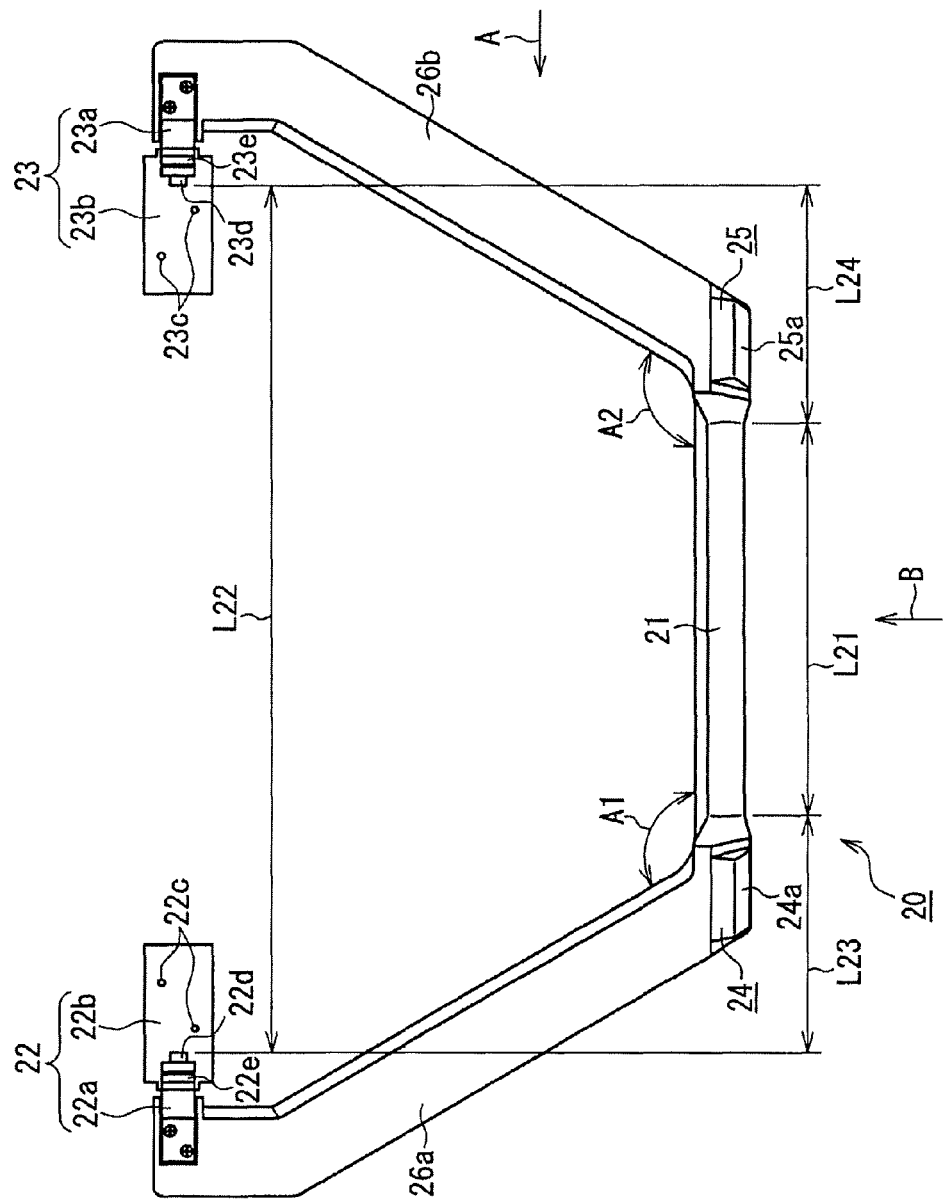
FIG. 12A is a plan view of the handle member.
Figure 12B:
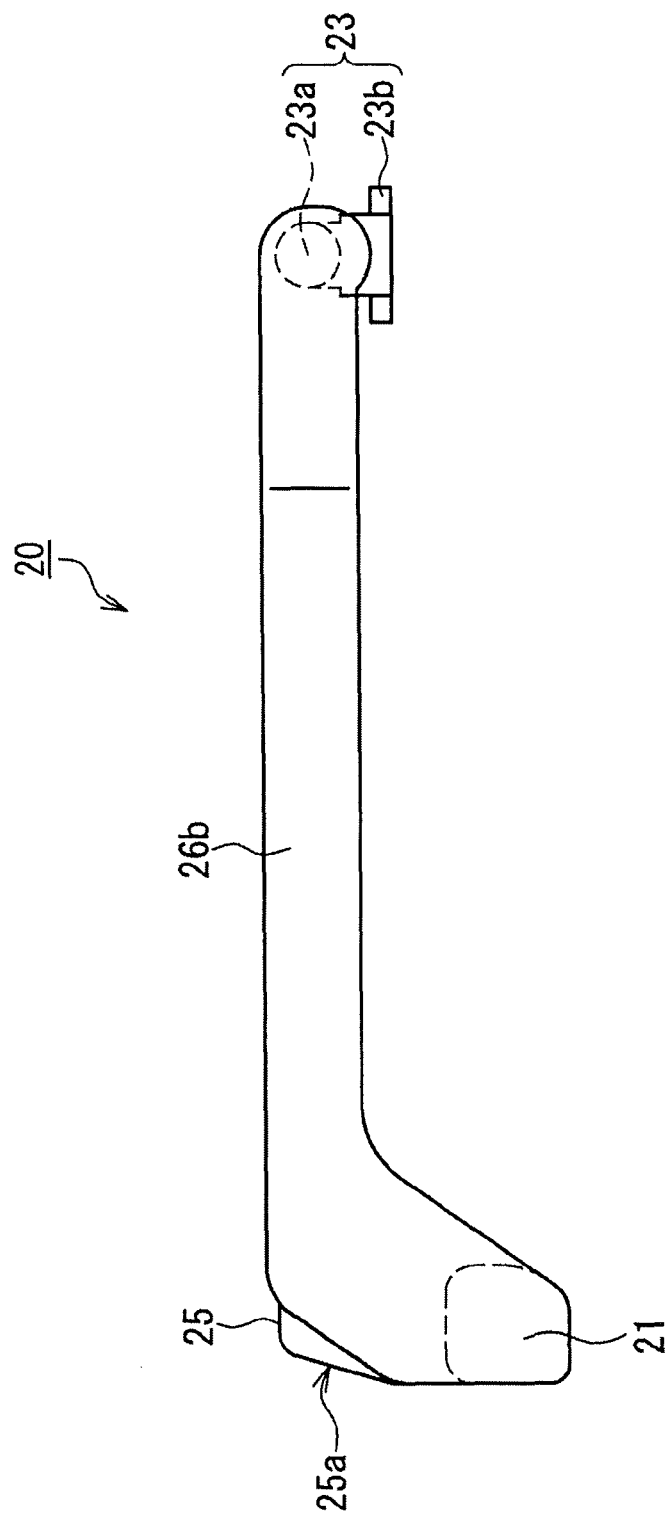
FIG. 12B is a side view of the handle member.
Figure 12C:
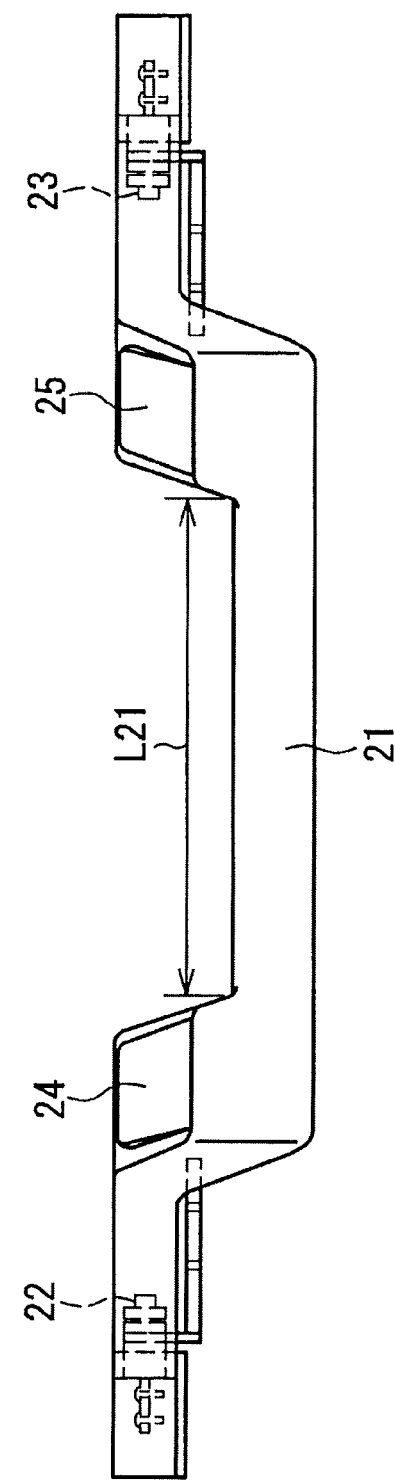
FIG. 12C is a side view of the handle member.

FIG. 12A is a plan view of the handle member 20. FIG. 12B is a side view of the handle member 20 as seen from a direction indicated by an arrow A in FIG. 12A. FIG. 12C is a side view of the handle member 20 as seen from a direction indicated by an arrow B in FIG. 12A. In the present embodiment, a member designated at the reference sign "20" is referred to as "handle member". However, since the member is configured to rotate relative to the back surface 1b as described above, the member has handle functionality and stand functionality. Therefore, a member referred to as "stand member" and having handle functionality is also synonymous with the "handle member" in the present embodiment.

The handle member 20 is formed so as to have a substantially "C" cross-sectional shape as shown in FIG. 12A. The handle member 20 includes the holding section 21, the first hinge section 22, the second hinge section 23, a first foot portion 24, a second foot portion 25, the first leg portion 26a, and the second leg portion 26b. The first leg portion 26a and the second leg portion 26b have lengths from end surfaces where the first hinge section 22 (described later) and the second hinge section 23 (described later) are fixed to the back surface 1b, to the holding section 21.

The holding section 21 is a portion held by the user, for example, when being at the maximum rotation end shown in FIG. 11. The holding section 21 has a cross-sectional shape that is a circular or elliptical columnar shape in the present embodiment, but the cross-sectional shape thereof is not limited to this shape. The holding section 21 is preferably formed, for example, with recesses and projections that correspond to the shape of a hand or fingers of a person, since the user easily holds the holding section 21. The length L21 of the holding section 21 in the longitudinal direction is preferably equal to or larger than, for example, 100 mm, in order for the user to easily hold the holding section 21. By shortening the length L21 of the holding section 21 as much as possible, the interval between the first foot portion 24 and the second foot portion 25 can be decreased. Due to such a configuration, errors in the heights and flatness of the first foot portion 24 and the second foot portion 25 are easily absorbed, and, for example, when the computer apparatus 1 is placed on a flat surface and the front surface 1a thereof is viewed, the stability of the installation can be improved. In addition, the length L21 of the holding section 21 is required to be equal to or larger than the size of a hand of the user holding the holding section 21, and is preferably, for example, about 100 to 150 mm. The holding section 21 is preferably formed from metal such as magnesium in order to ensure desired strength, and the surface of the metal is more preferably covered with an elastomeric resin or the like, since formation of scars in, for example, the back surface 1b, a flat surface on which the computer apparatus 1 is placed, or the like can be reduced.

The first hinge section 22 is integrally connected to an end of the first leg portion 26a which is opposite to an end to which the holding section 21 is connected. The first hinge section 22 includes a hinge mechanism 22a and a support plate 22b. The hinge mechanism 22a includes a support shaft 22d and a plurality of washers 22e. The support shaft 22d is fixed to the support plate 22b. The plurality of washers 22e include a washer fixed to the support shaft 22d and a washer fixed to the first leg portion 26a. The plurality of washers 22e are pressure-welded to each other, and generate a load on rotation when the washer fixed to the first leg portion 26a rotates with rotation of the first leg portion 26a relative to the first hinge section 22. The support plate 22b has holes 22c through which screws (described later) can be inserted. The support plate 22b is screw-connected and fixed to the back surface 1b of the computer apparatus 1 by means of the screws (described later). A plurality of the holes 22c are preferably formed, since attachment strength of the support plate 22b can be improved.

The second hinge section 23 is integrally connected to an end of the second leg portion 26b which is opposite to an end to which the holding section 21 is connected. The second hinge section 23 includes a hinge mechanism 23a and a support plate 23b. The hinge mechanism 23a includes a support shaft 23d and a plurality of washers 23e. The support shaft 23d is fixed to the support plate 23b. The plurality of washers 23e include a washer fixed to the support shaft 23d and a washer fixed to the second leg portion 26b. The plurality of washers 23e are pressure-welded to each other, and generate a load on rotation when the washer fixed to the second leg portion 26b rotates with rotation of the second leg portion 26b relative to the second hinge section 23. The support plate 23b has holes 23c through which screws (described later) can be inserted. The support plate 23b is screw-connected and fixed to the back surface 1b of the computer apparatus 1 by means of the screws (described later). A plurality of the holes 23c are preferably formed, since attachment strength of the support plate 23b can be improved.

The first foot portion 24 is disposed adjacently to one end of the first leg portion 26a (a position where the first leg portion 26a and the holding section 21 are connected to each other). The first foot portion 24 is disposed at such a position in the handle member 20 as to come into contact with a placement surface, for example, when the computer apparatus 1 is installed in a standing attitude. The first foot portion 24 can be fixed to the first leg portion 26a by means of a screw or an adhesive. The first foot portion 24 can be formed from a resin material having so-called elastomeric properties such as elastic or viscoelastic copolymer resin, internally-plasticized resin, or rubber-elastic resin. The first foot portion 24 can be formed from, for example, a polyester thermoplastic elastomer (TPEE). When the handle member 20 is obtained, for example, by coating a metallic material with an elastomeric resin, the first foot portion 24 can be formed so as to be integrated with the coating material. The first foot portion 24 is formed in a triangular-columnar shape in the present embodiment, but may be formed in another shape such as a semicircular-columnar shape. The first foot portion 24 includes a contact surface 24a. The contact surface 24a is formed at such a position in the first foot portion 24 as to come into contact with a placement surface when the computer apparatus 1 is installed in a standing attitude, and a material having so-called tackiness on a surface thereof is preferably used for the contact surface 24a since it has resistance to slippage. The contact surface 24a is a flat surface in the present embodiment, but may be a curved surface.

The second foot portion 25 is disposed adjacently to one end of the second leg portion 26b (a position where the second leg portion 26b and the holding section 21 are connected to each other). The second foot portion 25 is disposed at such a position in the handle member 20 as to come into contact with a placement surface, for example, when the computer apparatus 1 is installed in a standing attitude. The second foot portion 25 can be fixed to the second leg portion 26b by means of a screw or an adhesive. The second foot portion 25 can be formed from a resin material having so-called elastomeric properties such as elastic or viscoelastic copolymer resin, internally-plasticized resin, or rubber-elastic resin. The second foot portion 25 can be formed from, for example, a polyester thermoplastic elastomer (TPEE). When the handle member 20 is obtained, for example, by coating a metallic material with an elastomeric resin, the second foot portion 25 can be formed so as to be integrated with the coating material.

The second foot portion 25 is formed in a triangular-columnar shape in the present embodiment, but may be formed in another shape such as a semicircular-columnar shape. The second foot portion 25 includes a contact surface 25a. The contact surface 25a is formed at such a position in the second foot portion 25 as to come into contact with a placement surface when the computer apparatus 1 is installed in a standing attitude, and a material having so-called tackiness on a surface thereof is preferably used for the contact surface 25a since it has resistance to slippage. The contact surface 25a is a flat surface in the present embodiment, but may be a curved surface.

The "standing" in the present embodiment refers to a state where the computer apparatus 1 stands on a placement surface on its own while being supported with the handle member 20. Specifically, the "standing" in the present embodiment refers to a state where the handle member 20 supports the computer apparatus 1 in a tilted attitude to cause the computer apparatus 1 to stand on a placement surface on its own. Thus, the "standing" in the present embodiment does not include a state where the handle member 20 does not support the computer apparatus 1 in a tilted attitude, a state where only the computer apparatus 1 is in contact with a placement surface and stands thereon on its own, and a state where the user holds a portion of the computer apparatus 1 or the handle member 20 to cause the computer apparatus 1 to stand on a placement surface.

The first leg portion 26a is integrally connected at one end thereof to one end of the holding section 21, and is screw-connected at the other end thereof to the first hinge section 22 by means of screws (see FIGS. 11 and 12A). The first leg portion 26a has a rectangular-columnar shape whose cross-sectional shape is rectangular, but the shape thereof is not limited to this shape. The first leg portion 26a is preferably formed from metal such as magnesium in order to ensure desired strength, and the surface of the metal is more preferably covered with an elastomeric resin or the like, since formation of scars in the back surface 1b or the like can be reduced when engaging the back surface 1b of the computer apparatus 1 or the like. The first leg portion 26a is connected to the holding section 21 at an angle A1. The angle A1 is preferably equal to or higher than 90 degrees in a configuration in which the holding section 21 is held, and is more preferably 90 to 120 degrees in view of shape stability by increasing the rigidity of the handle member 20 (particularly, the holding section 21) and attitude stability when the computer apparatus 1 is placed on a placement surface while being supported with the handle member 20.

The second leg portion 26b is integrally connected at one end thereof to the other end of the holding section 21, and is screw-connected at the other end thereof to the second hinge section 23 by means of screws (see FIGS. 11 and 12A). The second leg portion 26b has a rectangular-columnar shape whose cross-sectional shape is rectangular, but the shape thereof is not limited to this shape. The second leg portion 26b is preferably formed from metal such as magnesium in order to ensure desired strength, and the surface of the metal is more preferably covered with elastomeric resin or the like, since formation of scars in the back surface 1b or the like can be reduced when engaging the back surface 1b of the computer apparatus 1 or the like. The second leg portion 26b is connected to the holding section 21 at an angle A2. The angle A2 is preferably equal to or higher than 90 degrees in a configuration in which the holding section 21 is held, and is more preferably 90 to 120 degrees in view of shape stability by increasing the rigidity of the handle member 20 (particularly, the holding section 21) and attitude stability when the computer apparatus 1 is placed on a placement surface while being supported with the handle member 20.

In the present embodiment, the length L21 of the holding section 21 (the gap between the first leg portion 26a and the second leg portion 26b) and the gap L22 between the support shaft 22d and the support shaft 23d (the gap between surfaces of the support shaft 22d and the support shaft 23d which face each other) are set so as to have the following dimensional relation.

$$L21<L22 \qquad \text{relational expression (1)}$$

In addition, the gap L23 between an end of the holding section 21 (on the first leg portion 26a side) and the support shaft 22d (an end surface of the support shaft 22d which faces the support shaft 23d) and the gap L24 between the other end of the holding section 21 (on the second leg portion 26b side) and the support shaft 23d (an end surface of the support shaft 23d which faces the support shaft 22d) in the direction of the rotation axes of the first hinge section 22 and the second hinge section 23 which face each other are set so as to have the following dimensional relation.

$$L23=L24 \qquad \text{relational expression (2)}$$

Since the dimensions L21 to L24 are set so as to have the dimensional relations shown by the relational expressions (1) and (2), the holding section 21 is located at the center in the direction of the rotation axes of the first hinge section 22 and the second hinge section 23. Thus, the weight balance is stabilized when the user holds the holding section 21 with a hand and carries the computer apparatus 1.

Figure 13:
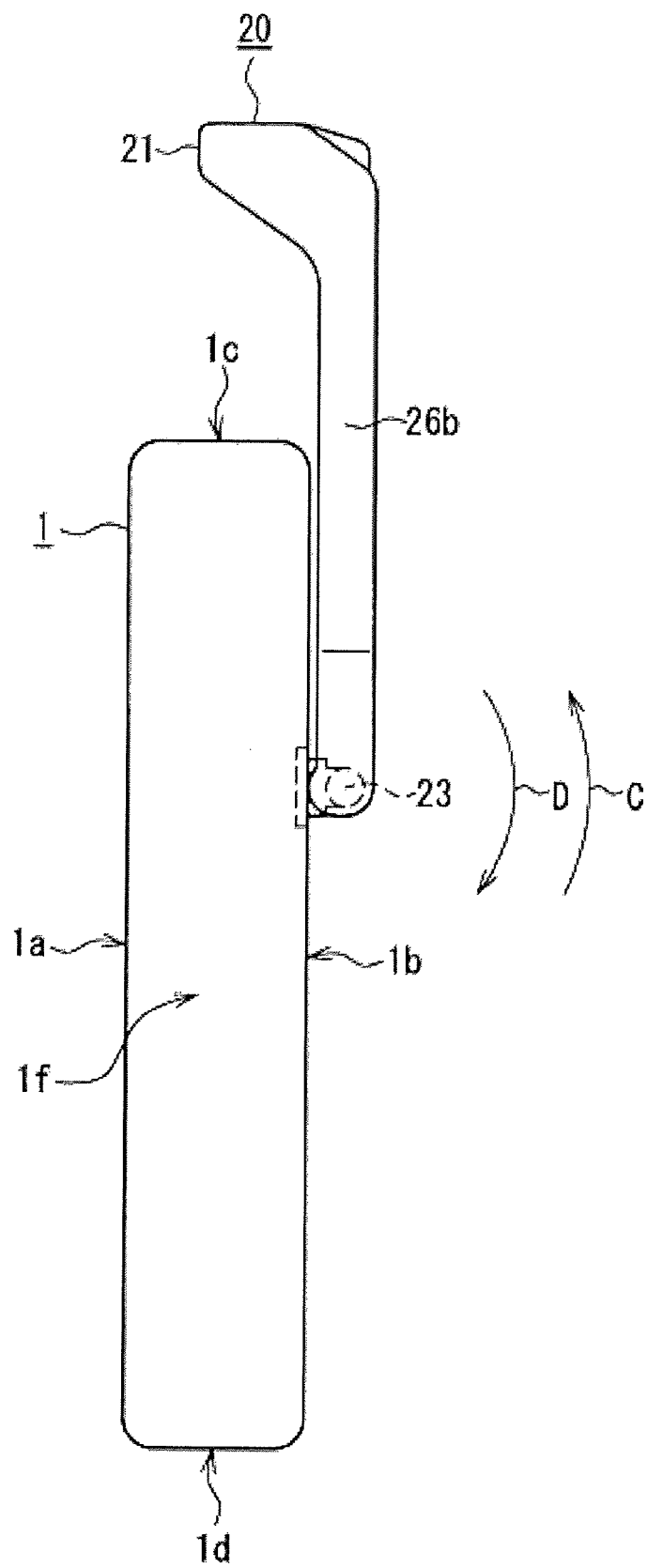
FIG. 13 is a side view of the electronic device including the handle member.
Figure 14:
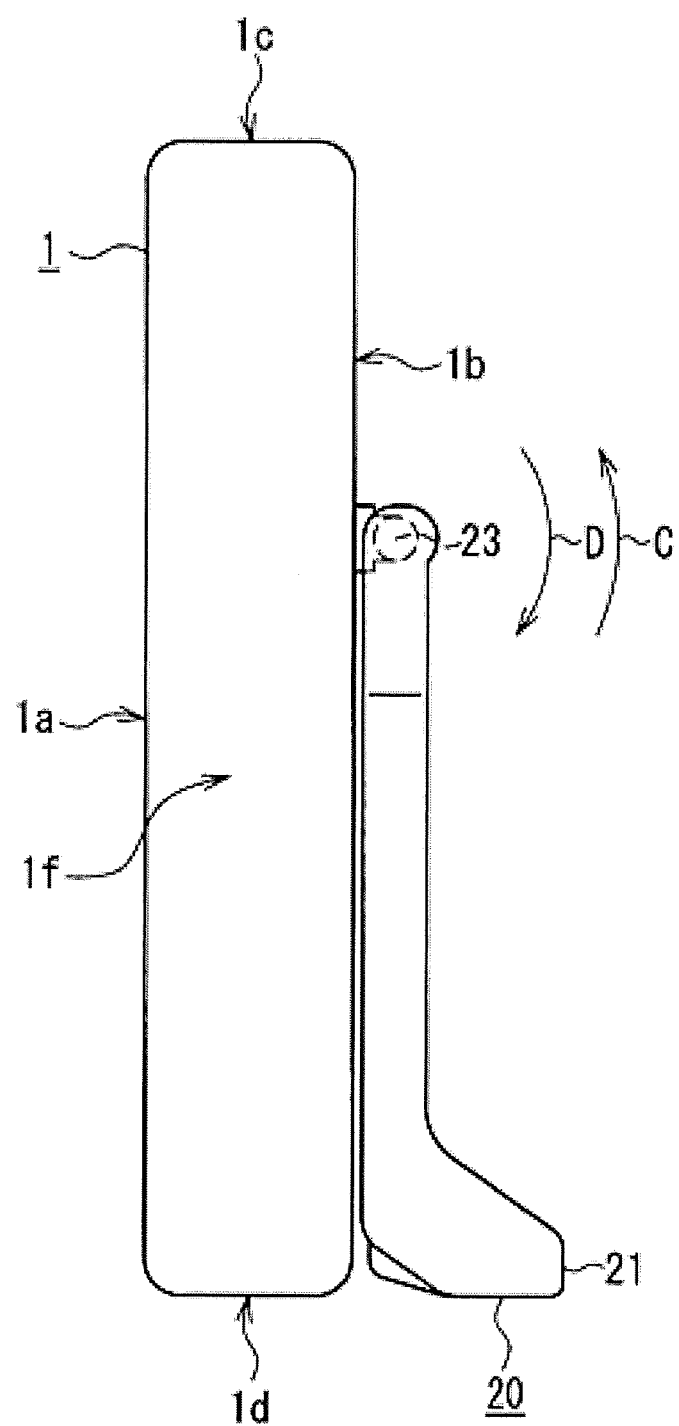
FIG. 14 is a side view of the electronic device including the handle member.

FIGS. 13 and 14 are side views of the computer apparatus 1. FIG. 13 shows a state where the handle member 20 is at a first position. FIG. 14 shows a state where the handle member 20 is at a second position.

Figure 15:
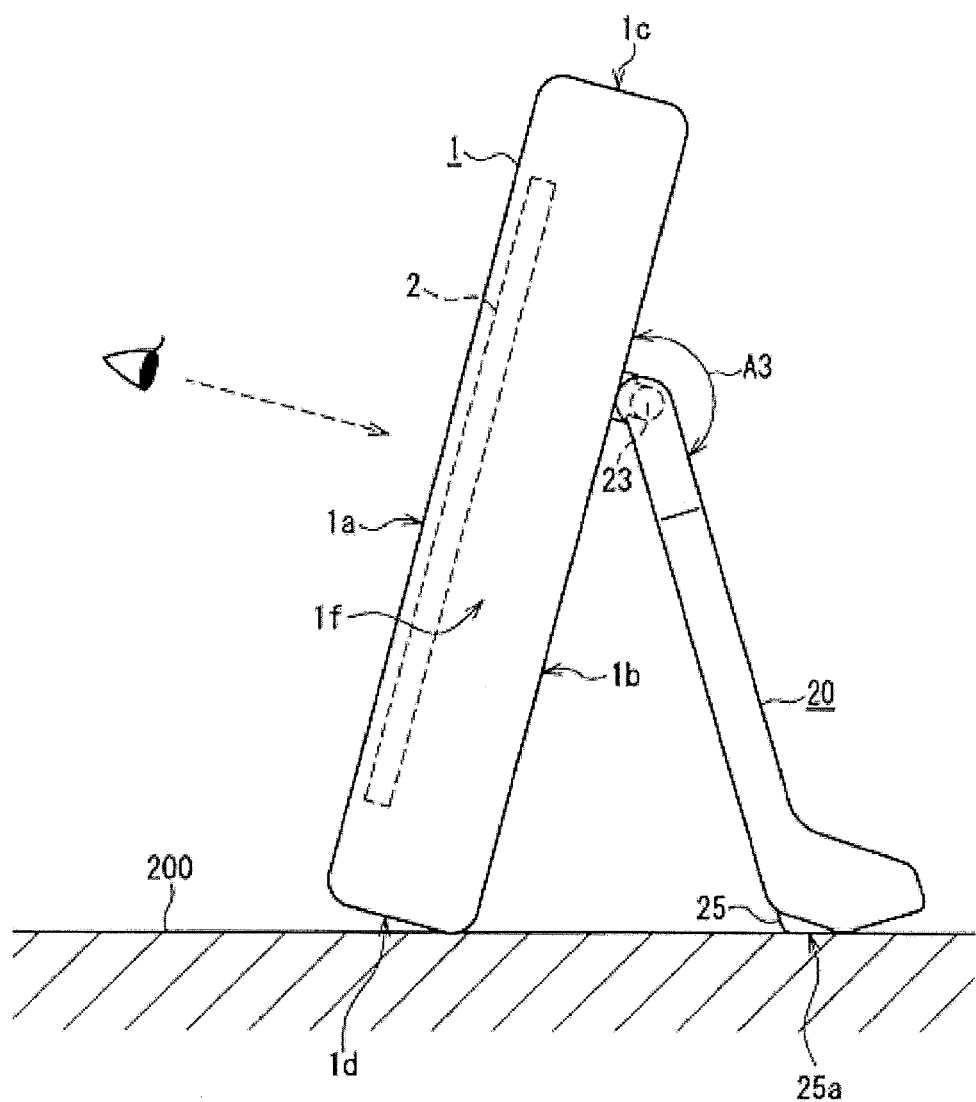
FIG. 15 is a side view of the electronic device in a standing mode.

The handle member 20 can be at the first position shown in FIG. 13 or the second position shown in FIG. 14, and is rotatable between the first position and the second position to be in a later-described state as in FIG. 15. The first position is a position when the handle member 20 is rotated to the maximum rotation end on the top surface 1c of the computer apparatus 1 as shown in FIG. 13. The second position is a position when the handle member 20 is rotated to a rotation end on the bottom surface 1d side of the computer apparatus 1 (also referred to as "minimum rotation end", since it is in a state where the handle member 20 is rotated relative to the back surface 1b to a minimum extent) as shown in FIG. 14. In addition, the handle member 20 can be at a first rotation position or a second rotation position. The first rotation position is a position of the handle member 20 when the holding section 21 is located so as to protrude from the top surface 1c of the computer apparatus 1 as shown in FIG. 13. In other words, the first rotation position includes the first position. The second rotation position is a position of the handle member 20 when the handle member 20 supports the computer apparatus 1 in a tilted attitude as shown in FIG. 15. In other words, the second rotation position is in a range obtained by excluding the first rotation position from the range between the first position and the second position.

When the handle member 20 is at the position shown in FIG. 13, the first leg portion 26a and the second leg portion 26b are in contact with or close to the back surface 1b of the computer apparatus 1, and thus rotation of the handle member 20 in a direction indicated by an arrow C is restricted. In other words, the first position is the maximum rotation end of the handle member 20 in the direction indicated by the arrow C.

When the handle member 20 is at the position shown in FIG. 13, the handle member 20 is rotatable only in a direction indicated by an arrow D.

When the handle member 20 is displaced from the first position shown in FIG. 13 in the direction indicated by the arrow D, the handle member 20 rotates in the direction indicated by the arrow D while being supported by the hinge mechanism 22a of the first hinge section 22 and the hinge mechanism 23a of the second hinge section 23 (see FIG. 11). At that time, the support plates 22b and 23b do not rotate, since the support plates 22b and 23b are fixed to the computer apparatus 1.

The handle member 20 can be rotated to the second position shown in FIG. 14. When the handle member 20 is at the position shown in FIG. 14, the first leg portion 26a and the second leg portion 26b are in contact with or close to the back surface 1b of the computer apparatus 1, and thus rotation of the handle member 20 in the direction indicated by the arrow D is restricted. In other words, the second position is the minimum rotation end of the handle member 20 in the direction indicated by the arrow D. When the handle member 20 is at the position shown in FIG. 14, the handle member 20 is rotatable only in the direction indicated by the arrow C.

When the handle member 20 is displaced from the second position shown in FIG. 14 in the direction indicated by the arrow C, the handle member 20 rotates in the direction indicated by the arrow C while being supported by the hinge mechanisms 22a and 23a (see FIG. 11). At that time, the support plates 22b and 23b do not rotate, since the support plates 22b and 23b are fixed to the computer apparatus 1.

In the handle member 20, rotation torque (loads) in the hinge mechanisms 22a and 23a (see FIG. 11) is set so as to be relatively high, and thus the handle member 20 can be kept stationary at any angle between the first position and the second position. In other words, where the angle of the first leg portion 26a relative to the back surface 1b when the handle member 20 is at the first position shown in FIG. 13 is set to 0 degree and the angle of the first leg portion 26a relative to the back surface 1b when the handle member 20 is at the second position shown in FIG. 14 is set to 180 degrees, the hinge mechanisms 22a and 23a have such rotation torque (loads) that the handle member 20 can be kept stationary at any angle between 0 and 180 degrees.

In the present embodiment, the handle member 20 can be kept stationary at any angle between 0 and 180 degrees by using the rotation torque in the hinge mechanisms 22a and 23a. When the hinge mechanisms 22a and 23a include a click mechanism, the handle member 20 can also be kept stationary at a set angle between 0 to 180 degrees. The click mechanism includes, for example, recesses and projections in the plurality of washers in the hinge mechanisms 22a and 23a (see FIG. 11) and is configured to fit the projections into the recesses at a predetermined angle to cause a click feeling. The "set angle" is a rotation angle of the handle member 20 which can cause a click feeling, and can be set on the basis of the positions of the recesses and the projections formed in the washers provided in the hinge mechanisms 22a and 23a.

The "stationary" in the present specification refers to a state where the handle member 20 does not rotate due to its own weight and stops. For example, when the handle member 20 is at the first position shown in FIG. 13, if the rotation torque in the hinge mechanisms 22a and 23a (see FIG. 11) is low, the handle member 20 may rotate in the direction indicated by the arrow D due to its own weight. The "stationary" described in the present embodiment means a state where even when the handle member 20 is located at such a position that the handle member 20 can rotate due to its own weight, the handle member 20 does not rotate and is kept stationary.

FIG. 15 is a side view showing a state where the computer apparatus 1 is supported in a standing attitude by using the handle member 20. The handle member 20 shown in FIG. 15 is at the second rotation position.

As shown in FIG. 15, the handle member 20 is at a rotation angle A3 of, for example, 160 degrees, whereby the computer apparatus 1 can be supported in a standing attitude and placed on a placement surface 200. When the handle member 20 is at the second rotation position as shown in FIG. 15, rotation torque is provided by the washers provided in the hinge mechanisms 22a and 23a (see FIG. 11) to the handle member 20, and the handle member 20 is kept stationary. Since the handle member 20 can be kept stationary at any angle by the hinge mechanisms 22a and 23a, the rotation angle A3 is not limited to 160 degrees, and the handle member 20 can be kept stationary even at another angle. In other words, when the handle member 20 is kept stationary at the second rotation position, the computer apparatus 1 can be installed on the placement surface 200 in a standing attitude. Therefore, the user can adjust the angle of the display panel 2 to an arbitrary easily-viewable angle.

When the handle member 20 is at the second rotation position shown in FIG. 15, the contact surfaces 24a and 25a of the first and second foot portions 24 and 25 (only the second foot portion 25 is shown in FIG. 15) are in contact with the placement surface 200. At that time, the contact surfaces 24a and 25a may be in point contact with or in line contact with the placement surface 200 when being seen from a side as in FIG. 15. However, in view of stability of the attitude of the computer apparatus 1, the contact surfaces 24a and 25a are preferably in surface contact (line contact shown in FIG. 15) with the placement surface 200 When the computer apparatus 1 is in the standing attitude shown in FIG. 15, a portion near the boundary between the back surface 1b and the bottom surface 1d is in contact with the placement surface 200. Since the rotation angle A3 of the handle member 20 can be arbitrarily set as described above, the contact surfaces 24a and 25a may not have linear relationships with the placement surface 200 depending on the angle A3. In such a case, although the stability of the computer apparatus 1 is deteriorated, the first foot portion 24 and the second foot portion 25 can be in point contact with the placement surface 200.

As shown in FIG. 15, when the computer apparatus 1 is tilted at a predetermined angle and installed on the placement surface 200, the display surface of the display panel 2 faces slightly upward with respect to the placement surface 200. Therefore, the display surface of the display panel 2 easily faces, in a parallel relation, the viewing filed of the user who faces the display panel 2, and thus it is made easy for the user to view a video image displayed on the display panel 2.

Figure 16:
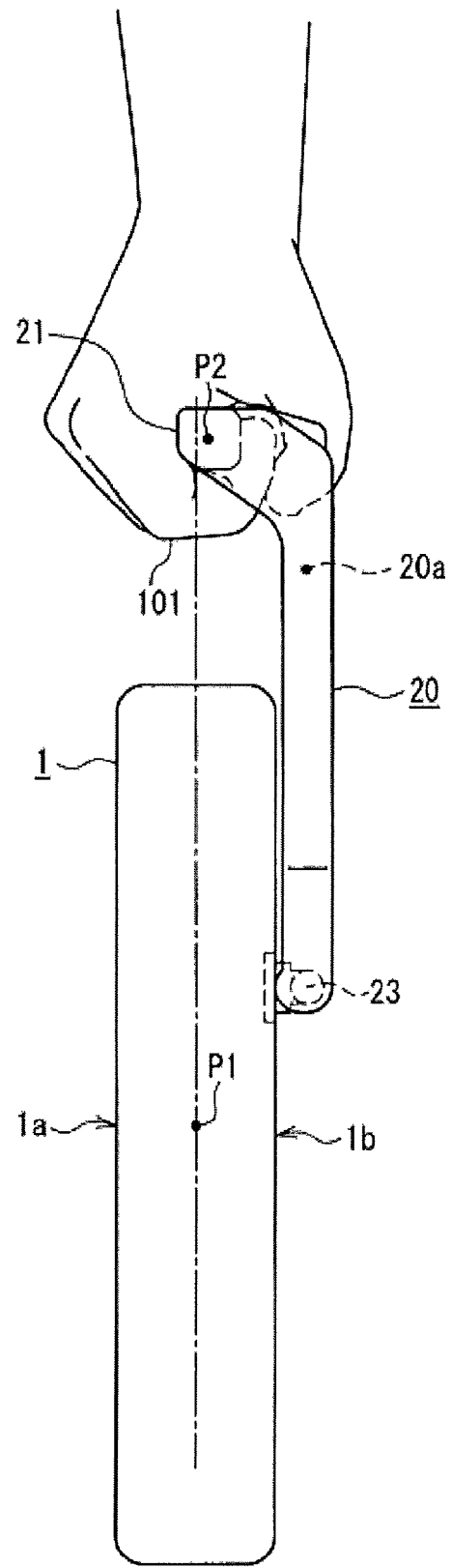
FIG. 16 is a side view showing a state where a user holds the handle member.

FIG. 16 is a side view showing a state where the computer apparatus 1 is carried with the handle member 20. The handle member 20 shown in FIG. 16 is at the first position shown in FIG. 13. Rotation torque is provided by the washers provided in the hinge mechanisms 22a and 23a (see FIG. 11) to the handle member 20 located at the first position, and the handle member 20 is kept stationary. FIG. 16 shows a state where the handle member 20 is at the first position, and when the handle member 20 is located at least at the first rotation position, it is convenient for the case of carrying the computer apparatus 1 in a hanging manner. However, the rotation angle A3 of the handle member 20 can be arbitrarily set. Thus, even when the handle member 20 is, for example, at the second rotation position shown in FIG. 15, the user can hold the holding section 21 fixedly attached to the computer apparatus 1, and can carry the computer apparatus 1.

As shown in FIG. 16, the user can hold the holding section 21 by inserting fingers 101 of a hand through the void 20a in the handle member 20.

The handle member 20 has a shape in which when the handle member 20 is at the first position shown in FIG. 16, the center of gravity P1 of the computer apparatus 1 and the axis P2 of the holding section 21 are located substantially on a line parallel to the front surface 1a. Therefore, when the user holds the holding section 21 with a hand, the computer apparatus 1 is in such an attitude that the front surface 1a or the back surface 1b is parallel to the vertical line, and thus the user can carry the computer apparatus 1 in a stable attitude.

In addition, since the handle member 20 has a shape in which the center of gravity P1 of the computer apparatus 1 and the axis P2 of the holding section 21 are located substantially on the line parallel to the front surface 1a, when the user holds the holding section 21 and carries the computer apparatus 1 so as to hang the computer apparatus 1 in the vertical direction, the user can carry the computer apparatus 1 such that the front surface 1a of the computer apparatus 1 faces the user, or can carry the computer apparatus 1 such that the back surface 1b of the computer apparatus 1 faces the user.

Figure 17:
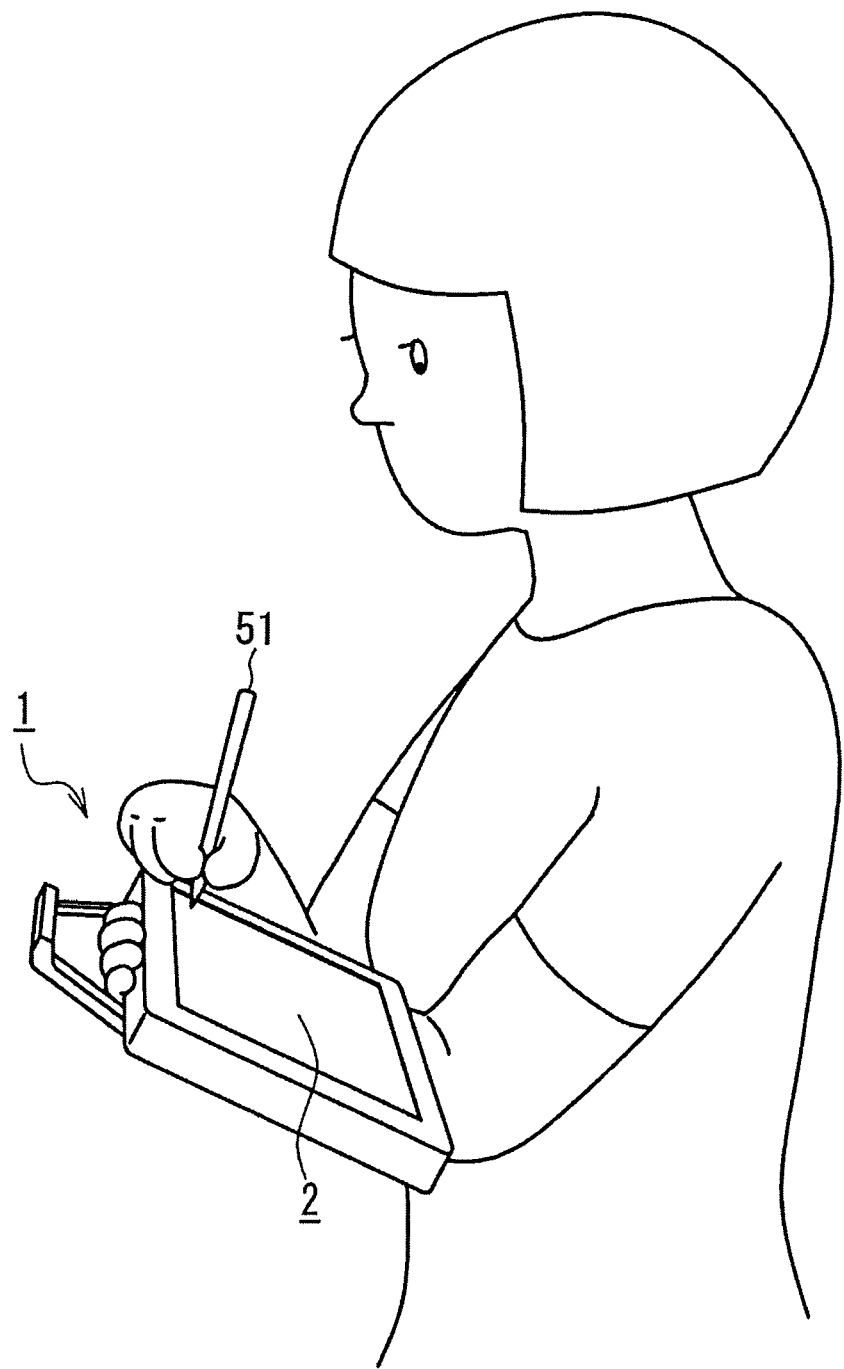
FIG. 17 is a perspective view showing the state where the user holds the handle member.
Figure 18:
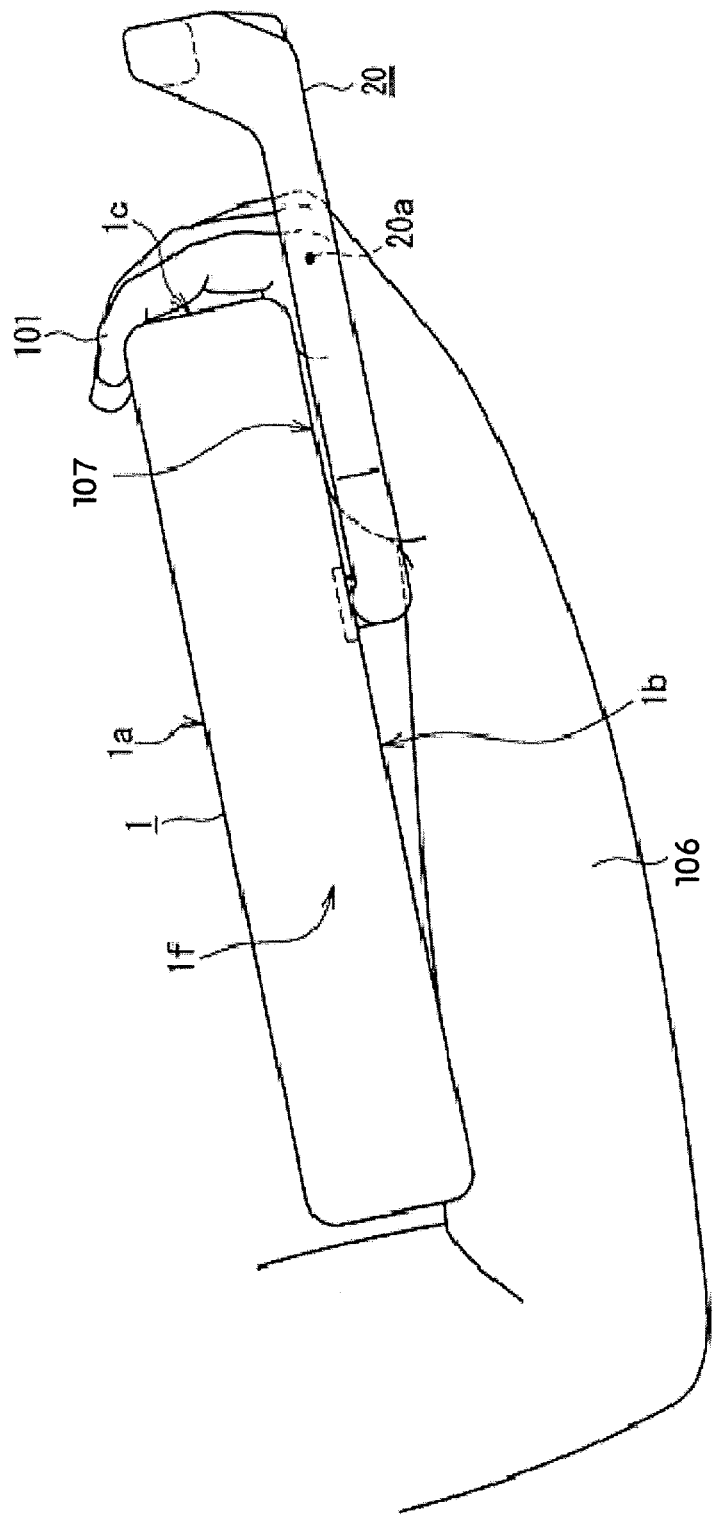
FIG. 18 is a side view showing a state where a user holds the handle member.

FIG. 17 is a perspective view showing a state where the user supports the computer apparatus 1 with a hand 101 and operates the computer apparatus 1. FIG. 18 is a side view showing the state where the user supports the computer apparatus 1 as shown in FIG. 17.

When the user supports the computer apparatus 1 with one hand and operates the computer apparatus 1, the user initially displaces the handle member 20 to the first rotation position (a position where the holding section 21 is close to the top surface 1c of the computer apparatus 1). The handle member 20 shown in FIGS. 17 and 18 is at the first position as an example.

Next, as shown in FIG. 17, the user places the computer apparatus 1, for example, on the left arm, and causes the stylus pen 51, held with the right hand, to touch an arbitrary position on the display panel 2. Specifically, as shown in FIG. 18, the user inserts fingers of the hand 101 through the void 20a between the handle member 20 and the computer apparatus 1 and causes the fingers to come into contact with the top surface 1c and the front surface 1a of the computer apparatus 1. In addition, the user places the computer apparatus 1 on an arm 106 and a palm 107.

By so doing, the user can hold the computer apparatus 1 with one hand (the left hand in FIGS. 17 and 18).

In the use mode shown in FIGS. 17 and 18, the handle member 20 is displaced to the first position. However, when a hand or an arm can be inserted through the void 20a, the computer apparatus 1 can be held with one hand even in a state where the handle member 20 is at another rotation angle.

In the used state shown in FIG. 18, in the case where a hand (the left hand in FIG. 18) of the user is long or the like, the holding section 21 (see FIG. 12A) may be held with the left hand. With this configuration as well, the handle member 20 is kept in a stationary state with respect to the computer apparatus 1, and thus, for example, the operability with the stylus pen 51 on the touch panel as shown in FIG. 17 is not deteriorated.

According to the present embodiment, since the handle member 20 having handle functionality and stand functionality is provided, the number of parts can be reduced as compared to the case where a handle member and a stand member are provided as separate parts. Thus the cost of molds at manufacture can be reduced, and the cost for management of parts can be reduced.

According to the present embodiment, since the handle member 20 is fixed to the computer apparatus 1 via the hinge mechanisms 22a and 23a, the handle member 20 can be kept stationary at an arbitrary rotation angle.

According to the present embodiment, since the center of gravity P1 of the computer apparatus 1 and the axis P2 of the holding section 21 of the handle member 20 are caused to be located substantially on the line parallel to the front surface 1a, when the handle member 20 is displaced to the first position and held, for example, the front surface 1a of the computer apparatus 1 is substantially parallel to the vertical direction, and thus the computer apparatus 1 can be carried in a stable attitude.

According to the present embodiment, since at least the holding section 21 of the handle member 20 is disposed so as to be exposed on the back surface 1b of the computer apparatus 1, for example, when the handle member 20 is present at the second position shown in FIG. 14 or the second rotation position shown in FIG. 15, if the computer apparatus 1 is accidentally dropped on a floor or the like, there is a high possibility that the holding section 21 and/or the handle member 20 will come into contact with the dropped location. Thus, a shock transmitted to the computer apparatus 1 can be reduced. Therefore, the possibility that the computer apparatus 1 will break can be reduced. Particularly, in the case of a configuration in which the entirety of the handle member 20 is exposed on the back surface 1b of the computer apparatus 1, when the computer apparatus 1 is dropped on a floor or the like from a state where the user holds the computer apparatus 1 as shown in FIG. 17, there is a high possibility that the computer apparatus 1 will drop in an attitude in which the back surface 1b faces vertically downward. Since the handle member 20 is disposed on the back surface 1b of the computer apparatus 1, there is a high possibility that the handle member 20 will collide with the floor or the like earlier than the computer apparatus 1. Therefore, the handle member 20 absorbs a shock transmitted to the computer apparatus 1, and the possibility that the computer apparatus 1 will break can be reduced.

According to the present embodiment, since the handle member 20 includes the first foot portion 24 and the second foot portion 25, when the handle member 20 is in a standing mode, the handle member 20 is unlikely to slide on a placement surface, and thus the attitude (angle) of the computer apparatus 1 is stabilized.

According to the present embodiment, since the angle A1 between the holding section 21 and the first leg portion 26a and the angle A2 between the holding section 21 and the second leg portion 26b are set so as to be equal to or higher than 90 degrees as shown in FIG. 12A and the length L21 of the holding section 21 and the interval L22 between the support shafts 22d and 23d are set so as to have the dimensional relation of "L21<L22", shape stability by increasing the rigidity of the handle member 20 (particularly, the holding section 21) and attitude stability when the computer apparatus 1 is supported with the handle member 20 and placed on a placement surface can be improved. In addition, when the user holds the holding section 21 and carries the computer apparatus 1, the carrying stability of the computer apparatus 1 can also be enhanced.

In the present embodiment, in order to cause the center of gravity P1 of the computer apparatus 1 and the axis P2 of the holding section 21 to be located substantially on the line parallel to the front surface 1a, the axis P2 of the holding section 21 is shifted with respect to the rotation axes of the hinge mechanisms 22a and 23a. When the center of gravity P1 of the computer apparatus 1 is present closer to the back surface 1b, the center of gravity P1 of the computer apparatus 1 and the axis P2 of the holding section 21 may be able to be caused to be located substantially on the line parallel to the front surface 1a without shifting the axis P2 of the holding section 21 with respect to the rotation axes of the hinge mechanisms 22a and 23a.

In the present embodiment, the handle member 20 includes the first foot portion 24 and the second foot portion 25. However, these foot portions are not essential. For example, when the holding section 21 or ends of the first leg portion 26a and the second leg portion 26b are formed from an elastic material, the foot portions can be omitted.

2. Configuration of Extension Device

Figure 19A:
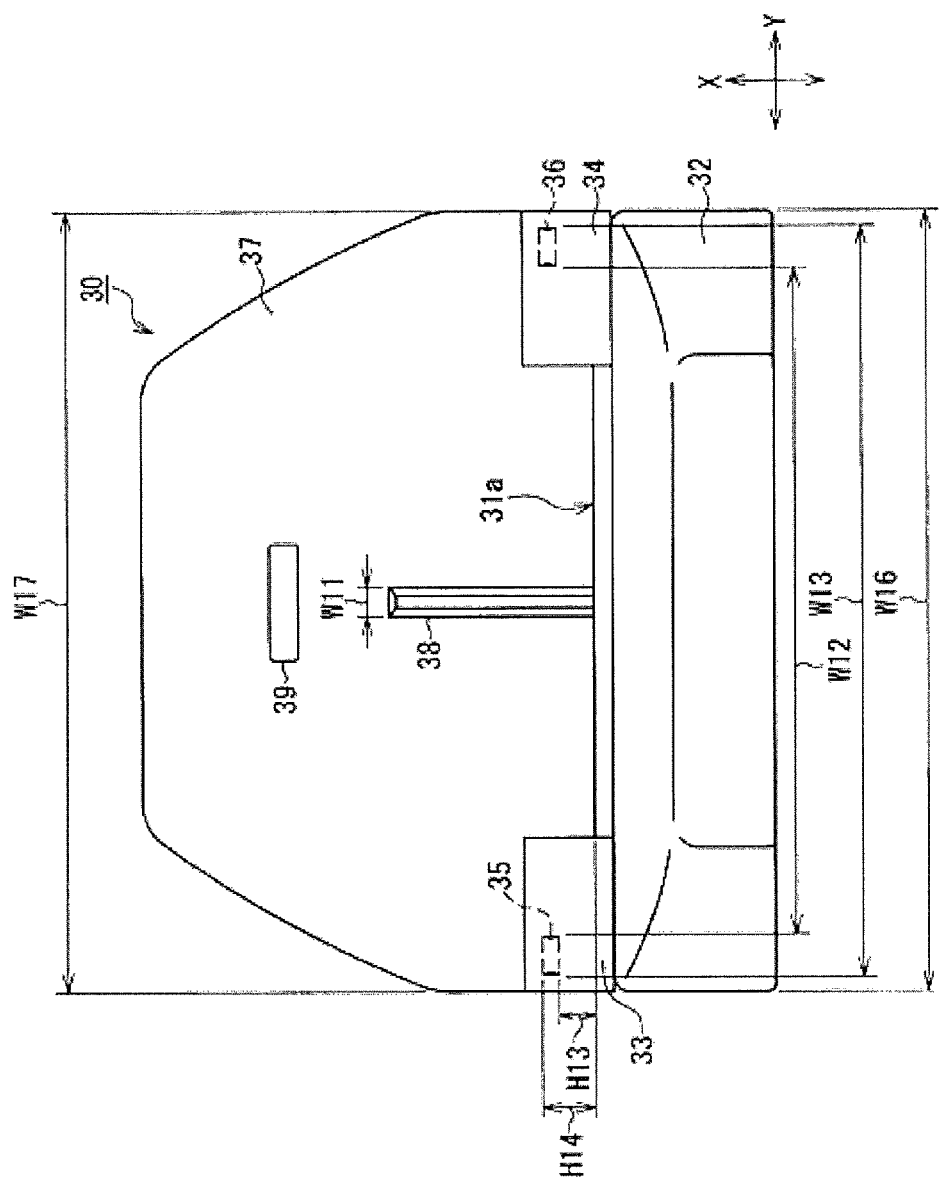
FIG. 19A is a front view of an extension device according to the embodiment.
Figure 19B:
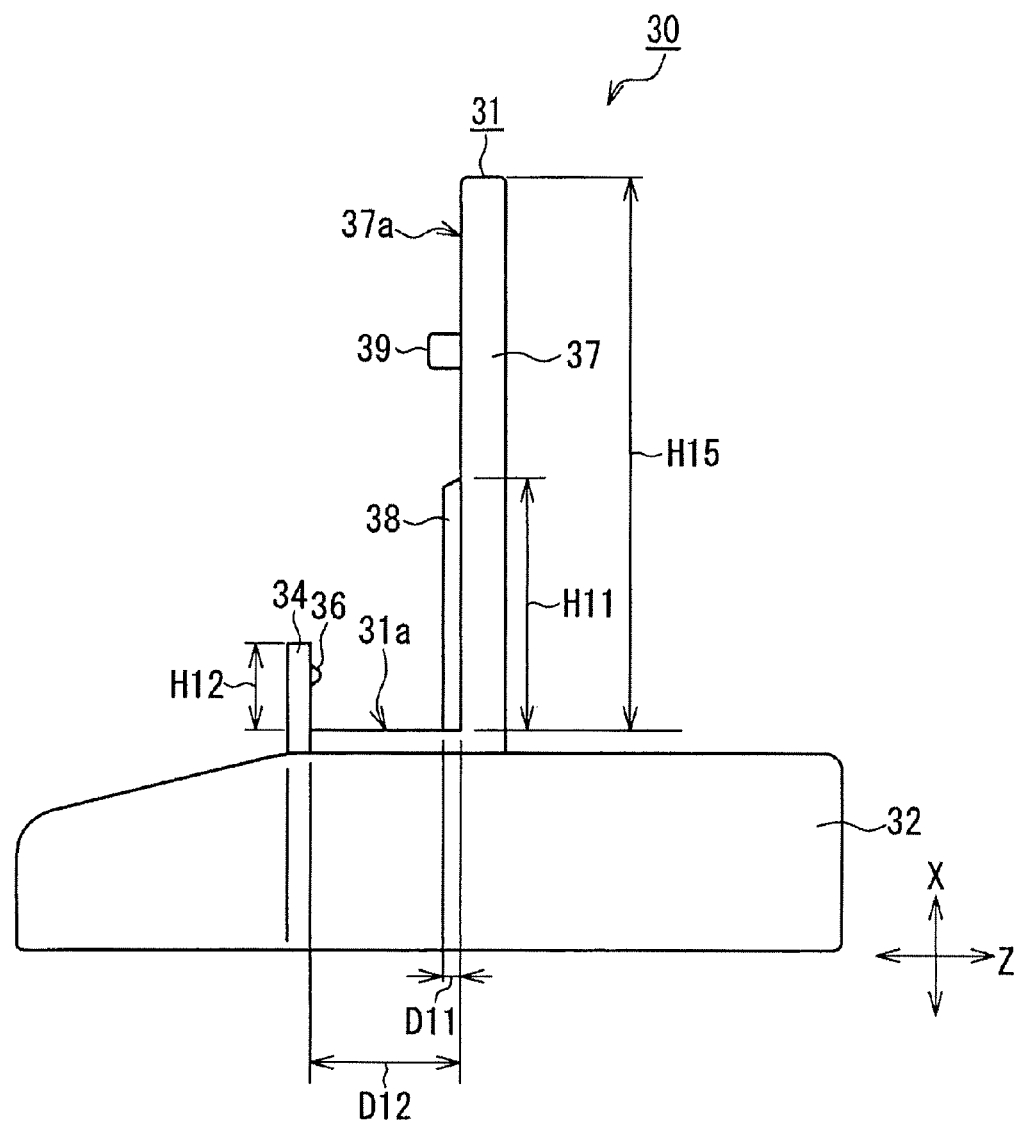
FIG. 19B is a side view of the extension device according to the embodiment.
Figure 19C:
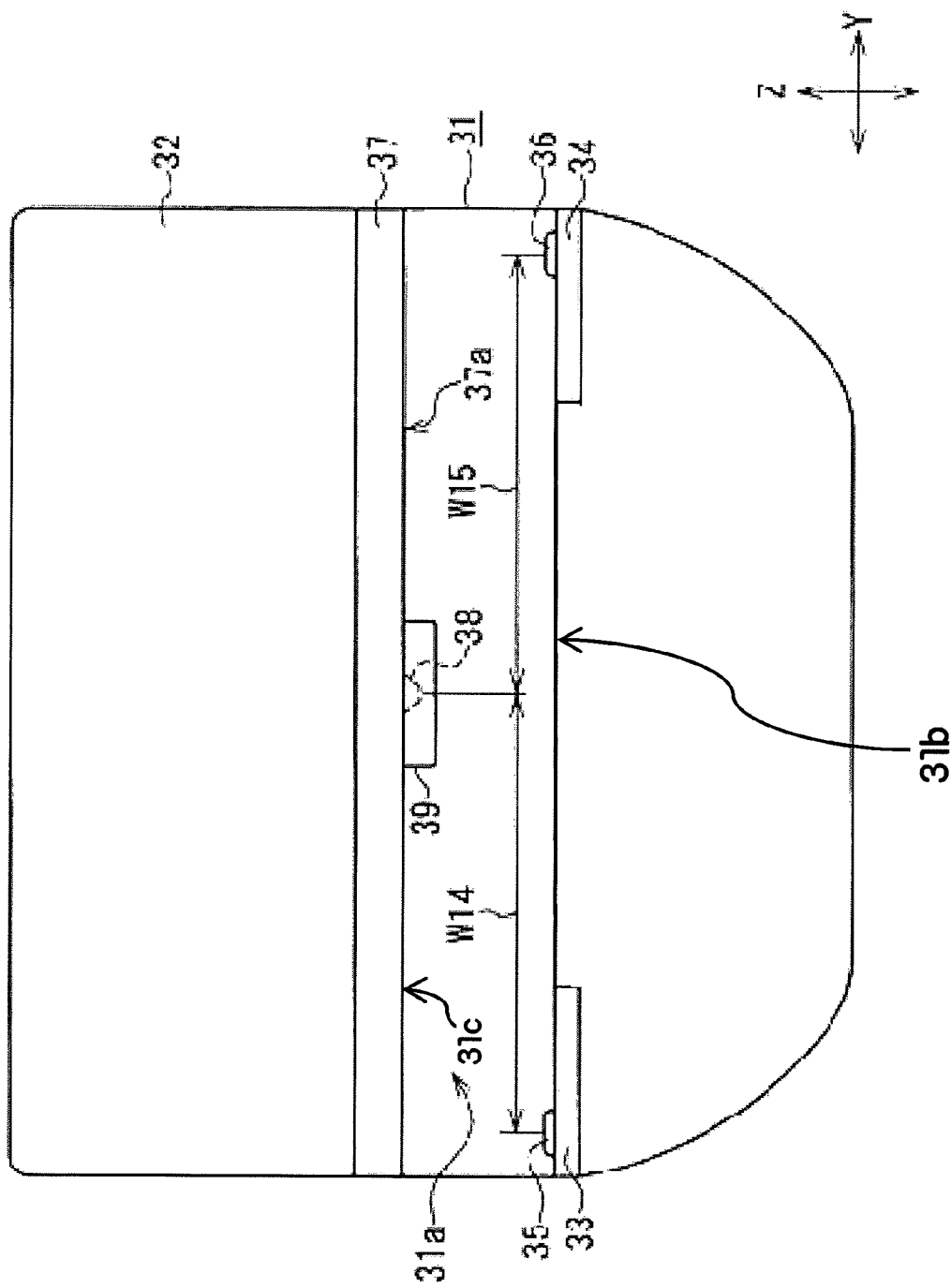
FIG. 19C is a plan view of the extension device according to the embodiment.

FIG. 19A is a front view of the extension device according to the present embodiment. FIG. 19B is a side view of the extension device according to the present embodiment. FIG. 19C is a plan view of the extension device according to the present embodiment, as seen from above.

For example, the computer apparatus 1 shown in FIGS. 1A to 1C can be mounted on the extension device 30. When the computer apparatus 1 is mounted on the extension device 30, the extension device 30 can perform information communication between the mounted computer apparatus 1 and another device and can supply power to the computer apparatus 1. The extension device 30 includes various interfaces through which information communication is possible with an external device, and a power supply terminal connectable to a commercial power supply. The extension device 30 includes a body retaining portion 31, a base 32, a first wall portion 33, a second wall portion 34, a first positioning projection 35, a second positioning projection 36, a back surface wall portion 37, a guide projection 38, and the connector 39.

The body retaining portion 31 is a member that can retain the computer apparatus 1. The body retaining portion 11 in the present embodiment is a member independent of the base 32 and fixed to the base 32 by means of screws or the like. It should be noted that the body retaining portion 31 may be formed so as to be integrated with the base 32. In addition, the body retaining portion 31 is formed so as to be integrated with the back surface wall portion 37 as shown in FIG. 19B. However, this is an example, the body retaining portion 31 can include only a placement surface 31a (described later), and the back surface wall portion 37 can be formed as a separate member. In the present embodiment, the body retaining portion 31 has a configuration in which a metallic frame is included in order to increase rigidity and a resin housing is joined to the outside of the frame in order to prevent scars or the like from being made on the computer apparatus 1. It should be noted that the entirety of the body retaining portion 31 may be formed from resin or metal, and the material thereof is not limited. The body retaining portion 31 includes the placement surface 31a with which the bottom surface 1d of the computer apparatus 1 is in contact when the computer apparatus 1 is mounted thereon. In view of stabilization of the attitude of the computer apparatus 1, the placement surface 31a preferably has a surface shape having a surface corresponding to the outer shape of the bottom surface 1d (see FIG. 1C etc.), and is a flat surface in the present embodiment. As shown in FIG. 19C, the placement surface 31a is formed such that a planar shape thereof is rectangular. The placement surface 31a has a pair of long sides one of which is a long side 31b which the first wall portion 33 and the second wall portion 34 are provided in a standing manner adjacently to (namely, a line of intersection of the first wall portion 33 and the second wall portion 34 and the placement surface 31a is the long side 31b). The back surface wall portion 37 is provided in a standing manner adjacently to a long side 31c that is the other long side of the pair of long sides of the placement surface 31a (namely, a line of intersection of the back surface wall portion 37 and the placement surface 31a is the other long side 31c). No components corresponding to wall portions are formed adjacently to a pair of short sides of the placement surface 31a. In other words, in the body retaining portion 31, both edges of the placement surface 31a in the longitudinal direction are opened, and the placement surface 31a is sandwiched between the first wall portion 33 and the second wall portion 34 and the back surface wall portion 37 which face each other.

The base 32 retains the body retaining portion 31. The base 32 has a large contact area in order to stabilize the attitude of the extension device 30 in a state where the computer apparatus 1 is mounted on the body retaining portion 31. The base 32 preferably has a high weight in order to stabilize the attitude of the extension device 30 in a state where the computer apparatus 1 is mounted on the body retaining portion 31. In order to enable communication with an external device, the base 32 includes a terminal to which various interface cables are connectable, an optical disc drive, and the like, but illustration thereof is omitted.

As shown in FIG. 19C, the first wall portion 33 and the second wall portion 34 are provided in a standing manner at positions along the long side 31b of the placement surface 31a and in a direction substantially orthogonal to the placement surface 31a. As shown in FIG. 19B, the first wall portion 33 and the second wall portion 34 face the back surface wall portion 37 across a void of a dimension D12. It should be noted that the first wall portion 33 and the second wall portion 34 are formed so as to be spaced apart from each other as shown in FIG. 19A, but may be continuously and integrally formed along the long side 31b of the placement surface 31a.

As shown in FIGS. 19B and 19C, the first positioning projection 35 is formed on a surface of the first wall portion 33 which faces the back surface wall portion 37 (namely, on an end surface of the body retaining portion 31 which is determined by the base 32 and the long side 31b). The first positioning projection 35 is formed at a position where the first positioning projection 35 is engageable with the first positioning recess 3 (see FIG. 1A) of the computer apparatus 1. The second positioning projection 36 is formed on a surface of the second wall portion 34 which faces the back surface wall portion 37 (namely, on an end surface of the body retaining portion 31 which is determined by the base 32 and the long side 31b). The second positioning projection 36 is formed at a position where the second positioning projection 36 is engageable with the second positioning recess 4 (see FIG. 1A) of the computer apparatus 1. When the computer apparatus 1 is placed at a predetermined position in the body retaining portion 31, the first positioning projection 35 engages the first positioning recess 3, and the second positioning projection 36 engages the second positioning recess 4.

As shown in FIGS. 19B and 19C, the back surface wall portion 37 is provided in a standing manner at a position along the other long side 31c of the placement surface 31a and in the direction substantially orthogonal to the placement surface 31a. As shown in FIG. 19B, the back surface wall portion 37 faces the first wall portion 33 and the second wall portion 34 across the void of the dimension D12. The back surface wall portion 37 is formed so as to have a height dimension H15 at least equal to or greater than the height dimension H11 of the guide projection 38. When the height of the back surface wall portion 37 is decreased, the height of the body retaining portion 31 can be decreased, and thus the height of the extension device 30 can be decreased. On the other hand, when the height of the back surface wall portion 37 is increased, the back surface 1b of the computer apparatus 1 mounted on the body retaining portion 31 can assuredly be supported, and thus the attitude of the computer apparatus 1 can be stabilized. It should be noted that in the body retaining portion 31 of the present embodiment, the back surface wall portion 37 is formed so as to be integrated with the placement surface 31a as shown in FIG. 19B, but the back surface wall portion 37 and the placement surface 31a can be formed as separate members. In addition, in a configuration in which the placement surface 31a and the back surface wall portion 37 are formed as separate members, the placement surface 31a can also be formed as a surface of the base 32.

The guide projection 38 is formed on a wall surface 37a of the back surface wall portion 37 so as to project therefrom. The guide projection 38 is formed in a rectangular-columnar shape. The guide projection 38 is formed such that a planar shape thereof is a rectangular shape in which long sides are much longer than short sides, as shown in FIG. 19A. One of the short sides is located at the boundary between the placement surface 31a and the wall surface 37a. The guide projection 38 is formed so as to have a height dimension H11 (see FIG. 19B) equal to or less than the height dimension H1 (see FIG. 1B) of the guide recess 5 of the computer apparatus 1. It should be noted that the guide projection 38 is formed so as to have a width dimension W11 (see FIG. 19A) equal to or less than the width dimension W1 (see FIG. 1B) of the guide recess 5 of the computer apparatus 1 in order that the guide projection 38 does not shift in a Y direction when the computer apparatus 1 is mounted.

The connector 39 is disposed on the wall surface 37a of the back surface wall portion 37. When the computer apparatus 1 is mounted at a predetermined position in the body retaining portion 31, the connector 39 is electrically connected to the connector 6 (see FIG. 1B) provided in the computer apparatus 1.

The dimensional relation between each component of the computer apparatus 1 and each component of the extension device 30 is as follows.

| | |
|---|---|
| $H1 \geq H11$ | relational expression (11) |
| $W1 \geq W11$ | relational expression (12) |
| $W3 \leq W12$ | relational expression (13) |
| $W13 \leq W2$ | relational expression (14) |
| $H2 \leq H13$ | relational expression (15) |
| $H14 \leq H3$ | relational expression (16) |
| $D2 < D12$ | relational expression (17) |
| $W4 = W14$ | relational expression (18) |
| $W5 = W15$ | relational expression (19) |

The dimension H1 is the height dimension of the guide recess 5 from the placement surface 31a (see FIG. 1B).

The dimension H2 is the height dimension from the bottom surface 1d of the computer apparatus 1 to the lower edges (edges closest to the bottom surface 1d of the computer apparatus 1) of the first positioning recess 3 and the second positioning recess 4 (see FIG. 1A).

The dimension H3 is the height dimension from the bottom surface 1d of the computer apparatus 1 to the upper edges (edges closest to the top surface 1c of the computer apparatus 1) of the first positioning recess 3 and the second positioning recess 4 (see FIG. 1A).

The dimension W1 is the standing-provision width dimension of the guide recess 5 in the back surface 1b of the computer apparatus 1 (see FIG. 1B).

The dimension W2 is the width dimension of the longest gap (outside-dimension gap) between the first positioning recess 3 and the second positioning recess 4 (see FIG. 1A).

The dimension W3 is the width dimension of the shortest gap (inside-dimension gap) between the first positioning recess 3 and the second positioning recess 4 (see FIG. 1A).

The dimension W4 is the distance from a center line of the first positioning recess 3 to a center line of the guide recess 5 (see FIG. 1B).

The dimension W5 is the distance from a center line of the second positioning recess 4 to the center line of the guide recess 5 (see FIG. 1B).

The dimension D2 is the thickness dimension of the computer apparatus 1 (see FIG. 1C).

The dimension H11 is the height dimension of the guide projection 38 (see FIG. 19B).

The dimension H13 is the height dimension from the placement surface 31a to the lower edges (edges closest to the placement surface 31a) of the first positioning projection 35 and the second positioning projection 36 (see FIG. 19A).

The dimension H14 is the height dimension from the placement surface 31a to the upper edges (edges farthest from the placement surface 31a) of the first positioning projection 35 and the second positioning projection 36 (see FIG. 19A).

The dimension W11 is the standing-provision width dimension of the guide projection 38 in the placement surface 31a (see FIG. 19A).

The dimension W12 is the width dimension of the shortest gap (inside-dimension gap) between the first positioning projection 35 and the second positioning projection 36 (see FIG. 19A).

The dimension W13 is the width dimension of the longest gap (outside-dimension gap) between the first positioning projection 35 and the second positioning projection 36 (see FIG. 19A).

The dimension W14 is the distance from a center line of the first positioning projection 35 to a center line of the guide projection 38 (see FIG. 19C).

The dimension W15 is the distance from a center line of the second positioning projection 36 to the center line of the guide projection 38 (see FIG. 19C).

The dimension D12 is the facing gap dimension between the first positioning projection 35 and the second positioning projection 36 and the back surface wall portion 37.

It should be noted that the "longest gap dimension" is the gap dimension between the portions of two members which are farthest from each other. The "shortest gap dimension" is the gap dimension between the portions of two members which are closest to each other. In addition, the "center line" is the center in the width direction connecting the left side surface 1e and the right side surface if in the computer apparatus 1, and is the center in the direction of the line of intersection of the back surface wall portion 37 and the placement surface 31a in the extension device 30.

3. Mounting/Dismounting Operations Between Extension Device and Computer Apparatus

[3-1. Mounting/Dismounting Operations Between Extension Device and Only Computer Apparatus]

Figure 20:
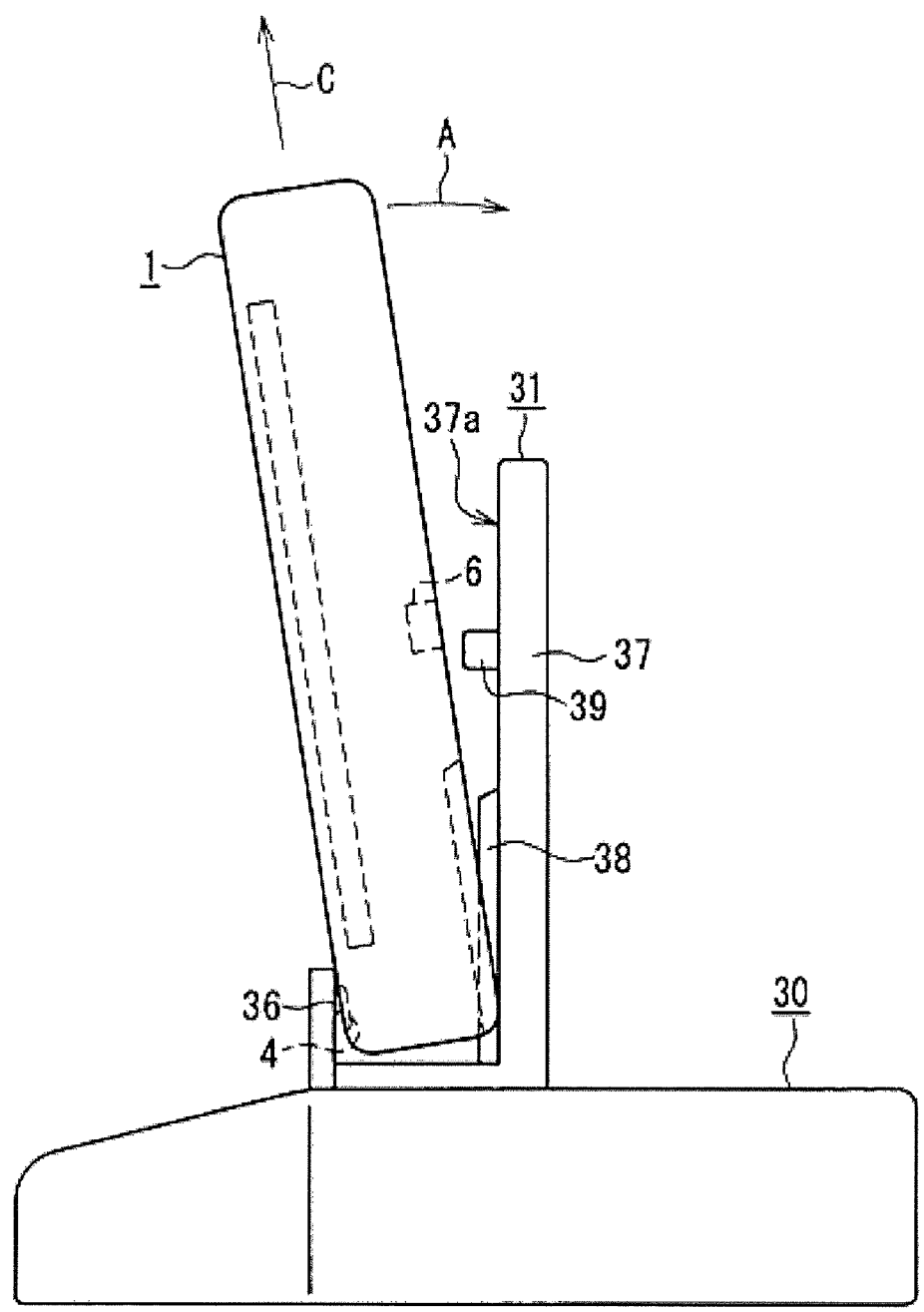
FIG. 20 is a side view showing a state when mounting the main device on the extension device.

When the computer apparatus 1 is mounted on the extension device 30, the computer apparatus 1 is initially mounted on the body retaining portion 31 in such an attitude that the bottom surface 1d faces the placement surface 31a and the back surface 1b faces the wall surface 37a of the back surface wall portion 37, as shown in FIG. 20.

Specifically, first, as shown in FIG. 20, the computer apparatus 1 is inserted between the first wall portion 33 and the second wall portion 34 and the back surface wall portion 37 such that at least a portion of the computer apparatus 1 is in a tilted attitude. Since the relation between the thickness D2 of the computer apparatus 1 and the gap dimension D12 between the first wall portion 33 and the second wall portion 34 and the back surface wall portion 37 is the dimensional relation shown in the above relational expression (17), when at least the portion of the computer apparatus 1 is tilted (tilted in the direction to the first wall portion 33 and the second wall portion 34 in FIG. 20), the computer apparatus 1 can be inserted between the first wall portion 33 and the second wall portion 34 and the back surface wall portion 37. In other words, the height dimension H12 (see FIG. 19B) of the first wall portion 33 and the second wall portion 34 from the placement surface 31a is set so as to be less than the maximum height dimension H15 (see FIG. 19B) of the back surface wall portion 37 from the placement surface 31a. Due to such a configuration, in a state where the first wall portion 33 and the second wall portion 34 are located on the lower side and the third guide projection 38 is tilted on the upper side, an operation of mounting the computer apparatus 1 to the extension device 30 can be started. Thus, the user can start the mounting operation while confirming that the guide projection 38 provided in the extension device 30 slides and engages the guide recess 5 provided in the computer apparatus 1.

Next, the first positioning projection 35 of the extension device 30 is caused to engage the first positioning recess 3 of the computer apparatus 1, and the second positioning projection 36 of the extension device 30 is caused to engage the second positioning recess 4 of the computer apparatus 1. At that time, the first positioning recess 3 and the first positioning projection 35 and the second positioning recess 4 and the second positioning projection 36 can be caused to engage each other, since they have the dimensional relations shown in the above relational expressions (13), (14), (15), and (16). In other words, the guide recess 5 in the computer apparatus 1 is located so as to intersect the boundary between the bottom surface 1d and the back surface 1b, and the height dimension H14 (see FIG. 19A) of the first positioning projection 35 and the second positioning projection 36 in the extension device 30 from the placement surface 31a is set so as to be less than the height dimension H11 (see FIGS. 19A and 19B) of the third guide projection 38 from the placement surface 31a. Due to such a configuration, the user can reduce occurrence of lateral shift of the guide projection 38 of the extension device 30 and the guide recess 5 of the computer apparatus 1 in a state where the computer apparatus 1 is tilted relative to the extension device 30. Thus, the user can stably mount the computer apparatus 1 on the extension device 30 due to assured engagement of the first positioning projection 35 and the first positioning recess 3 and assured engagement of the second positioning projection 36 and the second positioning recess 4.

At that time, since the first positioning projection 35, the second positioning projection 36, the first positioning recess 3, and the second positioning recess 4 have the positional relations shown in the above relational expressions (13) to (16), engagement between the first positioning projection 35 and the first positioning recess 3 and engagement between the second positioning projection 36 and the second positioning recess 4 can be performed at the same time.

By causing the first positioning projection 35 to engage the first positioning recess 3 and causing the second positioning projection 36 to engage the second positioning recess 4, the computer apparatus 1 is positioned in the Y-axis direction (see FIG. 1A). In addition, the guide projection 38 engages the guide recess 5 on the basis of the above relational expressions (11), (12), (18), and (19).

It should be noted that the relation between the depth dimension D1 of the guide recess 5 of the computer apparatus 1 and the height dimension D11 of the guide projection 38 of the extension device 30 may be any relation as long as the above relational expressions (11), (12), and (17) are met. However, D1 and D11 are preferably equal to each other for decreasing the thickness of the computer apparatus 1 and reducing the size of the extension device 30.

Next, the computer apparatus 1 is displaced in a direction indicated by an arrow A while the engagement state between the first positioning projection 35 and the first positioning recess 3 and the engagement state between the second positioning projection 36 and the second positioning recess 4 are kept. At that time, the computer apparatus 1 rotates in the direction indicated by the arrow A about the engagement portion between the first positioning projection 35 and the first positioning recess 3 and the engagement portion between the second positioning projection 36 and the second positioning recess 4. In addition, when the computer apparatus 1 is displaced in the direction indicated by the arrow A, the guide recess 5 is guided along the guide projection 38. Thus, the computer apparatus 1 is displaced in the direction indicated by the arrow A while the position thereof in the Y-axis direction is restricted. It should be noted that when the computer apparatus 1 is rotationally displaced in the arrow A direction, if the first wall portion 33 and the front surface 1a are in contact with each other and the second wall portion 34 and the front surface 1a are in contact with each other, the computer apparatus 1 is displaced about the contact portions. In other words, when the computer apparatus 1 is mounted on the extension device 30, the first positioning projection 35 and the second positioning projection 36 suppress their shift from the first positioning recess 3 and the second positioning recess 4 in the lateral direction.

By displacing the computer apparatus 1 in the direction indicated by the arrow A until the bottom surface 1d of the computer apparatus 1 comes into surface contact with the placement surface 31a of the body retaining portion 31, the computer apparatus 1 is positioned with respect to the body retaining portion 31. At that time, the first positioning projection 35, the second positioning projection 36, the first positioning recess 3, and the second positioning recess 4 keep the engagement states therebetween, since they have the positional relations shown in the above relational expressions (15) and (16).

Figure 21A:
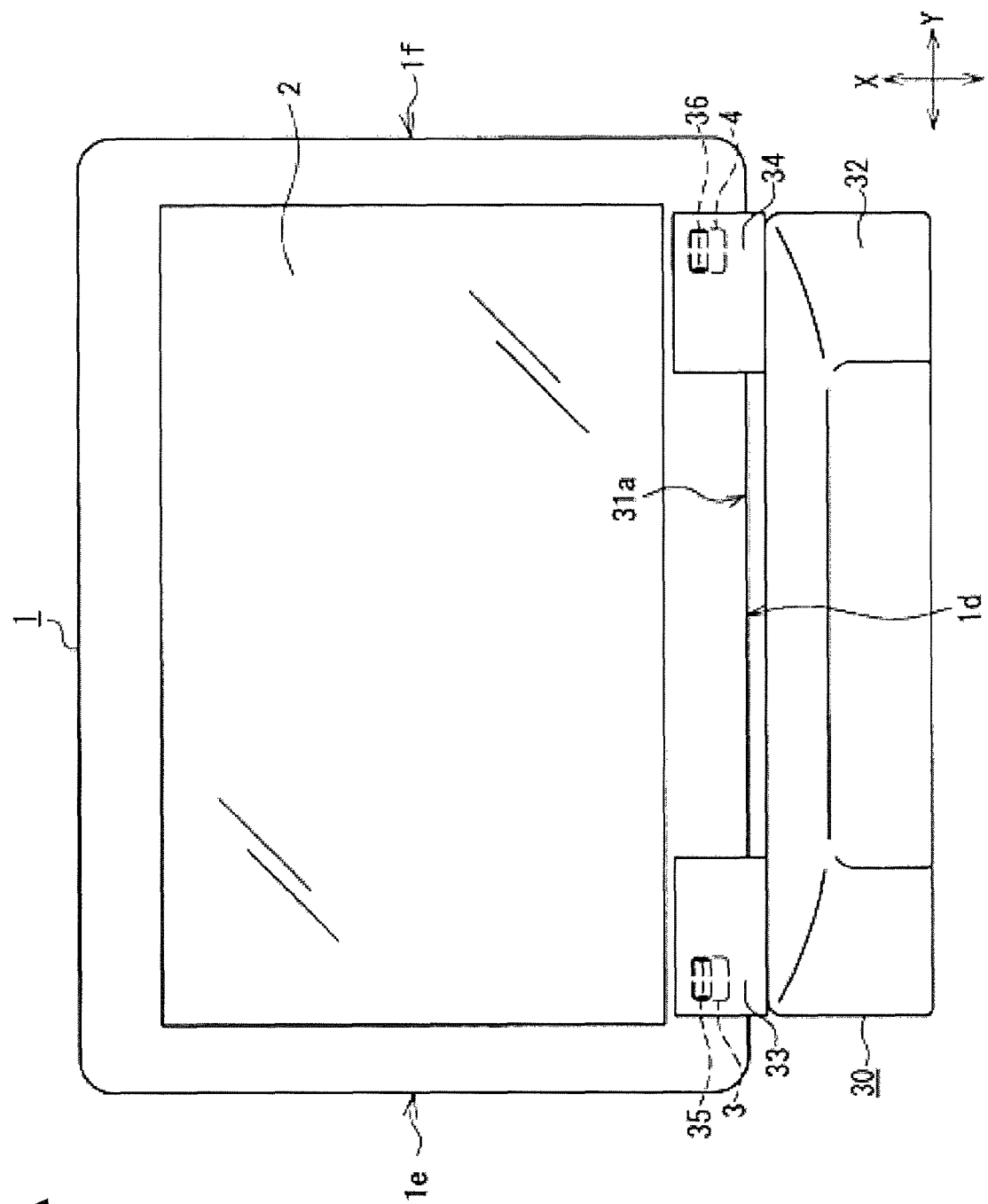
FIG. 21A is a front view showing a state where the main device is mounted on the extension device.
Figure 21B:
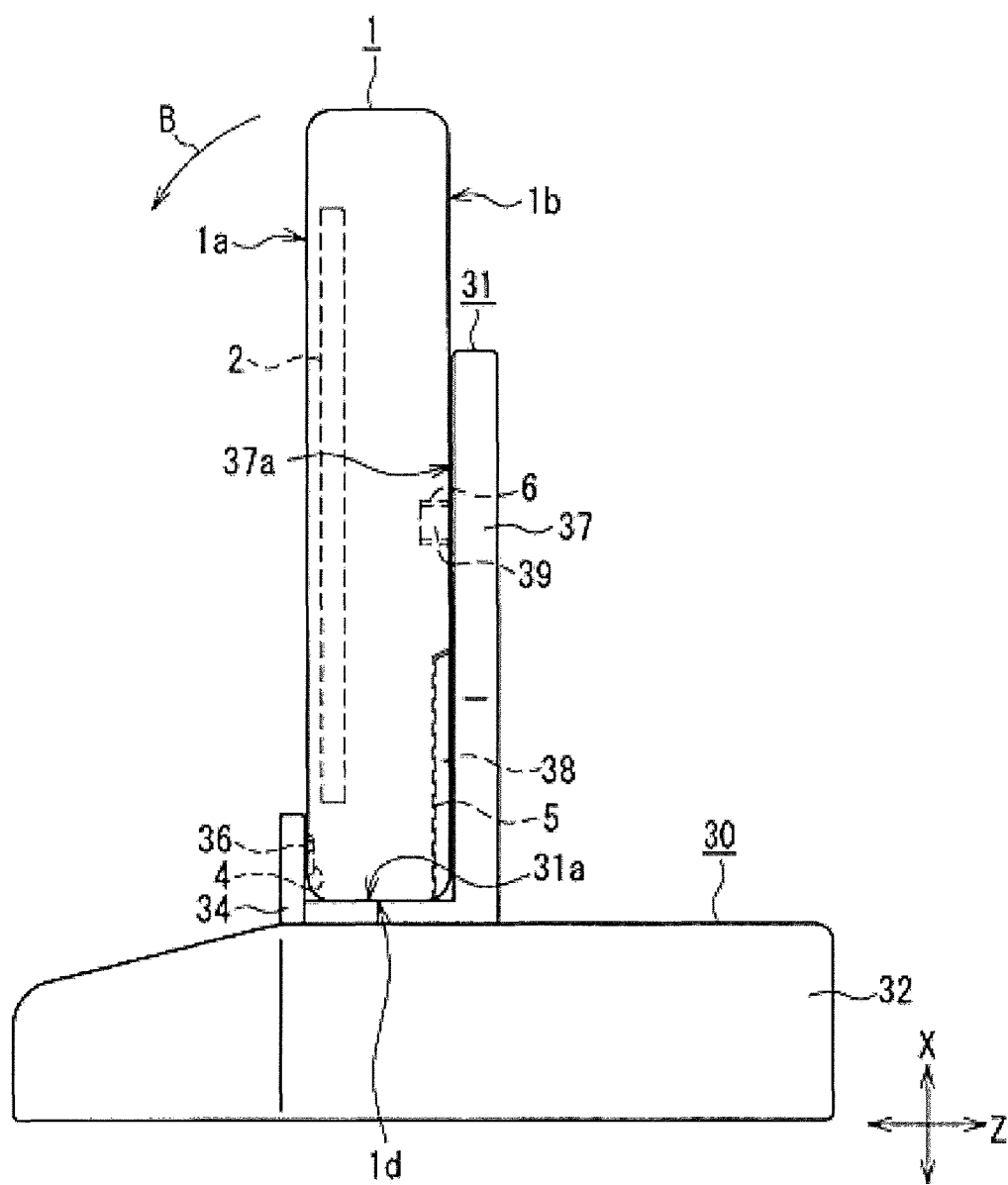
FIG. 21B is a side view showing the state where the main device is mounted on the extension device.
Figure 21C:
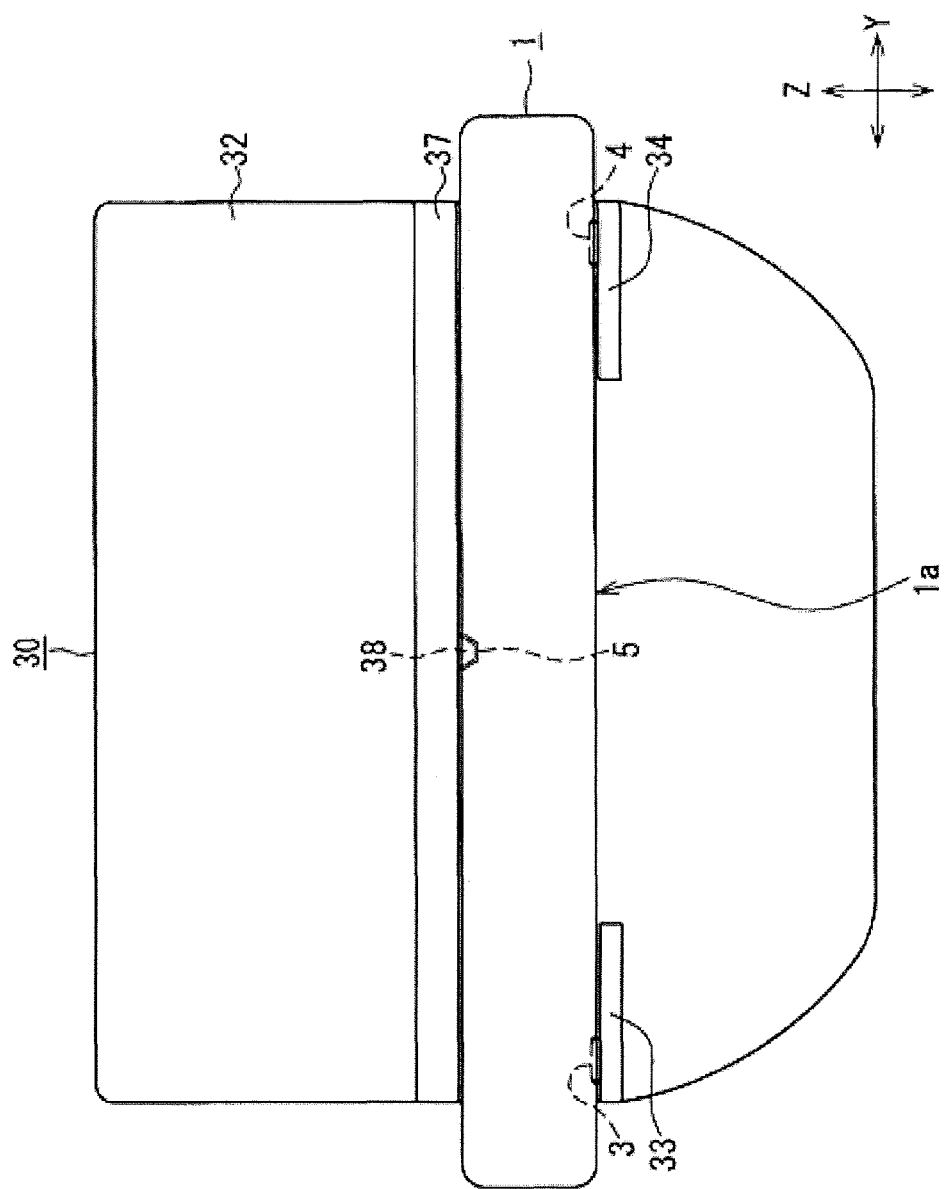
FIG. 21C is a plan view showing the state where the main device is mounted on the extension device.

FIG. 21A is a front view of the extension device 30 on which the computer apparatus 1 is mounted. FIG. 21B is a side view of the extension device 30 on which the computer apparatus 1 is mounted. FIG. 21C is a plan view of the extension device 30 on which the computer apparatus 1 is mounted, as seen from above. As shown in FIGS. 21A to 21C, when the computer apparatus 1 is mounted on the extension device 30, the connector 6 is electrically connected to the connector 39 provided in the extension device 30, and thus the computer apparatus 1 is electrically connected to the extension device 30.

In addition, the distance from the bottom surface 1d to the display panel 2 in the computer apparatus 1 is set so as to be larger than the distances from the placement surface 31a to the first wall portion 33 and the second wall portion 34 in the extension device 30. Thus, when the computer apparatus 1 is mounted on the extension device 30, the display panel 2 is not covered with the extension device 30, and the entirety of the display surface of the display panel 2 is exposed. Therefore, the user can view a video image displayed on the display panel 2, and when a touch panel is provided in the display panel 2. In addition, when a touch panel is provided in the display panel 2, the user can perform an operation of touching an arbitrary location on the touch panel.

As shown in FIGS. 21A to 21C, in a state where the computer apparatus 1 is mounted on the extension device 30, the front surface 1a side of the computer apparatus 1 is positioned by the first positioning projection 35 and the second positioning projection 36, and the back surface 1b side of the computer apparatus 1 is positioned by the guide projection 38, whereby the position of the computer apparatus 1 in the Y-axis direction is restricted. In addition, in a state where the computer apparatus 1 is mounted on the extension device 30, the computer apparatus 1 is disposed in the gap between the first wall portion 33 and the second wall portion 34 and the back surface wall portion 37, whereby the position of the computer apparatus 1 in a Z-axis direction is restricted. Further, in a state where the computer apparatus 1 is mounted on the extension device 30, the bottom surface 1d is in contact with the placement surface 31a of the body retaining portion 31, whereby the position of the computer apparatus 1 in the downward direction of an X-axis direction is restricted. Since these relations are met, the connector 6 of the computer apparatus 1 and the connector 39 of the extension device 30 can be connected to each other.

It should be noted that in the mounted state shown in FIGS. 21A to 21C, the front surface 1a of the computer apparatus 1 and the first wall portion 33 and the second wall portion 34 may be in contact with each other or may be spaced apart from each other across a slight gap. In addition, the back surface 1b of the computer apparatus 1 and the back surface wall portion 37 may be in contact with each other or may be spaced apart from each other across a slight gap.

In addition, since both edges of the placement surface 31a in the longitudinal direction are opened, even when the width dimension W6 (see FIG. 1A) of the computer apparatus 1 is larger than the width dimension W16 (see FIG. 19A) of the placement surface 31a in the longitudinal direction, the computer apparatus 1 can be retained by the body retaining portion 31. In other words, as shown in FIGS. 21A and 21C, the body retaining portion 31 can retain the computer apparatus 1 in a state where the side surface 1e side and the side surface 1f side of the computer apparatus 1 protrude from the body retaining portion 31. Thus, when the relational expressions (11) to (19) are met, the body retaining portion 31 can retain the computer apparatus 1 regardless of the width dimension W6 of the computer apparatus 1.

When the computer apparatus 1 is dismounted from the extension device 30, the computer apparatus 1 is displaced in a direction indicated by an arrow B. At that time, the first wall portion 33 and the second wall portion 34 are formed so as to have a height H12 (see FIG. 19B) much shorter than the length of the back surface wall portion 37, the first positioning projection 35 is engaged with the first positioning recess 3, and the second positioning projection 36 is engaged with the second positioning recess 4. Thus, the computer apparatus 1 can be rotated in the direction indicated by the arrow B about the engagement portion between the first positioning projection 35 and the first positioning recess 3 and the engagement portion between the second positioning projection 36 and the second positioning recess 4.

When the computer apparatus 1 is displaced to a position where the bottom surface 1d is separated from the placement surface 31a of the body retaining portion 31, it becomes a state shown in FIG. 20. By displacing the computer apparatus 1 from the state shown in FIG. 20 in a direction indicated by an arrow C, the first positioning projection 35 is disengaged from the first positioning recess 3, the second positioning projection 36 is disengaged from the second positioning recess 4, and the guide projection 38 is disengaged from the guide recess 5. Thus, the computer apparatus 1 is dismounted from the body retaining portion 31.

In the above description, the operations of mounting and dismounting the only computer apparatus 1 to and from the extension device 30 have been described. However, the computer apparatus 1 including the holding member 10 as shown in FIG. 2A and the like or the computer apparatus 1 including the handle member 20 as shown in FIG. 11 and the like can also be mounted onto and dismounted from the extension device 30. Operations of mounting and dismounting the computer apparatus 1 including the holding member 10 to and from the extension device 30 and operations of mounting and dismounting the computer apparatus 1 including the handle member 20 to and from the extension device 30 are the same as the operations of mounting and dismounting the only computer apparatus 1 to and from the extension device 30. Hereinafter, a state where the computer apparatus 1 including the holding member 10 is mounted on the extension device 30 and a state where the computer apparatus 1 including the handle member 20 is mounted on the extension device 30 will be described.

[3-2. Mounting/Dismounting Operations Between Extension Device and Computer Apparatus Including Holding Member]

Figure 22A:
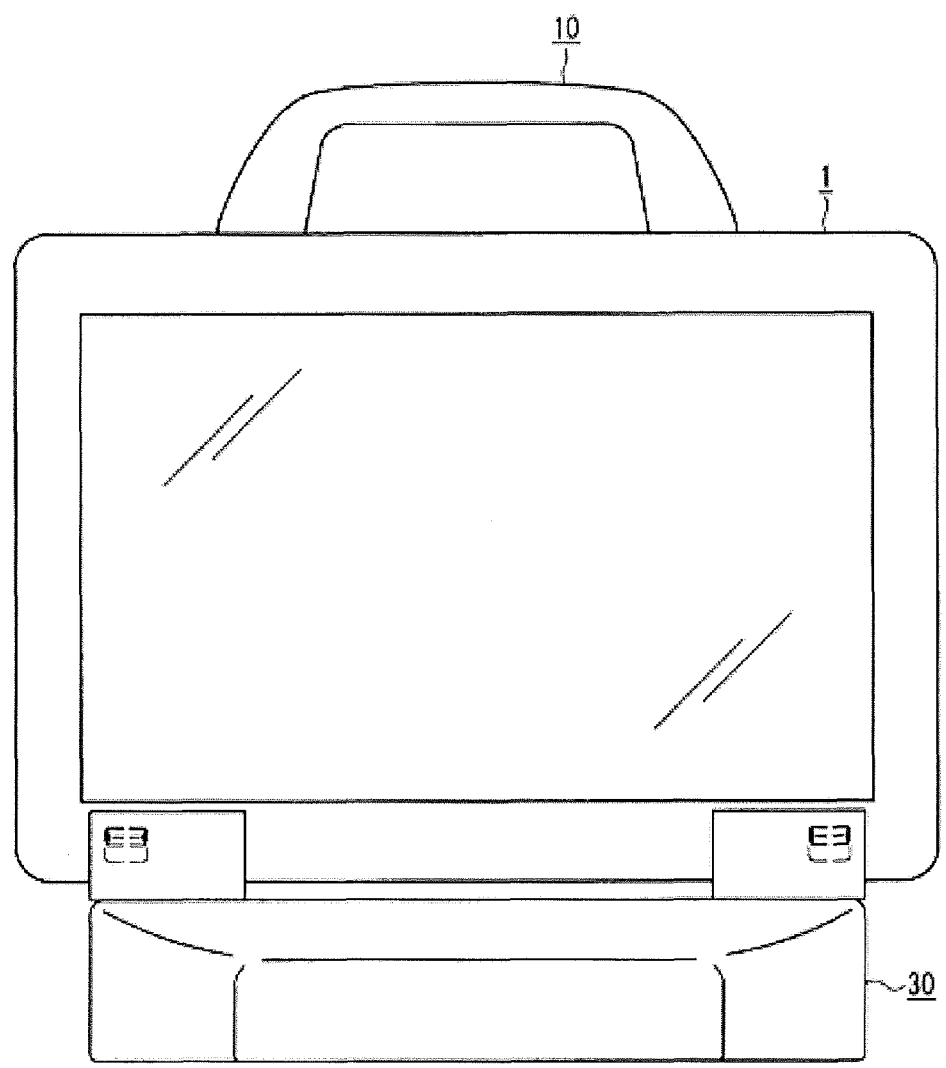
FIG. 22A is a front view showing a state where a main device including a holding device is mounted on the extension device.
Figure 22B:
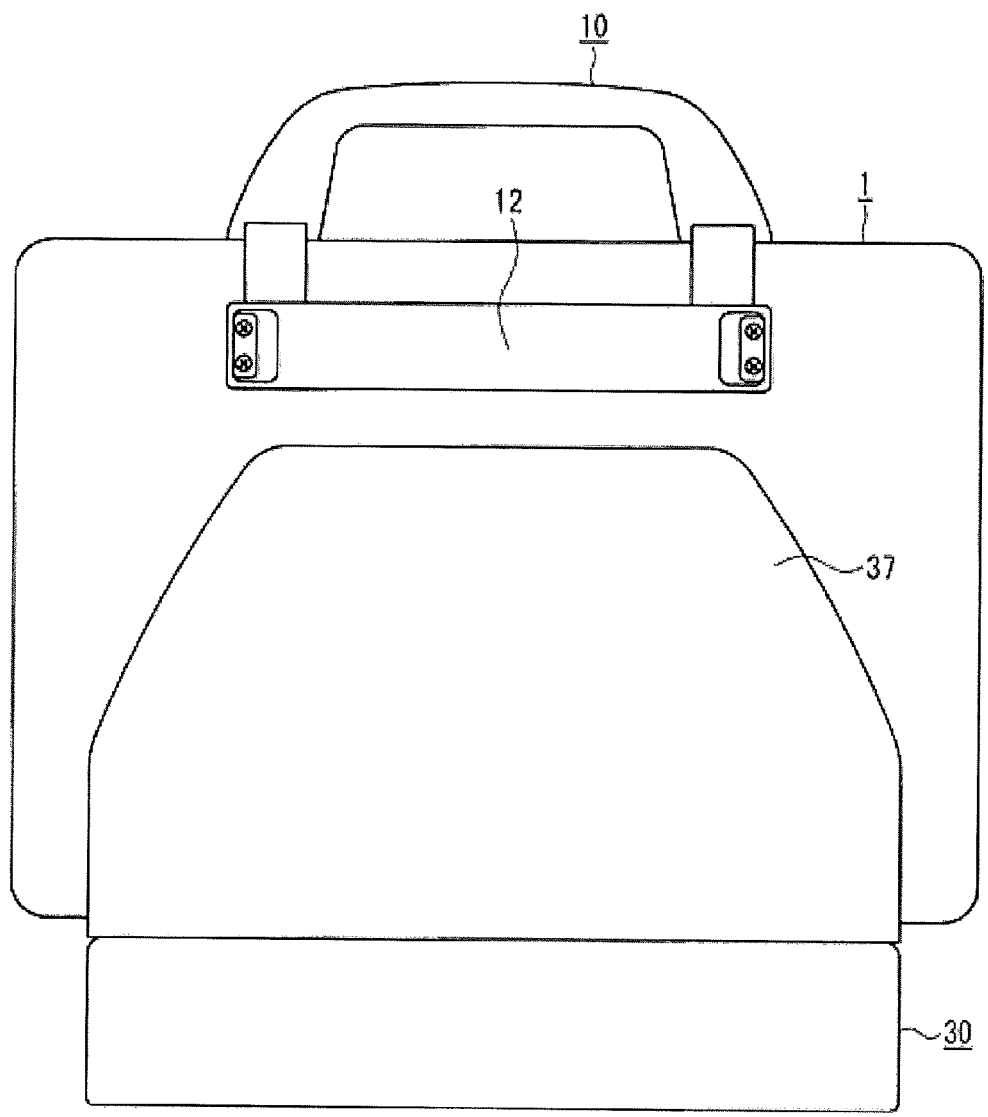
FIG. 22B is a side view showing the state where the main device including the holding device is mounted on the extension device.
Figure 22C:
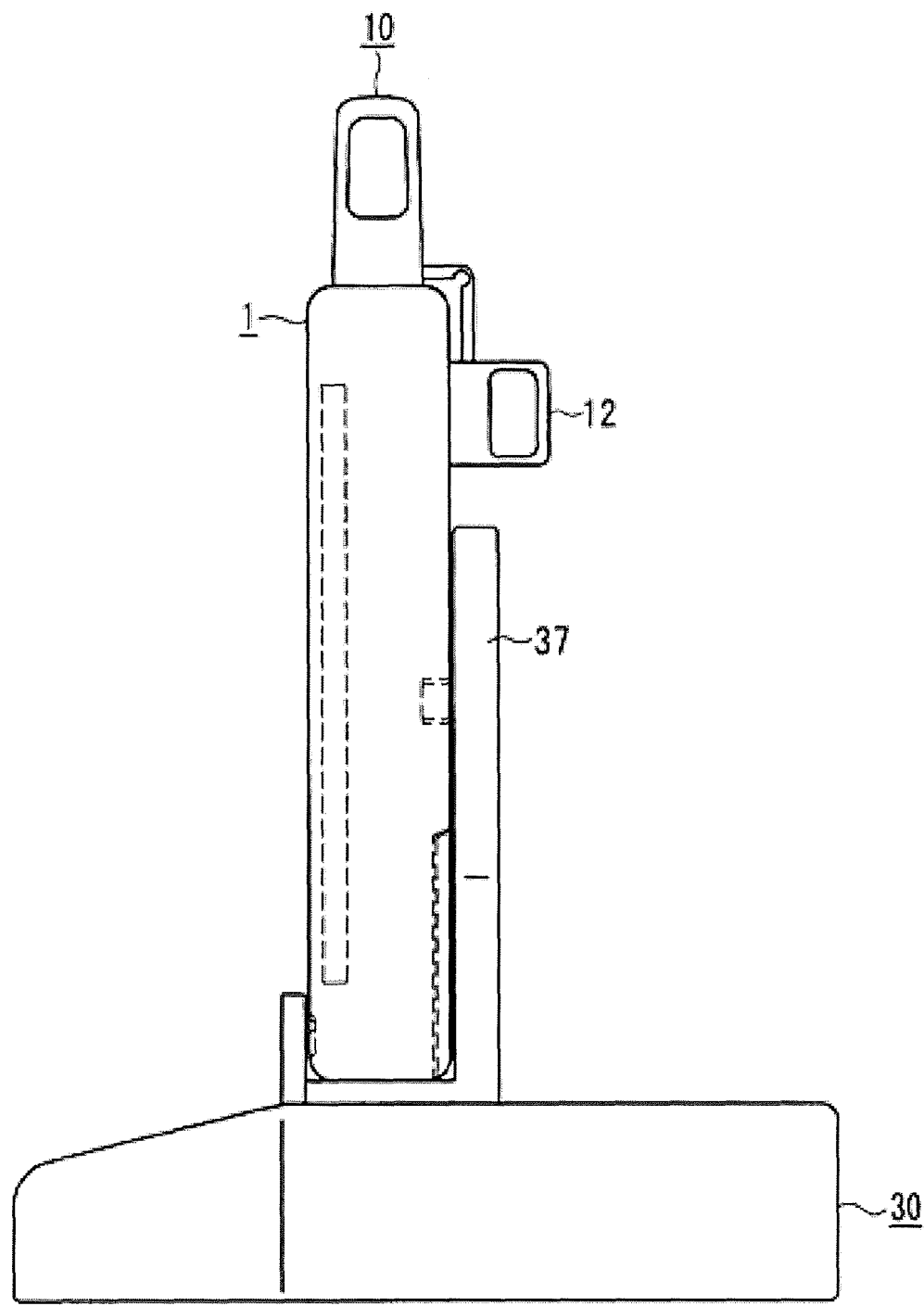
FIG. 22C is a plan view showing the state where the main device including the holding device is mounted on the extension device.

FIG. 22A is a front view of the extension device 30 on which the computer apparatus 1 including the holding member 10 is mounted. FIG. 22B is a rear view of the extension device 30 on which the computer apparatus 1 including the holding member 10 is mounted. FIG. 22C is a side view of the extension device 30 on which the computer apparatus 1 including the holding member 10 is mounted.

The holding member 10 is mounted on the back surface 1b of the computer apparatus 1 and at a position away from the bottom surface 1d of the computer apparatus 1 by a distance D24, as shown in FIG. 2B. The distance D24 and the height dimension H15 (see FIG. 19B) of the back surface wall portion 37 have the following dimensional relation.

$$H15 < D24 \qquad \text{relational expression (21)}$$

Due to the relational expression (21), when the computer apparatus 1 including the holding member 10 is mounted on the extension device 30 as shown in FIGS. 22B and 22C, the grip belt 12 and the back surface wall portion 37 are disposed so as to be spaced apart from each other. Thus, the computer apparatus 1 can be mounted at a normal position in the extension device 30, and the connector 6 of the computer apparatus 1 and the connector 39 of the extension device 30 can assuredly be connected to each other.

The height dimension H15 suffices to be set so as to be equal to or less than the height dimension from the placement surface 31a to a site of the outer periphery of the back surface wall portion 37 to which site the grip belt 12 is closest, when the computer apparatus 1 to which the holding member 10 is fixed is mounted on the extension device 30. In other words, the height dimension H15 of the back surface wall portion 37 from the placement surface 31a may be any dimension unless the back surface wall portion 37 comes into contact with or touches (hereinafter, both are referred to as "interferes with") the grip belt 12, which projects from the back surface 1b in a direction toward the back surface wall portion 37, when the computer apparatus 1 to which the holding member 10 is fixed is placed on the placement surface 31a.

In the case where the holding member 10 is mounted at such a position that the grip belt 12 and the back surface wall portion 37 interfere with each other when the computer apparatus 1 is mounted on the extension device 30, the computer apparatus 1 cannot be mounted at the normal position in the extension device 30 and the connector 6 of the computer apparatus 1 and the connector 39 of the extension device 30 cannot assuredly be connected to each other in some cases.

[3-3. Mounting/Dismounting Operations Between Extension Device and Computer Apparatus Including Handle Member]

Figure 23A:
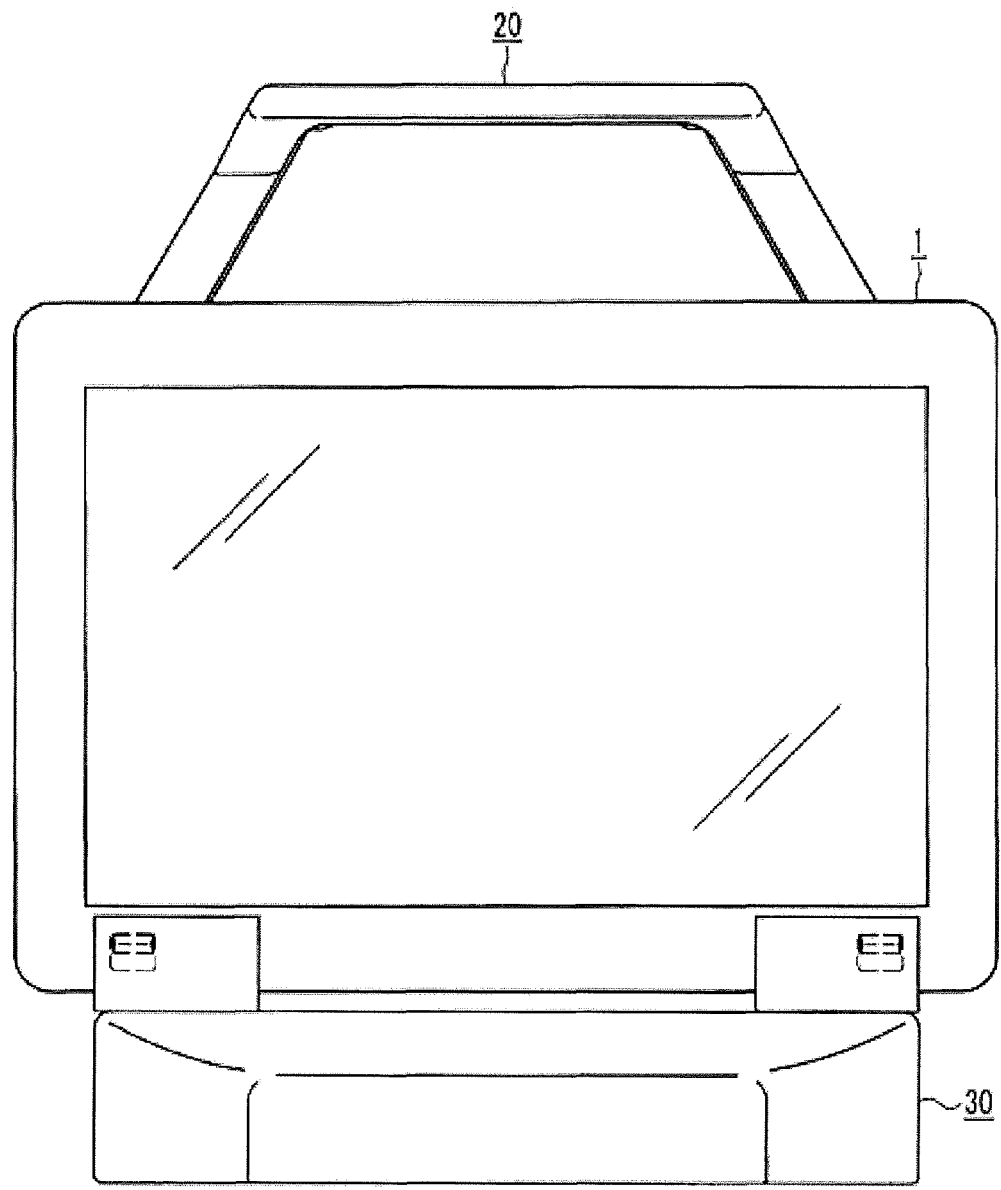
FIG. 23A is a front view showing a state where the main device including the handle member is mounted on the extension device.
Figure 23B:
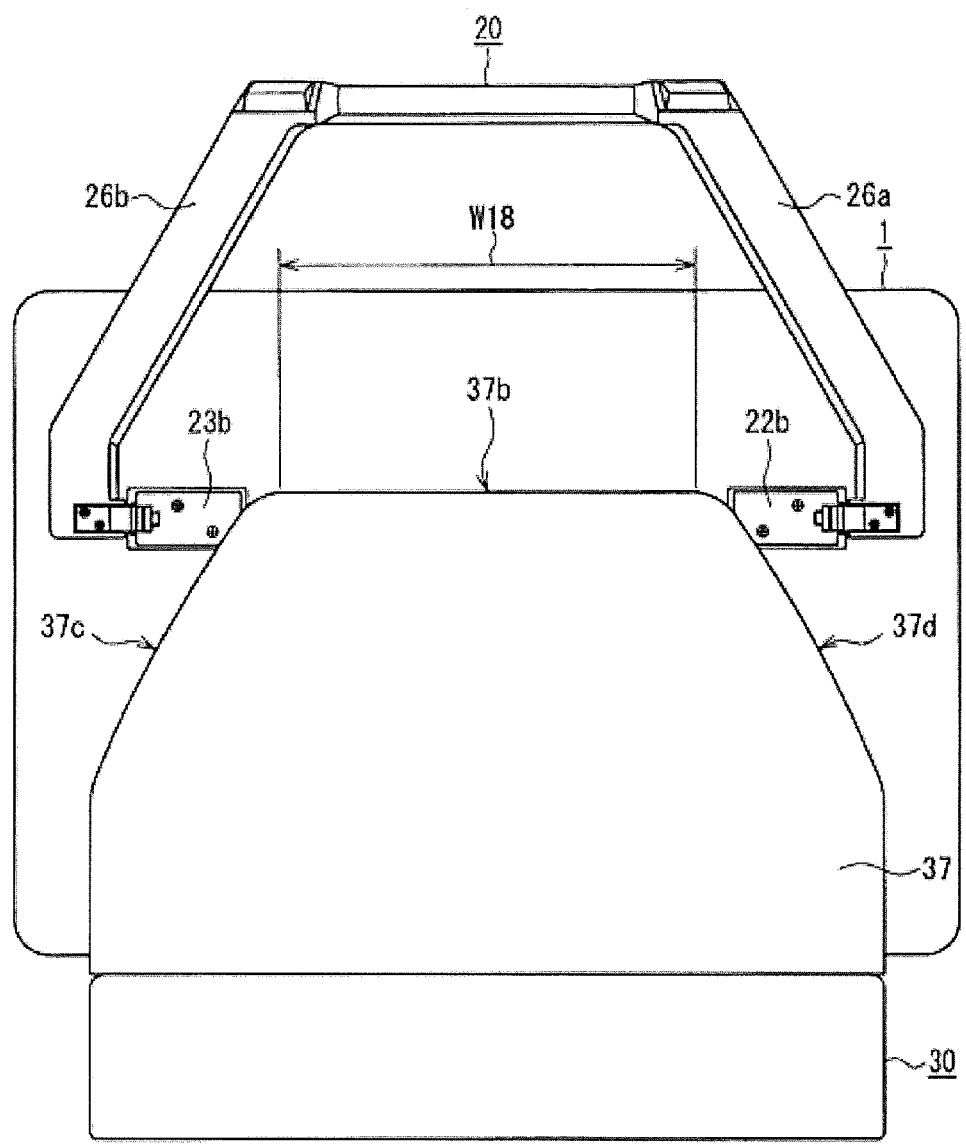
FIG. 23B is a side view showing the state where the main device including the handle member is mounted on the extension device.
Figure 23C:
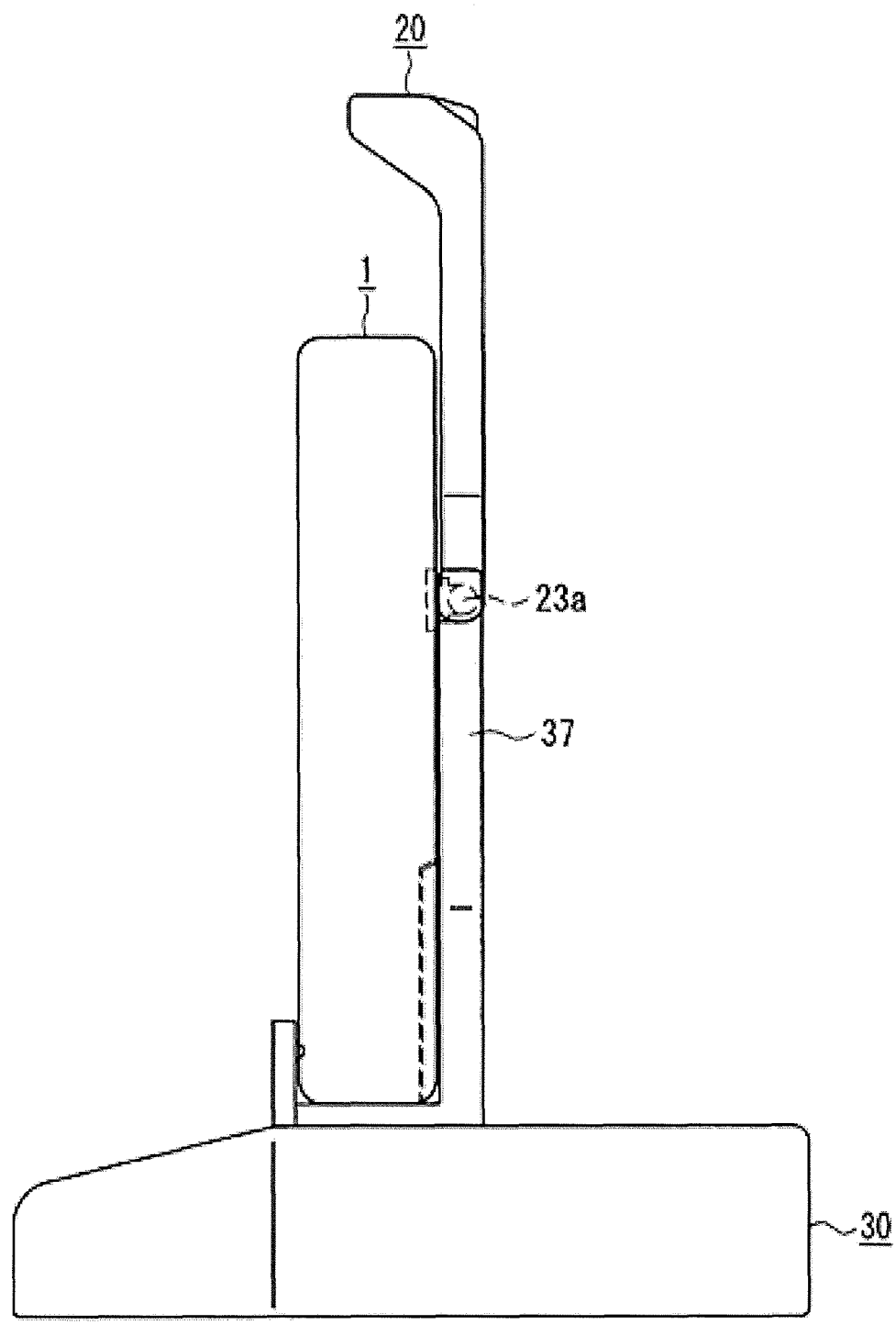
FIG. 23C is a plan view showing the state where the main device including the handle member is mounted on the extension device.

FIG. 23A is a front view of the extension device 30 on which the computer apparatus 1 including the handle member 20 is mounted. FIG. 23B is a rear view of the extension device 30 on which the computer apparatus 1 including the handle member 20 is mounted. FIG. 23C is a side view of the extension device 30 on which the computer apparatus 1 including the handle member 20 is mounted. The handle member 20 shown in FIGS. 23A to 23C is at the first position shown in FIG. 13.

The handle member 20 is mounted on the back surface 1b of the computer apparatus 1 and at a position away from the bottom surface 1d of the computer apparatus 1 by a distance L25, as shown in FIG. 11. Specifically, the distance L25 is the distance on the back surface 1b of the computer apparatus 1 from the bottom surface 1d to another end of the first leg portion 26a or the second leg portion 26b. It should be noted that the support plate 22b and 23b are fixed within the computer apparatus 1 and do not protrude from the back surface 1b in the thickness direction of the computer apparatus 1.

When the computer apparatus 1 including the handle member 20 is mounted on the extension device 30, either the hinge mechanisms 22a and 23a or the first leg portions 26a and 26b are closest to the back surface wall portion 37. Thus, the back surface wall portion 37 suffices to be configured so as to not interfere with a portion that is closest to the back surface wall portion 37.

The distance L25 and the maximum height dimension H15 (see FIG. 19B) of the back surface wall portion 37 from the placement surface 31a preferably have the following dimensional relation.

$$H15 < L25 \quad \text{relational expression (22)}$$

Due to the relational expression (22), when the computer apparatus 1 including the handle member 20 is mounted on the extension device 30, the handle member 20 and the back surface wall portion 37 are located so as to be spaced apart from each other. Thus, the computer apparatus 1 can be mounted at the normal position in the extension device 30, and the connector 6 of the computer apparatus 1 and the connector 39 of the extension device 30 can assuredly be connected to each other.

It should be noted that even when the height dimension H15 is set so as to reach a region defined by the first leg portion 26a, the second leg portion 26b, and the holding section 21 of the handle member 20 of the present embodiment, the height dimension H15 is applicable as is obvious from FIG. 11. In other words, the outer shape of the back surface wall portion 37 suffices to be such a shape that when the computer apparatus 1 to which the handle member 20 is fixed is placed on the placement surface 31a, the back surface wall portion 37 does not interfere with the handle member 20 projecting from the back surface 1b in the direction toward the back surface wall portion 37.

In the present embodiment, the plates 22b and 23b are provided on the holding section 21 side with respect to the first leg portion 26a and the second leg portion 26b (i.e., inside the substantially "C" planar shape) as shown in FIG. 11. However, when the plates 22b and 23b are provided on a side opposite to the holding section 21 side with respect to the first leg portion 26a and the second leg portion 26b, the plates 22b and 23b may be configured to protrude from the back surface 1b of the computer apparatus 1.

The relation between the distance L25 and the height dimension H15 of the back surface wall portion 37 is not limited to the dimensional relation included in the above relational expression (22) and may be a dimensional relation included in the following relational expression (23). The positional relation between the handle member 20 and the back surface wall portion 37 in the computer apparatus 1 and the extension device 30 shown in FIGS. 23B and 23C is included in the following relational expression (23).

$$H15 \geq L25 \quad \text{relational expression (23)}$$

When the positional relation between the handle member 20 and the back surface wall portion 37 is the positional relation included in the relational expression (23), the shape of the handle member 20 or the back surface wall portion 37 has to be such a shape that the handle member 20 and the back surface wall portion 37 do not interfere with each other. In the present embodiment, the back surface wall portion 37 has a shape in which the portions 37c and 37d are provided and the upper edge 37b is located between the first leg portion 26a and the second leg portion 26b of the handle member 20 and between the support plate 22b and the support plate 23b as shown in FIG. 23B. Due to such a configuration, when the computer apparatus 1 including the handle member 20 is mounted on the extension device 30, the handle member 20 and the back surface wall portion 37 are located so as to be spaced apart from each other. Thus, the computer apparatus 1 can be mounted at the normal position in the extension device 30, and the connector 6 of the computer apparatus 1 and the connector 39 of the extension device 30 can assuredly be connected to each other.

It should be noted that in the case of the relational expression (23), the following relational expressions are preferably met:

$$L22 \geq W17 \quad \text{relational expression (24), and}$$

$$L22 \geq W18 \quad \text{relational expression (25),}$$

since the handle member 20 does not interfere with the back surface wall portion 37 in a state where the computer apparatus 1 is placed on the placement surface 31a of the extension device 30. The dimension W17 is the width dimension of the back surface wall portion 37 (see FIG. 19A). The dimension W18 is the width dimension of the upper edge 37b of the back surface wall portion 37 (see FIG. 23B). Specifically, the dimension W18 is the width dimension of a flat portion of the upper edge 37b. The dimension W18 may have a dimensional relation of "L21≥W18". The relational expression (25) is effective when the upper edge 37b of the back surface wall portion 37 coincides with or is located adjacently to the axes of the support shafts 22d and 23d, but is not essential, for example, when the upper edge 37b of the back surface wall portion 37 is separated from the axes of the support shafts 22d and 23d.

In view of stabilizing the attitude of the computer apparatus 1 when the user carries the computer apparatus 1, the handle member 20 is preferably disposed such that fixed portions (the support plate 22b and 23b etc.) thereof with respect to the computer apparatus 1 are spaced apart from each other as much as possible, as shown in FIG. 11. In the extension device 30 of the present embodiment, since at least a portion of the back surface wall portion 37 is located between the fixed portions (the support plate 22b and 23b etc.) of the handle member 20 with respect to the computer apparatus 1 by using such a shape characteristic of the handle member 20, the handle member 20 and the back surface wall portion 37 are prevented from interfering with each other.

FIGS. 23A to 23C illustrate the case where the handle member 20 is at the first position. However, if the handle member 20 is in a range where the handle member 20 does not block the computer apparatus 1 from being mounted at the normal position, even when the handle member 20 is at a position other than the first position, the computer apparatus 1 can be mounted at the normal position in the extension device 30. For example, in the case where the handle member 20 is at the second position shown in FIG. 14, when attempting to mount the computer apparatus 1 at the normal position in the extension device 30, the handle member 20 and the back surface wall portion 37 interfere with each other, and the computer apparatus 1 cannot be mounted at the normal position in the extension device 30. However, when the handle member 20 is rotated from the position shown in FIG. 14 in the direction indicated by the arrow C to be located, for example, at such a position that a rotation angle A3 (see FIG. 15) is less than 160 degrees, the handle member 20 and the back surface wall portion 37 do not interfere with each other, and the computer apparatus 1 can be mounted at the normal position in the extension device 30.

The support plate 22b and 23b shown in FIG. 23B are located at such positions as to overlap the back surface wall portion 37, but are fixed within the computer apparatus 1 and do not protrude from the back surface 1b. Thus, the computer apparatus 1 can be mounted at the normal position in the extension device 30.

4. Advantageous Effects of Embodiment and Others

According to the present embodiment, since the holding member 10, the handle member 20, and the back surface wall portion 37 are set so as to have the dimensional relation shown in the relational expressions (21) and (22) or the dimensional relation shown in the relational expressions (21) and (23), when the computer apparatus 1 on which the holding member 10 or the handle member 20 is mounted is mounted on the extension device 30, the holding member 10 or the handle member 20 and the back surface wall portion 37 can be prevented from interfering with each other. That is, the back surface wall portion 37 suffices to not come into contact with the grip belt 12 or the handle member 20 projecting from the back surface 1b in the direction toward the back surface wall portion 37, when the computer apparatus 1 to which the holding member 10 or the handle member 20 is fixed is placed on the placement surface 31a. In other words, the outer shape of the back surface wall portion 37 is not limited to the shown simple projection shape unless the back surface wall portion 37 comes into contact with or touches (i.e., "interferes with") the grip belt 12 or the handle member 20. Therefore, when the outer shape of the belt portion 12a of the grip belt 12 is, for example, a wide shape in order for a hand of the user to fit the grip belt 12, the back surface wall portion 37 can have such a shape (e.g., a recess-like outer shape) as to not interfere with the wide shape in the grip belt 12.

Therefore, the computer apparatus 1 can be mounted on the extension device 30 with the holding member 10 or the handle member 20 mounted on the computer apparatus 1, and thus, when the computer apparatus 1 is mounted on the extension device 30, time and effort to remove the holding member 10 or the handle member 20 can be saved.

In the present embodiment, the back surface wall portion 37 has a shape in which the inclined portions 37c and 37d are provided and the upper edge 37b is located between the first leg portion 26a and the second leg portion 26b of the handle member 20 and between the support plate 22b and the support plate 23b, as shown in FIG. 23B. Due to such a configuration, when the computer apparatus 1 including the handle member 20 is mounted on the extension device 30, the handle member 20 and the back surface wall portion 37 are located so as to be spaced apart from each other. Thus, the computer apparatus 1 can be mounted at the normal position in the extension device 30, and the connector 6 of the computer apparatus 1 and the connector 39 of the extension device 30 can assuredly be connected to each other. In addition, due to such a configuration, the height dimension H15 of the back surface wall portion 37 can be increased as much as possible, and thus a large area to support the back surface 1b of the computer apparatus 1 can be ensured and the computer apparatus 1 can stably be supported.

In the present embodiment, the back surface wall portion 37 includes the inclined portions 37c and 37d as shown in FIG. 23B. However, at least when the back surface wall portion 37 and the handle member 20 can be prevented from interfering with each other, the inclined shape is not essential. The back surface wall portion 37 may have, for example, a rectangular shape.

The computer apparatus 1 is an example of a main device. The extension device 30 is an example of an extension device. The holding member 10 and the handle member 20 are examples of a holding device. The back surface 1b of the computer apparatus 1 is an example of one principal surface of the main device. The bottom surface 1d of the computer apparatus 1 is an example of another principal surface of the main device. The placement surface 31a is an example of a placement portion. The back surface wall portion 37 is an example of a wall portion.

What is claimed is:
1. An information processing system including a main device, and an extension device onto which/from which the main device can be mounted/dismounted, wherein:
the main device comprises:
a display surface having a display screen;
a back surface that is a reverse side of the display surface;
a top surface, a bottom surface, and a pair of side surfaces located between the display surface and the back surface;
a pair of support shafts provided on the back surface;
a pair of leg portions, each having one end rotatably fixed to the pair of support shaft, respectively; and
a handle member located between the other ends of the pair of leg portions, wherein:
the pair of support shafts face each other with a predetermined gap therebetween in a direction parallel to the bottom surface, and the pair of leg portions, which rotate about the pair of support shafts, are each structured and arranged so that:
  in a first state a first surface of each leg portion contacts the back surface of the main device, and the handle member of the main device protrudes from the top surface of the main device, and
  in a second state a second surface of each leg portion, which is a reverse side of the first surface thereof, contacts the back surface of the main device, and the handle member is adjacent to the bottom surface of the main device; and
the extension device comprises:
  a placement portion structured and arranged for the main device to be placed thereon; and
  a wall portion extending from the placement portion, the wall portion including a front end having a predetermined width smaller than the predetermined gap between the pair of support shafts of the main device, wherein:
  when the main device is placed on the placement portion, with the pair of leg portions in the first state, the wall portion of the extension device contacts the back surface of the main device, and the front end of the wall portion is positioned between the pair of support shafts of the main device.

2. The information processing system according to claim 1, wherein the wall portion of the extension device interferes with the handle of the main device when the main device is placed on the placement portion with the pair of leg portions in the second state.

* * * * *